US011688747B2

(12) United States Patent
Shiraishi et al.

(10) Patent No.: US 11,688,747 B2
(45) Date of Patent: Jun. 27, 2023

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Shouichirou Shiraishi, Kanagawa (JP); Takuya Maruyama, Kanagawa (JP); Shinichiro Yagi, Kanagawa (JP); Shohei Shimada, Tokyo (JP); Shinya Sato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/354,191

(22) Filed: Jun. 22, 2021

(65) Prior Publication Data

US 2021/0313362 A1 Oct. 7, 2021

Related U.S. Application Data

(63) Continuation of application No. 16/486,936, filed as application No. PCT/JP2018/020309 on May 28, 2018, now Pat. No. 11,075,236.

(30) Foreign Application Priority Data

May 29, 2017 (JP) .................................. 2017-105715
May 18, 2018 (JP) .................................. 2018-095949

(51) Int. Cl.
*H01L 27/146* (2006.01)
*B60R 11/04* (2006.01)

(52) U.S. Cl.
CPC ........ *H01L 27/14607* (2013.01); *B60R 11/04* (2013.01); *H01L 27/1463* (2013.01);
(Continued)

(58) Field of Classification Search
CPC ......... H01L 27/14607; H01L 27/14621; H01L 27/1463; H01L 27/14645
See application file for complete search history.

(56) References Cited

U.S. PATENT DOCUMENTS

| 11,075,236 B2 | 7/2021 | Shiraishi et al. |
| 2013/0134536 A1* | 5/2013 | Mori ................. H01L 27/14623 438/70 |

(Continued)

FOREIGN PATENT DOCUMENTS

| CN | 102893400 | 1/2013 |
| JP | 2007158109 A | 6/2007 |

(Continued)

OTHER PUBLICATIONS

International Search Report prepared by the Japan Patent Office dated Jul. 31, 2018 for International Application No. PCT/JP2018/020309.

(Continued)

*Primary Examiner* — Marc Anthony Armand
(74) *Attorney, Agent, or Firm* — Sheridan Ross P.C.

(57) ABSTRACT

There is provided a solid-state imaging device including: a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

19 Claims, 39 Drawing Sheets

(52) U.S. Cl.
CPC .. *H01L 27/14612* (2013.01); *H01L 27/14621* (2013.01); *H01L 27/14645* (2013.01)

(56) References Cited

U.S. PATENT DOCUMENTS

| | | |
|---|---|---|
| 2016/0112614 A1 | 4/2016 | Masuda |
| 2017/0047363 A1* | 2/2017 | Choi .................. H01L 27/1464 |
| 2017/0084651 A1 | 3/2017 | Yamaguchi |
| 2017/0345853 A1 | 11/2017 | Kato et al. |
| 2019/0081094 A1 | 3/2019 | Kato et al. |

FOREIGN PATENT DOCUMENTS

| | | |
|---|---|---|
| JP | 2017-212351 | 11/2017 |
| KR | 20170019542 A | 2/2017 |

OTHER PUBLICATIONS

Official Action for U.S. Appl. No. 16/486,936, dated Dec. 18, 2020, 11 pages.
Notice of Allowance for U.S. Appl. No. 16/486,936, dated Mar. 25, 2021, 9 pages.
Official Action (with English translation) for China Patent Application No. 202010330788.8, dated Mar. 17, 2023, 16 pages.

* cited by examiner

SOLID-STATE IMAGING DEVICE AND ELECTRONIC APPARATUS

CROSS REFERENCE TO RELATED APPLICATIONS

The present application is a continuation of and claims priority to U.S. application Ser. No. 16/486,936, filed on 19 Aug. 2019, which is a national stage application under 35 U.S.C. 371 and claims the benefit of PCT Application No. PCT/JP2018/020309, having an international filing date of 28 May 2018, which designated the United States, which PCT application claimed the benefit of Japanese Patent Application Nos. 2017-105715 filed 29 May 2017 and 2018-095949 filed 18 May 2018, the entire disclosures of each of which are incorporated herein by reference.

TECHNICAL FIELD

The present technology relates to a solid-state imaging device and an electronic apparatus, and particularly to a solid-state imaging device and an electronic apparatus capable of improving the accuracy of phase difference detection while suppressing degradation of a picked-up image.

BACKGROUND ART

In recent years, a solid-state imaging device in which image surface phase difference detection pixels are arranged is used for increasing the speed of autofocus.

In this kind of solid-state imaging device, a method of partially blocking light by a metal film or the like is often and generally used for pupil-dividing light collected by an on-chip lens. However, since it is difficult to use information acquired from a light-blocking pixel as information regarding a picked-up image, there is a need to use information acquired from a surrounding pixel for interpolation.

Further, such a solid-state imaging device has a disadvantage that since it is difficult to arrange the light-blocking pixels on the entire surface with respect to effective pixels, the amount of light received by the entire phase difference pixels is reduced, which reduces the accuracy of phase difference detection particularly when the amount of light is small.

As a technology for avoiding this, there is a method of performing pupil-division by embedding a plurality of photoelectric conversion devices under one on-chip lens. Such a method is used in, for example, a solid-state imaging device for a single-lens reflex camera or a camera incorporated in a smartphone (e.g., see Patent Literature 1).

CITATION LIST

Patent Literature

[PTL 1]
Japanese Patent Application Laid-open No. 2002-165126

SUMMARY

Technical Problem

Meanwhile, in a solid-state imaging device including two photoelectric conversion devices located immediately below a single on-chip lens, an output of one photoelectric conversion device is mixed with an output of the other photoelectric conversion device, which reduces the accuracy of phase difference detection in some cases.

As a technology for avoiding this, providing a physical separation unit between two photoelectric conversion devices is conceivable. However, particularly in the case where it is in focus, this separation unit interferes with photoelectric conversion in the photoelectric conversion device, which reduces the sensitivity. In addition, light scattering occurs in this separation unit, which deteriorates the spectral characteristics. As a result, the image quality of a picked-up image may be reduced.

Solution to Problem

The present technology has been made in view of the above circumstances to make it possible to improve the accuracy of phase difference detection while suppressing degradation of a picked-up image.

A solid-state imaging device according to an aspect of the present technology is a solid-state imaging device, including: a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

In a solid-state imaging device according to an aspect of the present technology, a pixel array unit is provided, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

A solid-state imaging device according to an aspect of the present technology is a solid-state imaging device, including: a pixel array unit, a plurality of pixels being two-dimensionally arranged in the pixel array unit, one photoelectric conversion device being formed in each of the plurality of pixels, the pixel array unit including pixels arranged with respect to one on-chip lens, a part of at least one of an inter-pixel separation unit formed between pixels constituting the pixels arranged with respect to the one on-chip lens and an inter-pixel light blocking unit formed between the pixels constituting the pixels arranged with respect to the one on-chip lens protruding toward a center of the pixels arranged with respect to the one on-chip lens in a projecting shape to form a projection portion.

In solid-state imaging device according to an aspect of the present technology, a pixel array unit is provided, a plurality of pixels being two-dimensionally arranged in the pixel array unit, one photoelectric conversion device being formed in each of the plurality of pixels, the pixel array unit including pixels arranged with respect to one on-chip lens, a part of at least one of an inter-pixel separation unit formed between pixels constituting the pixels arranged with respect to the one on-chip lens and an inter-pixel light blocking unit formed between the pixels constituting the pixels arranged with respect to the one on-chip lens protruding toward a center of the pixels arranged with respect to the one on-chip lens in a projecting shape to form a projection portion.

An electronic apparatus according to an aspect of the present technology is an electronic apparatus, including: a solid-state imaging device including a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

In a solid-state imaging device mounted on an electronic apparatus according to an aspect of the present technology, a pixel array unit is provided, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

Advantageous Effects

According to an aspect of the present technology, it is possible to improve the accuracy of phase difference detection while suppressing degradation of a picked-up image.

It should be noted that the effect described here is not necessarily limitative and may be any effect described in the present disclosure.

DESCRIPTION OF EMBODIMENTS

Hereinafter, embodiments of the present technology will be described with reference to the drawings. Note that descriptions will be made in the following order.
1. Configuration of Solid-state Imaging Device
2. Prerequisite Technology
3. Embodiments of Present Technology
(1) First Embodiment: Structure in which Projection Portion Is Provided in Inter-pixel Si Separation (Basic Structure)
(2) Second Embodiment: Structure in which Projection Portion Is Provided in Inter-pixel Light Blocking
(3) Third Embodiment: Structure in which Projection Portion Is Provided in Inter-pixel Si Separation and Inter-pixel Light Blocking
(4) Fourth Embodiment: Structure in which Projection Portion Is Formed For R, G, or B Pixel
(5) Fifth Embodiment: Structure in which Length of Projection Portion Is Adjusted
(6) Sixth Embodiment: Structure in which Length of Projection Portion Is Adjusted for Each Pixel
(7) Seventh Embodiment: Structure in which Elliptical On-chip Lens Is Used
(8) Eighth Embodiment: Structure in which Plurality of Pixels Are Arranged with respect to Single On-chip Lens
(9) Ninth Embodiment: Structure in which Physical Separation Is Performed from Surface Opposite to Light Incident Side
4. Circuit Configuration of Pixel
5. Modified Example
6. Configuration of Electronic Apparatus
7. Usage Example of Solid-state Imaging Device
8. Configuration Example of Stacked-type Solid-state Imaging Device to which Technology according to Present Disclosure Can Be Applied
9. Application Example to Moving Body

1. Configuration of Solid-state Imaging Device (Configuration Example of Solid-State Imaging Device)

Figure 1:
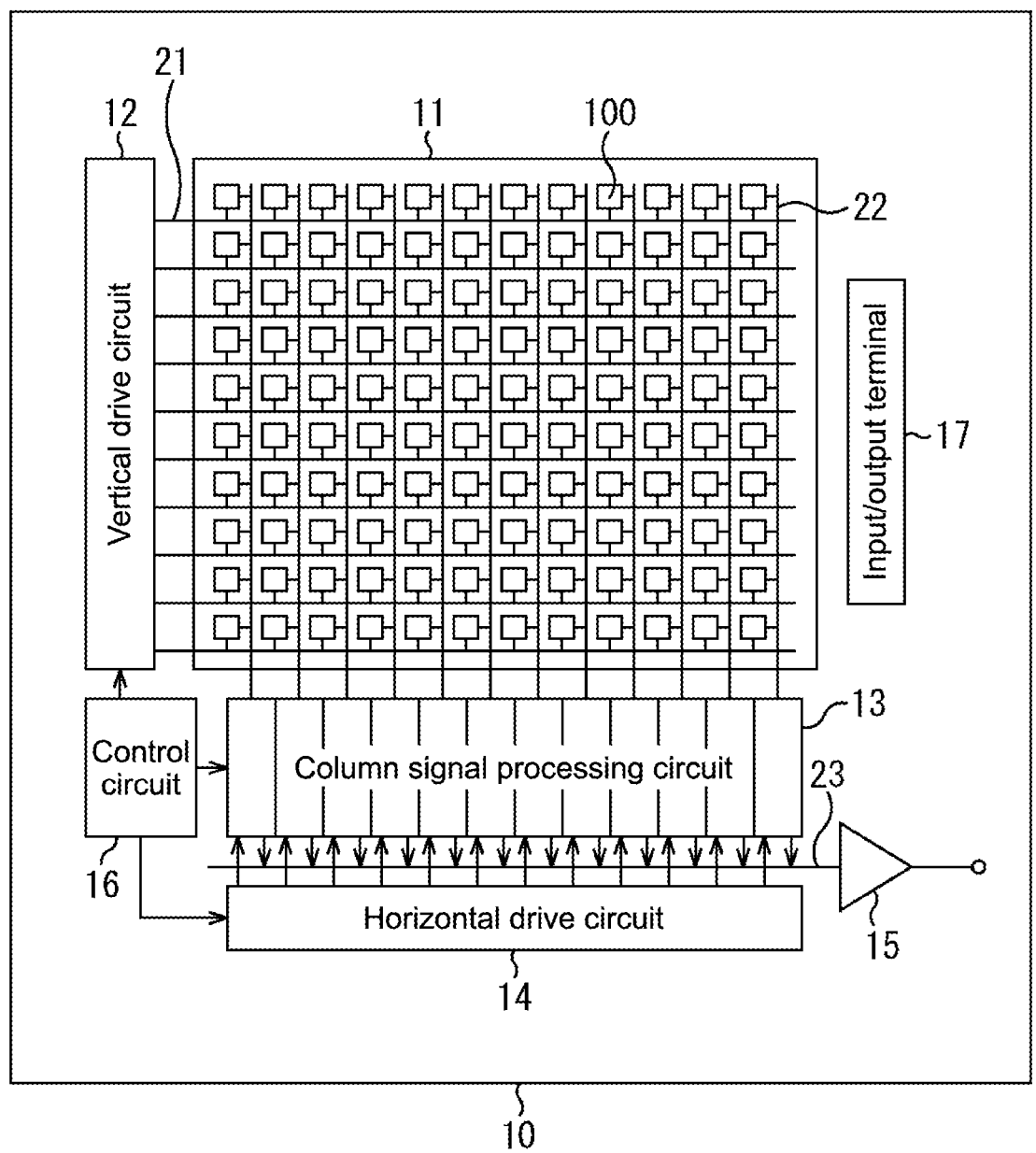
FIG. 1 is a diagram showing a configuration example of a solid-state imaging device to which an embodiment of the present technology is applied.

FIG. 1 is a diagram showing a configuration example of a solid-state imaging device to which an embodiment of the present technology is applied.

A CMOS image sensor 10 shown in FIG. 1 is an example of a solid-state imaging device using a CMOS (Complementary Metal Oxide Semiconductor). The CMOS image sensor 10 captures incident light (image light) from an object via an optical lens system (not shown), converts the light amount of the incident light imaged on an imaging surface into an electric signal on a pixel-by-pixel basis, and outputs the electric signal as a pixel signal.

In FIG. 1, the CMOS image sensor 10 includes a pixel array unit 11, a vertical drive circuit 12, a column signal processing circuit 13, a horizontal drive circuit 14, an output circuit 15, a control circuit 16, and an input/output terminal 17.

In the pixel array unit 11, a plurality of pixels 100 are arranged two-dimensionally (in a matrix pattern). The plurality of pixels 100 each include a photodiode (PD) as a photoelectric conversion device, and a plurality of pixel transistors. For example, the plurality of pixel transistors include a transfer transistor, a reset transistor, an amplification transistor, and a selection transistor.

The vertical drive circuit 12 includes, for example, a shift register, selects a predetermined pixel drive line 21, supplies a pulse for driving the pixels 100 to the selected pixel drive line 21, and drives the pixels 100 row by row. Specifically, the vertical drive circuit 12 sequentially selects and scans each pixel 100 in the pixel array unit 11 in the vertical direction row by row, and supplies a pixel signal based on the signal charge (charge) generated depending on the amount of received light in the photodiode of each pixel 100 to the column signal processing circuit 13 through a vertical signal line 22.

The column signal processing circuit 13 is arranged for each column of the pixels 100, and performs, for each pixel column, signal processing such as noise removal on signals output from the pixels 100 in one row. For example, the column signal processing circuit 13 performs signal processing such as correlated double sampling (CDS) for removing fixed pattern noise unique to the pixel and AD (Analog Digital) conversion.

The horizontal drive circuit 14 includes, for example, a shift register, sequentially selects each of the column signal processing circuits 13 by sequentially outputting a horizontal scanning pulse, and causes each of the column signal processing circuits 13 to output a pixel signal to a horizontal signal line 23.

The output circuit 15 performs signal processing on the signal sequentially supplied from each of the column signal processing circuits 13 through the horizontal signal line 23, and outputs the processed signal. Note that the output circuit 15 performs, for example, only buffering, or black level adjustment, column variation correction, various types of digital signal processing, and the like in some cases.

The control circuit 16 controls the operation of the respective units of the CMOS image sensor 10.

Further, the control circuit 16 generates a clock signal and a control signal, which are used as the reference of the operation of the vertical drive circuit 12, the column signal processing circuit 13, the horizontal drive circuit 14, and the like, on the basis of a vertical synchronous signal, a horizontal synchronous signal, and a master clock signal. The control circuit 16 outputs the generated clock signal and control signal to the vertical drive circuit 12, the column signal processing circuit 13, the horizontal drive circuit 14, and the like.

The input/output terminal 17 transmits/receives signals to/from the outside.

The CMOS image sensor 10 in FIG. 1 configured as described above is a CMOS image sensor called a column AD method in which the column signal processing circuits 13 that perform CDS processing and AD conversion processing are arranged for each pixel column. Further, the CMOS image sensor 10 in FIG. 1 may be, for example, a backside irradiation type CMOS image sensor.

2. Prerequisite Technology (Structure of Pixel)

Figure 2:
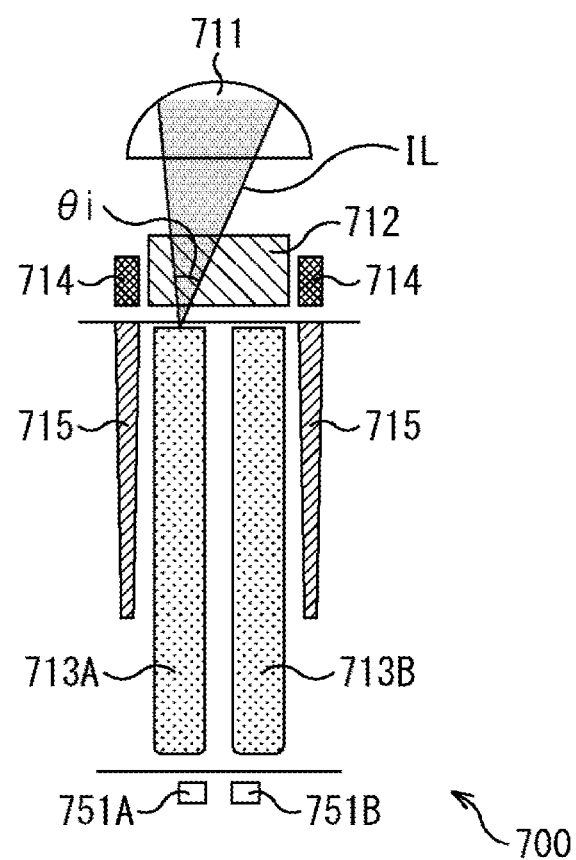
FIG. 2 is a cross-sectional view showing a structure of a pixel including two photoelectric conversion devices located immediately below one on-chip lens.

FIG. 2 is a cross-sectional view showing a structure of a pixel 700 including two photoelectric conversion devices 713A and 713B located immediately below one on-chip lens 711. Note that the pixel 700 includes a color filter 712, an inter-pixel light blocking unit 714, an inter-pixel separation unit 715, and transfer gates 151A and 151B in addition to the on-chip lens 711 and the photoelectric conversion devices 713A and 713B.

In FIG. 2, the pixel 700 has a structure in which two photoelectric conversion devices of the photoelectric conversion device 713A and the photoelectric conversion device 713B are provided with respect to the one on-chip lens 711. Note that in the following description, such a structure will be referred to also as the 2PD structure.

In the pixel 700, an incident light IL collected by the on-chip lens 711 is transmitted through the color filter 712, and applied to a photoelectric conversion area of the photoelectric conversion device 713A or the photoelectric conversion device 713B.

In the example of FIG. 2, the incident light IL is intensively applied to the photoelectric conversion area of the photoelectric conversion device 713A in accordance with an incidence angle θi of the incident light IL. At this time, ideally, when the output of the photoelectric conversion device 713A is represented by 100, the output of the photoelectric conversion device 713B should be 0. However, actually, a certain amount of output is performed from the photoelectric conversion device 713B.

Figure 3:
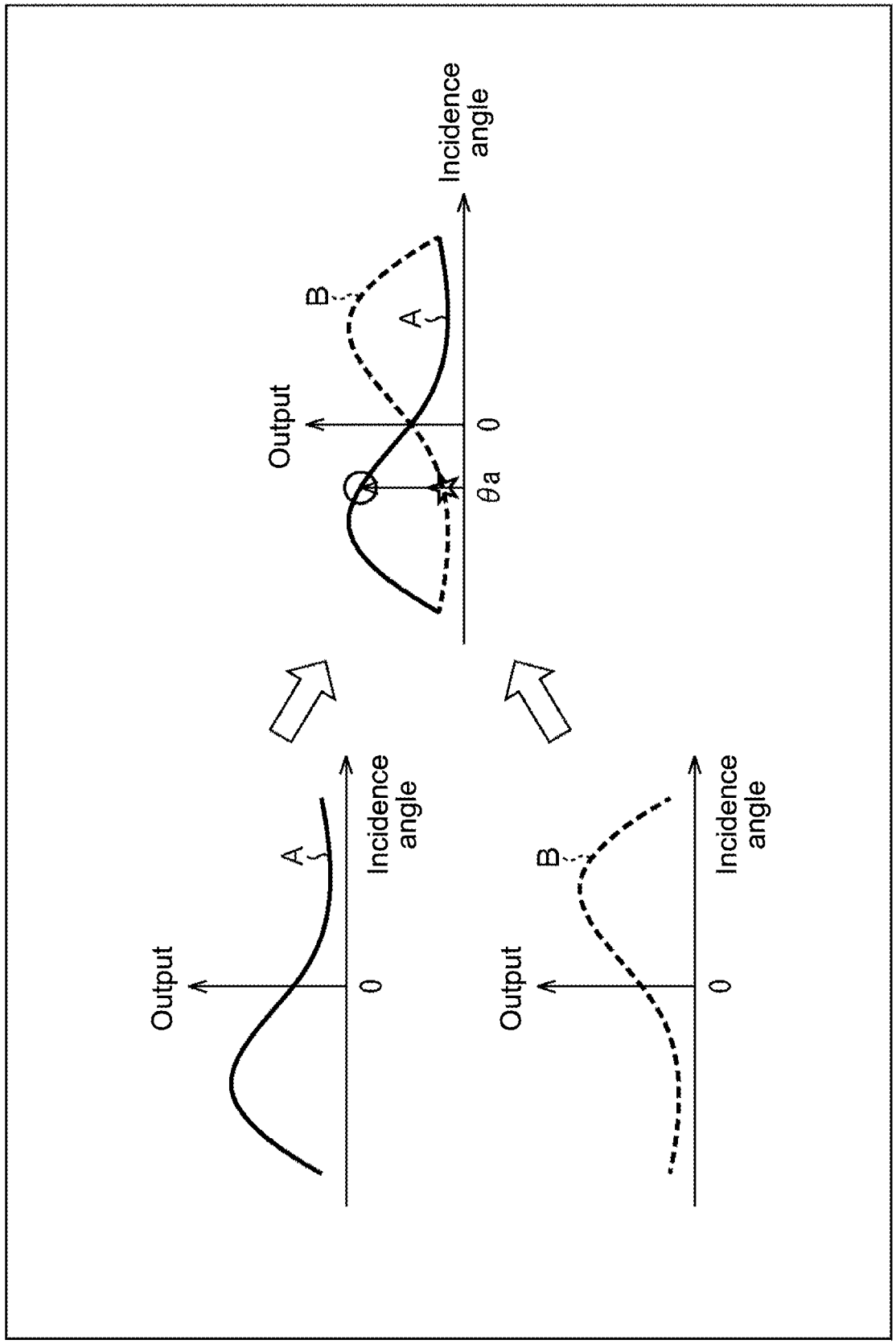
FIG. 3 is a diagram showing an output result depending on an incidence angle of light for each photoelectric conversion device.

FIG. 3 shows an output result depending on the incidence angle θi of light for each photoelectric conversion device 713. In FIG. 3, the output of the photoelectric conversion device 713A is represented by a solid line curve A, and the output of the photoelectric conversion device 713B is represented by a dotted line curve B.

In FIG. 3, the output values in the curve A depending on the output of the photoelectric conversion device 713A and the curve B depending on the output of the photoelectric conversion device 713B match in the case where the incidence angle θi is 0 degrees, i.e., light is incident from directly above. That is, the curve A and the curve B have a symmetrical relationship with the output when the incidence angle θi=0 as the symmetrical axis.

With such a relationship, for example, in the case where the incident light IL is intensively applied to the photoelectric conversion area of the photoelectric conversion device 713A shown in FIG. 2, an increase in not only the output of the photoelectric conversion device 713A but also the output of the photoelectric conversion device 713B results in reduction of the accuracy of phase difference detection. For example, focusing on an incidence angle θa in FIG. 3, not only the output of the photoelectric conversion device 713A but also the output of the photoelectric conversion device 713B is performed.

That is, although the photoelectric conversion device 713A and the photoelectric conversion device 713B are used in pairs for phase difference detection, mixing of the output of one photoelectric conversion device 713 (713A or 713B) with the output of the other photoelectric conversion device 713 (713B or 713A) results in reduction of the detection accuracy.

Now, as a structure for preventing the output of one photoelectric conversion device 713 from mixing with the output of the other photoelectric conversion device 713, a structure in which a physical separation unit is formed between the photoelectric conversion device 713A and the photoelectric conversion device 713B formed in a silicon (Si) layer will be considered.

Figure 4:
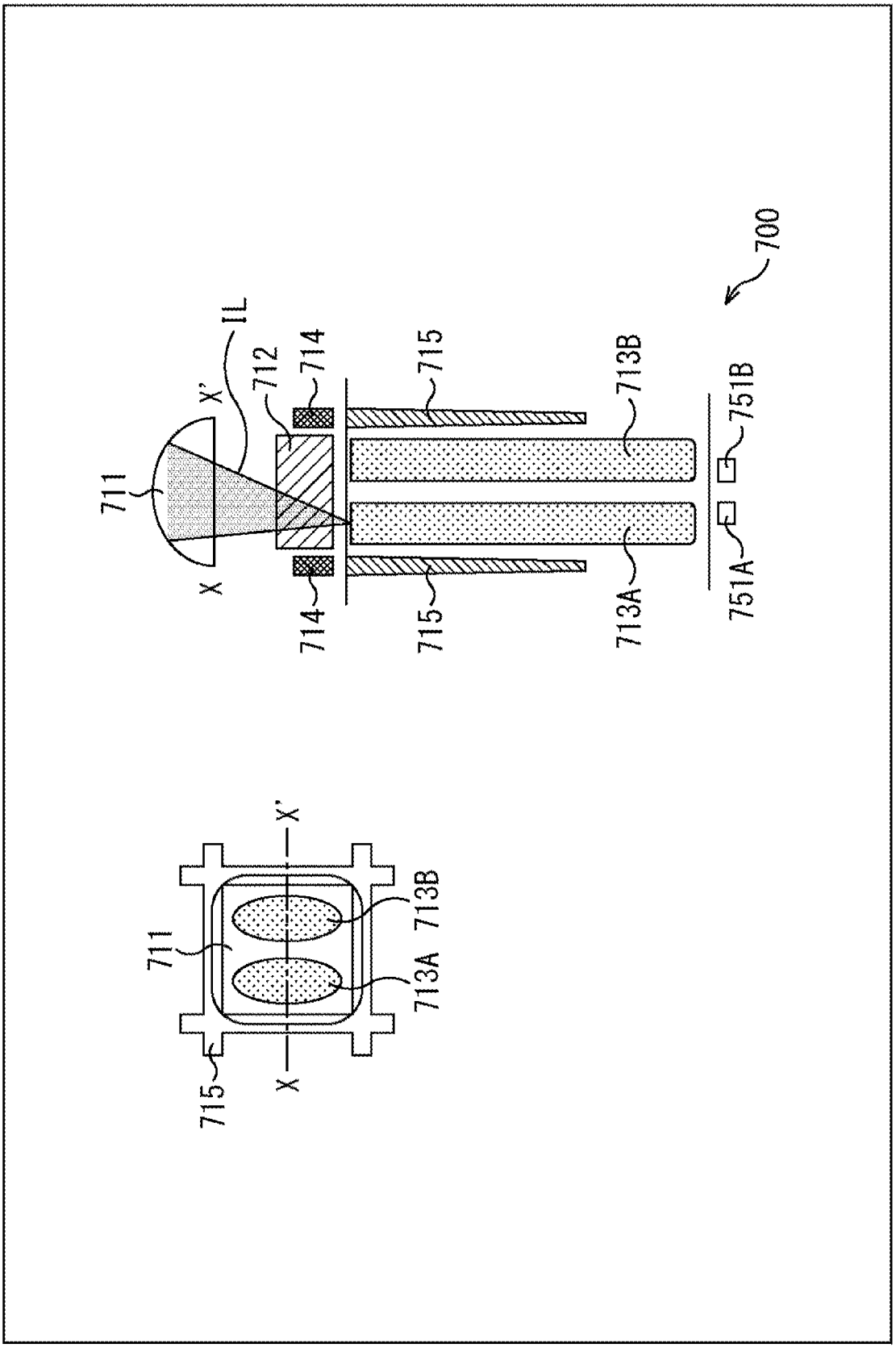
FIG. 4 is a diagram showing a structure of a pixel including two photoelectric conversion devices located immediately below one on-chip lens.

Specifically, the pixel 700 having the 2PD structure corresponding to FIG. 2 is shown in FIG. 4, and the inter-pixel light blocking unit 714 and the inter-pixel separation unit 715 are formed but no physical separation unit is formed between the photoelectric conversion device 713A and the photoelectric conversion device 713B as shown in the plan view or X-X' cross-sectional view.

Figure 5:
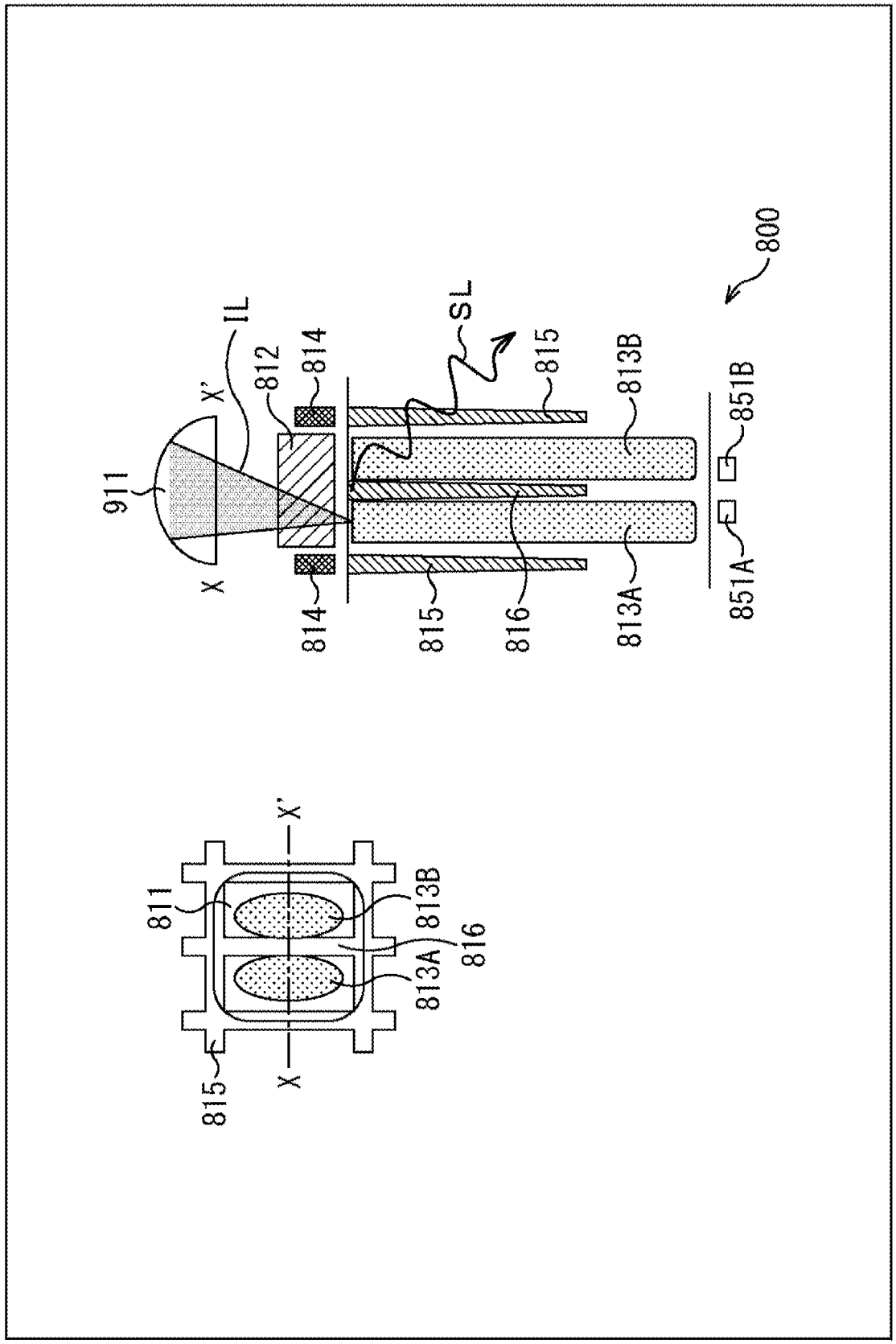
FIG. 5 is a diagram showing a structure of a pixel for improving the accuracy of phase difference detection.

Meanwhile, in FIG. 5, a pixel 800 in which a physical separation unit is provided between photoelectric conversion devices is shown. In the pixel 800 shown in FIG. 5, an inter-device separation unit 816 is formed in a silicon layer between a photoelectric conversion device 813A and a photoelectric conversion device 813B, and the photoelectric conversion device 813A and the photoelectric conversion device 813B are physically separated from each other.

Since the inter-device separation unit 816 is formed in the pixel 800 having the 2PD structure as described above, it is possible to improve the accuracy of phase difference detection by preventing the output of one photoelectric conversion device 813 (813A or 813B) from mixing with the output of the other photoelectric conversion device 813 (813B or 813A).

However, in the case where the inter-device separation unit 816 is formed in the pixel 800 shown in FIG. 5, particularly when it is in focus, the inter-device separation unit 816 may interfere with photoelectric conversion in a photoelectric conversion area of the photoelectric conversion device 813A or the photoelectric conversion device 813B, which reduces the sensitivity. In addition, it is shown that light scattering ("SL" in FIG. 5) occurs in the inter-device separation unit 816, which deteriorates the spectral characteristics, and thus, the image quality of a picked-up image is reduced.

3. Embodiments of Present Technology

Next, a structure of the pixel 100 to which an embodiment of the present technology will be described. Note that after describing a structure of an existing pixel 900 with reference to FIG. 6 to FIG. 8 for comparison, the structure of the pixel 100 to which an embodiment of the present technology will be described with reference to FIG. 9 to FIG. 31.

(Structure of Existing Pixel)

Figure 6:
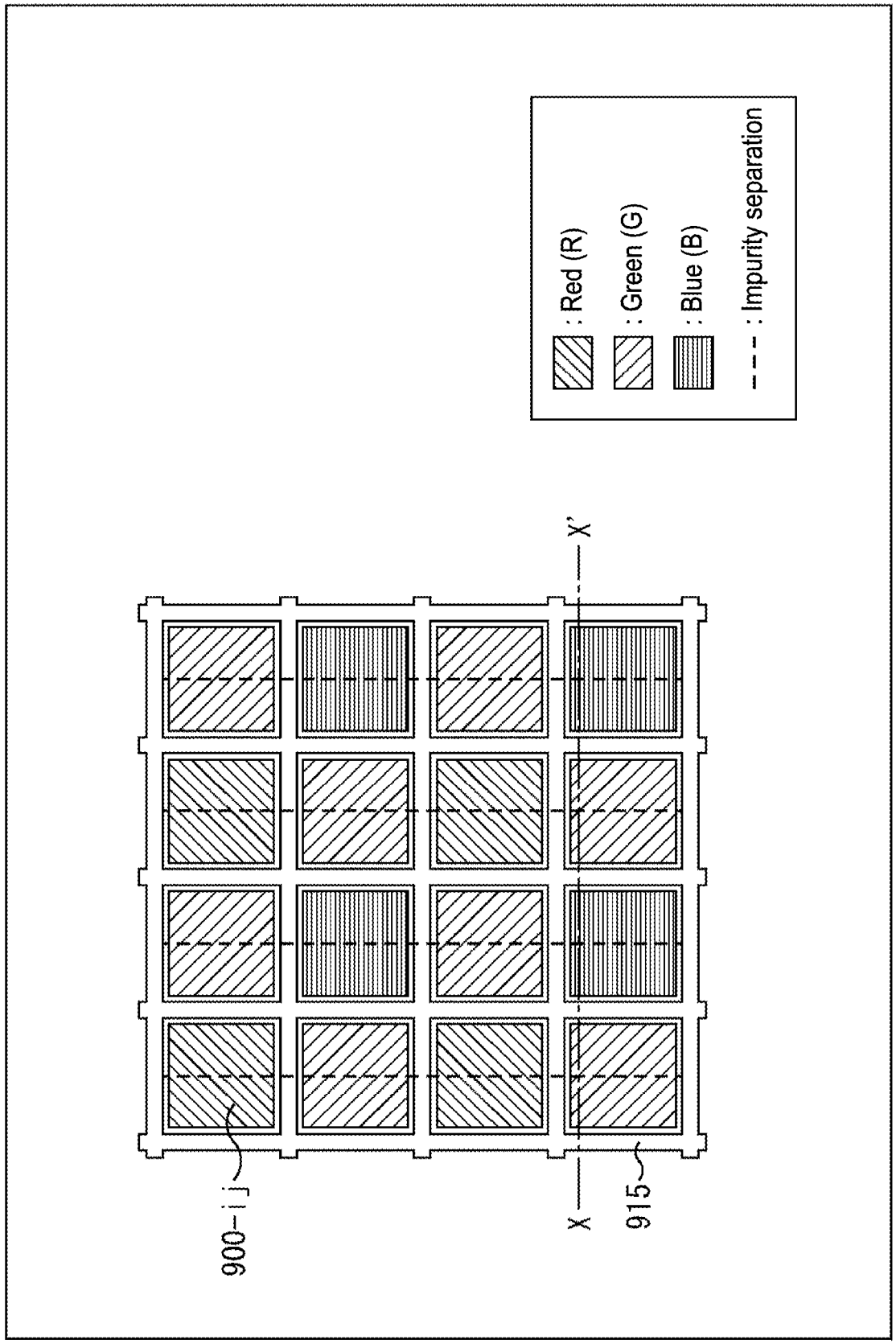
FIG. 6 is a diagram showing a plane layout of an existing pixel.

First, a structure of the existing pixel 900 will be described with reference to FIG. 6 to FIG. 8. FIG. 6 is a diagram showing a plane layout of the existing pixel 900. Note that the pixel 900 includes an on-chip lens 911, a color filter 912, photoelectric conversion device 913A and 913B, an inter-pixel light blocking unit 914, an inter-pixel separation unit 915, and transfer gates 951A and 951B.

In FIG. 6, the pixels 900 in four rows and four columns arranged in a partial area among a plurality of pixels 900 arranged two-dimensionally (in a matrix pattern) in a pixel array unit are shown as a typical example. Further, in FIG. 6, i-rows and j-columns of the pixels 900 arranged in the pixel array unit are represented by pixel 900-ij.

In this pixel array unit, the plurality of pixels 900 are two-dimensionally arranged in a Bayer pattern. Note that the Bayer pattern represents an arrangement pattern in which green (G) pixels are arranged in a checkered pattern, and red (R) pixels and blue (B) pixels are alternately arranged for each line in the remaining area.

Note that in the following description, a pixel in which an R color filter is provided as a color filter and charges corresponding to light of R components are obtained from light transmitted through the R color filter will be referred to as R pixel. Further, a pixel in which charges corresponding to light of G components are obtained from light transmitted through a G color filter will be referred to as G pixel. Further, a pixel in which charges corresponding to light of B components are obtained from light transmitted through a B color filter will be referred to as B pixel.

In the pixel array unit, each of the pixels 900 is a square unit pixel having the 2PD structure, and the pixels 900 are physically separated in the silicon layer by the inter-pixel separation unit 915 arranged in a square lattice. Note that although not shown in FIG. 6, in this pixel array unit, the inter-pixel light blocking unit 914 is arranged in a square lattice similarly to the inter-pixel separation unit 915.

Further, since each of the pixels 900 has the 2PD structure, a photoelectric conversion area of the photoelectric conversion device 913A and a photoelectric conversion area of the photoelectric conversion device 913B are formed in the silicon layer. These photoelectric conversion areas are separated by an impurity in the silicon layer as shown by dotted lines in the column direction in FIG. 6.

Figure 7:
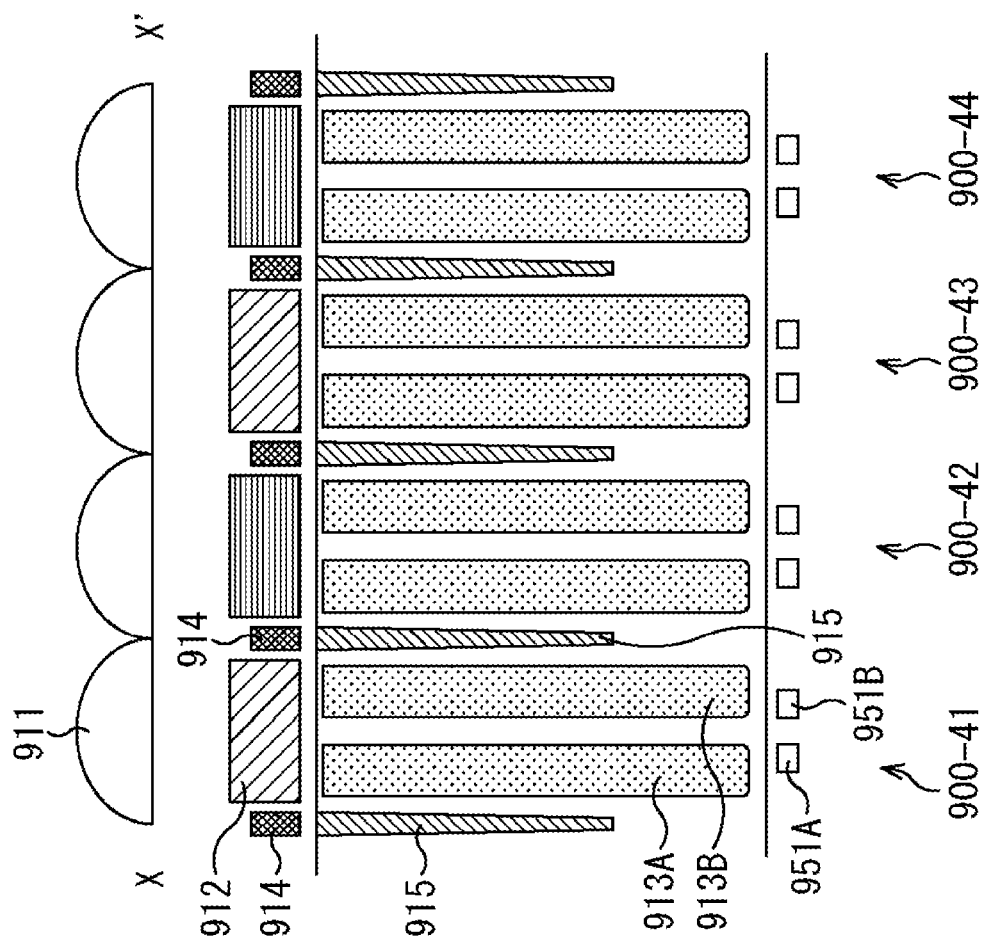
FIG. 7 is a cross-sectional view showing a structure of an existing pixel.

The X-X' cross section in the plan view shown in FIG. 6 can be represented by the cross-sectional view shown in FIG. 7. Note that assumption is made that the upper left pixel 900 in the pixel arrangement in four rows and four columns shown in FIG. 6 is a pixel 900-11 in this example. Therefore, the pixels 900 shown in the X-X' cross section are four pixels of a G pixel 900-41, a B pixel 900-42, a G pixel 900-43, and a B pixel 900-44.

In FIG. 7, the G pixel 900-41 has the 2PD structure including the photoelectric conversion device 913A and the photoelectric conversion device 913B. In the photoelectric conversion device 913A, charges corresponding to light of G components are generated from light that is collected by the on-chip lens 911 and transmitted through the G color filter 912. Further, in the photoelectric conversion device 913B, charges corresponding to light of G components are generated, similarly to the photoelectric conversion device 913A.

In the G pixel 900-43, charges corresponding to light of G components are generated by the photoelectric conversion device 913A and the photoelectric conversion device 913B, similarly to the G pixel 900-41. Further, in the B pixel 900-42 and the B pixel 900-44, charges corresponding to light of B components are generated by the photoelectric conversion device 913A and the photoelectric conversion device 913B.

The charges generated by the photoelectric conversion device 913A and the photoelectric conversion device 913B in each pixel 900 in this way are read via the transfer gate 951A and the transfer gate 951B, and used as information regarding phase difference detection.

Figure 8:
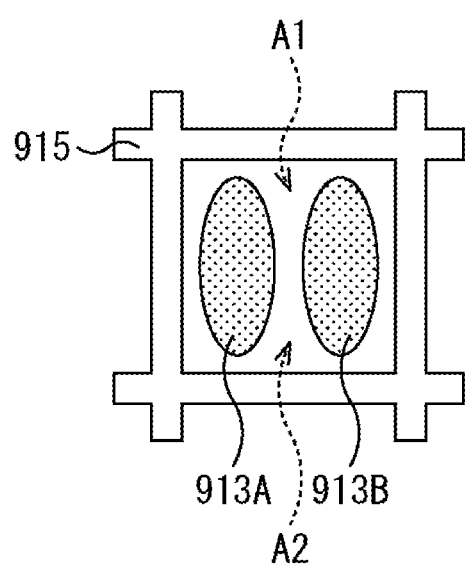
FIG. 8 is a diagram describing an N-type potential in a silicon layer of an existing pixel.

FIG. 8 is a plan view of a surface (light incident surface) of the pixel 900 on the light incident side, and an N-type potential in the silicon layer is shown. Specifically, in the pixels 900 physically separated by the inter-pixel separation unit 915 formed in a square lattice, the photoelectric conversion area of the photoelectric conversion device 913A and the photoelectric conversion area of the photoelectric conversion device 913B are formed as N-type areas, and areas other than these photoelectric conversion areas are formed as P-type areas.

In the pixel 900 having such a structure, since charges are not stored in the P-type area other than the photoelectric conversion area, which of the photoelectric conversion device 913A and the photoelectric conversion device 913B charges generated in the P-type area move to is unknown. Note that in the N-type photoelectric conversion area, when considering the cross section thereof, since the concentration is higher as it is closer to the transfer gate 951, the concentration is low on the side of the light incident surface. Therefore, in the photoelectric conversion area, charges generated on the side of the light incident surface in which the N-type concentration is low are difficult to draw.

Specifically, in FIG. 8, since the contribution of isolation between the photoelectric conversion devices in P-type areas A1 and A2 is low, it is desired to separate the photoelectric conversion device 913A and the photoelectric conversion device 913B.

In the case of only providing a physical separation unit (inter-device separation unit 816 in FIG. 5) between the photoelectric conversion device 913A and the photoelectric conversion device 913B, the image quality of a picked-up image is reduced as described above.

In this regard, the technology according to the present disclosure (present technology) makes it possible to improve the accuracy of phase difference detection while suppressing degradation of a picked-up image by providing a projection portion that protrudes from the inter-pixel separation unit or the inter-pixel light blocking unit in a projecting shape with respect to the P-type areas A1 and A2 to divide the destination of charges generated in the P-type area.

Hereinafter, the specific content of the present technology will be described with a first embodiment to a ninth embodiment.

(1) First Embodiment (Plane Layout of Pixel)

Figure 9:
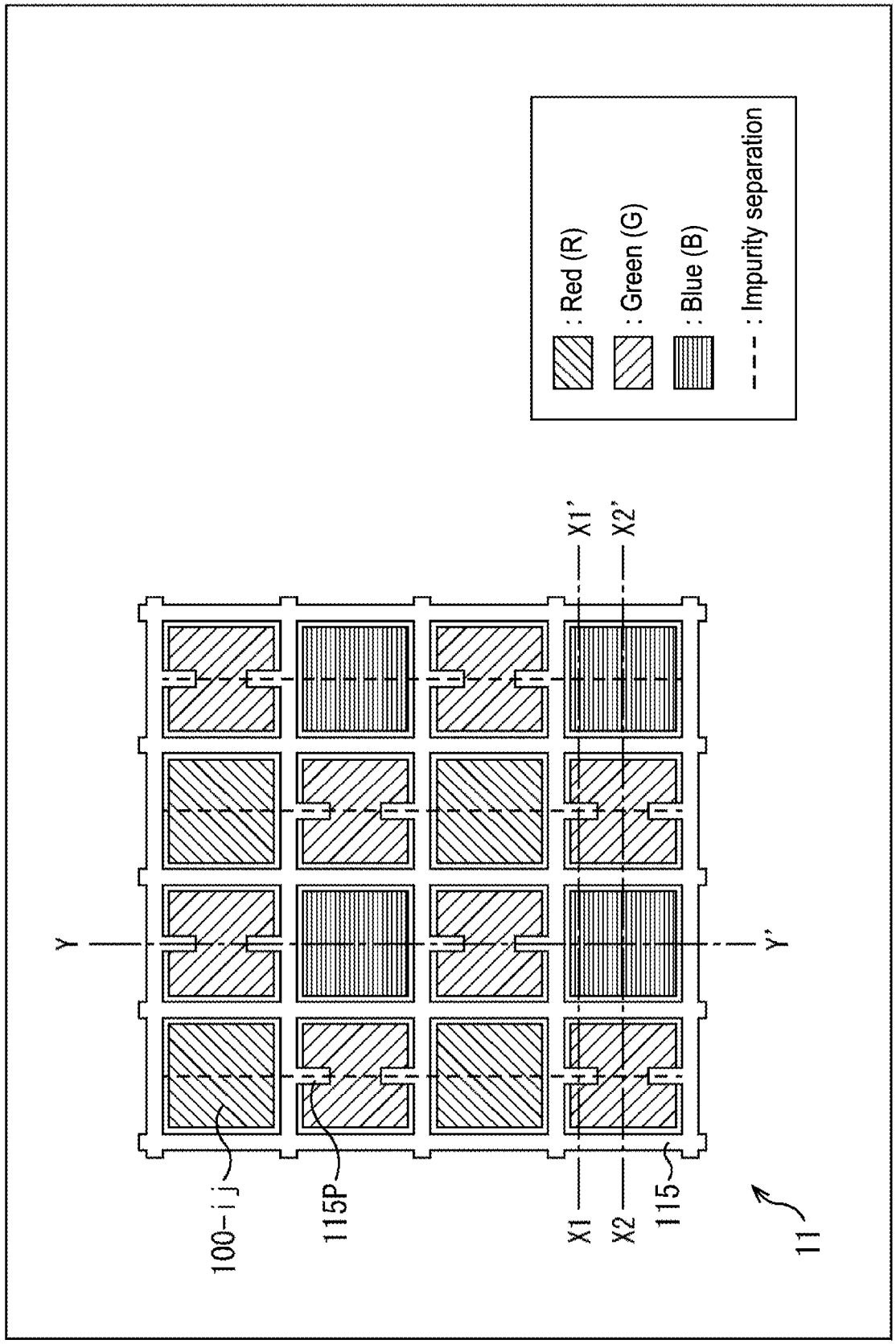
FIG. 9 is a diagram showing a plane layout of a pixel in a first embodiment.

FIG. 9 is a diagram showing a plane layout of the pixels 100 in a first embodiment.

In FIG. 9, pixels 100 in four rows and four columns arranged in a partial area among the plurality of pixels 100 two-dimensionally arranged in the pixel array unit 11 are shown as a typical example. In the pixel array unit 11, the plurality of pixels 100 are two-dimensionally arranged in a Bayer pattern.

Further, in FIG. 9, i-rows and j-columns of the pixels 100 arranged in the pixel array unit 11 are represented by pixel 100-*ij*. Note that this representation applies to other embodiments to be described later.

In the pixel array unit 11, each of the pixels 100 is a square unit pixel having the 2PD structure, and the pixels 100 are physically separated in a silicon layer by an inter-pixel separation unit 115 arranged in a square lattice.

Note that with respect to G pixels 100 among the pixels 100 arranged in the pixel array unit 11, a part of the inter-pixel separation unit 115 is formed to protrude toward the center of the corresponding pixel 100 in a projecting shape. In the following description, this protruding portion in a projecting shape will be represented as projection portion 115P.

For example, assuming that the upper left pixel 100 in the pixel arrangement in four rows and four columns in the pixel array unit 11 shown in FIG. 9 is a pixel 100-11, the G pixels 100 for which the projection portion 115P is formed are a G pixel 100-12, a G pixel 100-14, a G pixel 100-21, a G pixel 100-23, a G pixel 100-32, a G pixel 100-34, a G pixel 100-41, and a G pixel 100-43.

Figure 10:
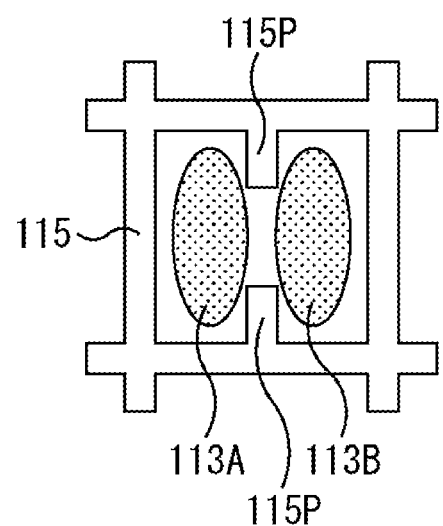
FIG. 10 is a diagram describing an N-type potential in a silicon layer of the pixel in the first embodiment.

Specifically, in these G pixels 100, a part of the inter-pixel separation unit 115 protrudes toward the center of the corresponding G pixel 100 in a projecting shape to form the projection portion 115P. Note that as shown in FIG. 10, the area in which the projection portion 115P is formed corresponds to the P-type areas A1 and A2 in which the contribution of isolation between the photoelectric conversion devices is low in FIG. 8.

Since the destination of charges generated in the P-type areas is divided by forming the projection portion 115P that projects in a projecting shape from the inter-pixel separation unit 115 in two areas corresponding to the P-type areas A1 and A2, it is possible to achieve improvement in the accuracy of phase difference detection while suppressing reduction of the sensitivity or increase in color mixture.

Further, since the G pixel 100 has the 2PD structure, a photoelectric conversion area of a photoelectric conversion device 113A and a photoelectric conversion area of a photoelectric conversion device 113B are formed in a silicon layer. These photoelectric conversion areas are separated by an impurity in the silicon layer as shown by dotted lines in the column direction in FIG. 9. That is, a physical separation unit (inter-device separation unit 816 in FIG. 5) is not formed at the center of the G pixel 100 that performs pupil-division, and the photoelectric conversion areas are separated by the impurity distribution in the silicon layer.

Figure 11:
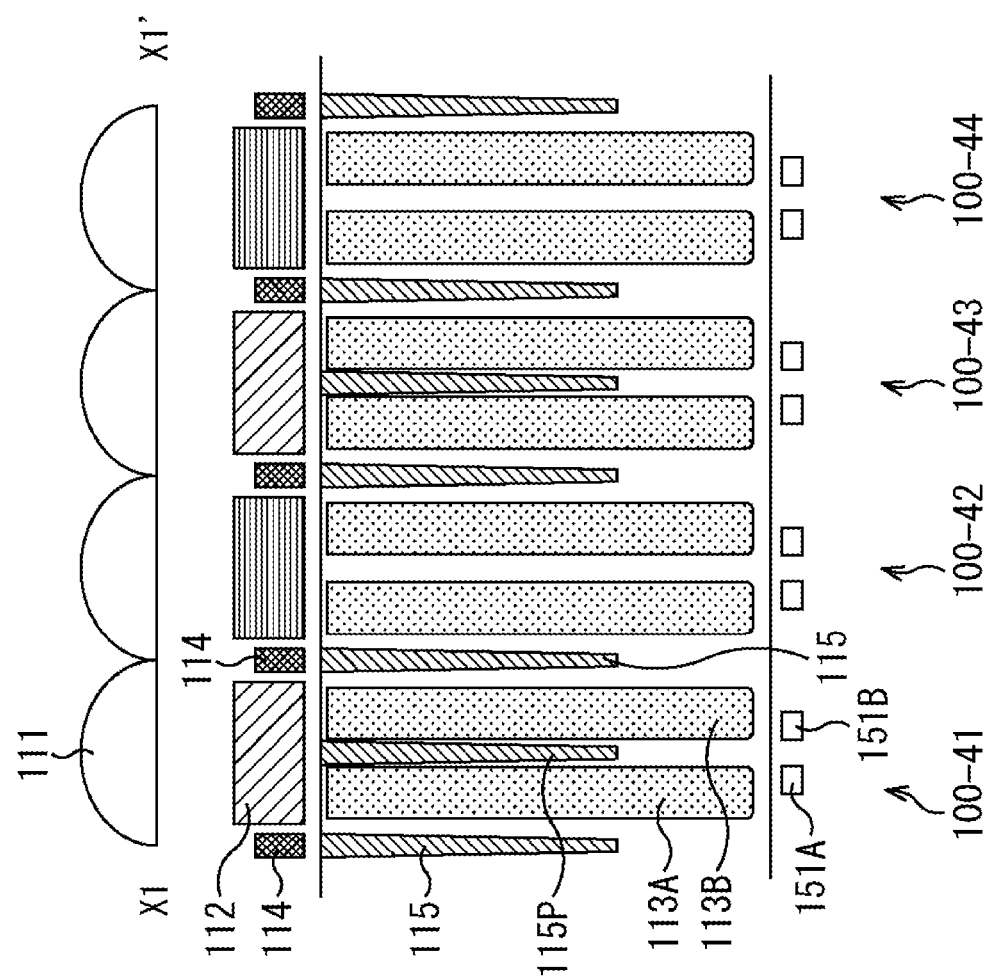
FIG. 11 is a first cross-sectional view showing a structure of the pixel in the first embodiment.

An X1-X1' cross section in the plan view of FIG. 9 can be represented by a cross-sectional view shown in FIG. 11. Note that also in this example, assuming that the upper left pixel 100 in the pixel arrangement in four rows and four columns is the pixel 100-11, the pixels 100 shown in the X1-X1' cross section are four pixels of the G pixel 100-41, a B pixel 100-42, the G pixel 100-43, and a B pixel 100-44.

In FIG. 11, the G pixel 100-41 has the 2PD structure including the photoelectric conversion device 113A and the photoelectric conversion device 113B. In the photoelectric conversion device 113A, charges corresponding to light of G components are generated from light that is collected by an on-chip lens 111 and transmitted through a G color filter 112. Further, in the photoelectric conversion device 113B, charges corresponding to light of G components are generated, similarly to the photoelectric conversion device 113A.

In the G pixel 100-43, charges corresponding to light of G components are generated by the photoelectric conversion device 113A and the photoelectric conversion device 113B, similarly to the G pixel 100-41. Further, in the B pixel 100-42 and the B pixel 100-44, charges corresponding to light of B components are generated by the photoelectric conversion device 113A and the photoelectric conversion device 113B.

The charges generated by the photoelectric conversion device 113A and the photoelectric conversion device 113B in each pixel 100 in this way are read via the transfer gate 151A and the transfer gate 151B, and used as information regarding phase difference detection.

Note that each of the pixels 100-41 to 100-44 is a square unit pixel having the 2PD structure, and light is blocked between the adjacent pixels by an inter-pixel light blocking unit 114 arranged in a square lattice. The inter-pixel light blocking unit 114 is formed of a material such as metals including tungsten (W) and aluminum (Al), and arranged in the area between the on-chip lens 111 and the silicon layer in which a photoelectric conversion area is formed.

Further, in the pixels 100-41 to 100-44, the adjacent pixels in the silicon layer are physically separated by the inter-pixel separation unit 115 arranged in a square lattice. Specifically, in this example, for example, the inter-pixel separation unit 115 is formed by embedding, from the surface of the light incident side (light incident surface), a material such as an oxidized film and a metal in a trench formed in a square lattice corresponding to the shape of the square unit pixel in the silicon layer in which a photoelectric conversion area is formed, by using a DTI (Deep Trench Isolation) technology.

In the G pixel 100-41 and the G pixel 100-43, the projection portion 115? is formed between the photoelectric conversion device 113A and the photoelectric conversion device 113B. Specifically, in the G pixel 100-41 and the G pixel 100-43 shown in FIG. 11, a part of the inter-pixel separation unit 115 protrudes toward the center of the corresponding G pixel 100 in a projecting shape to form the projection portion 115P.

Figure 12:
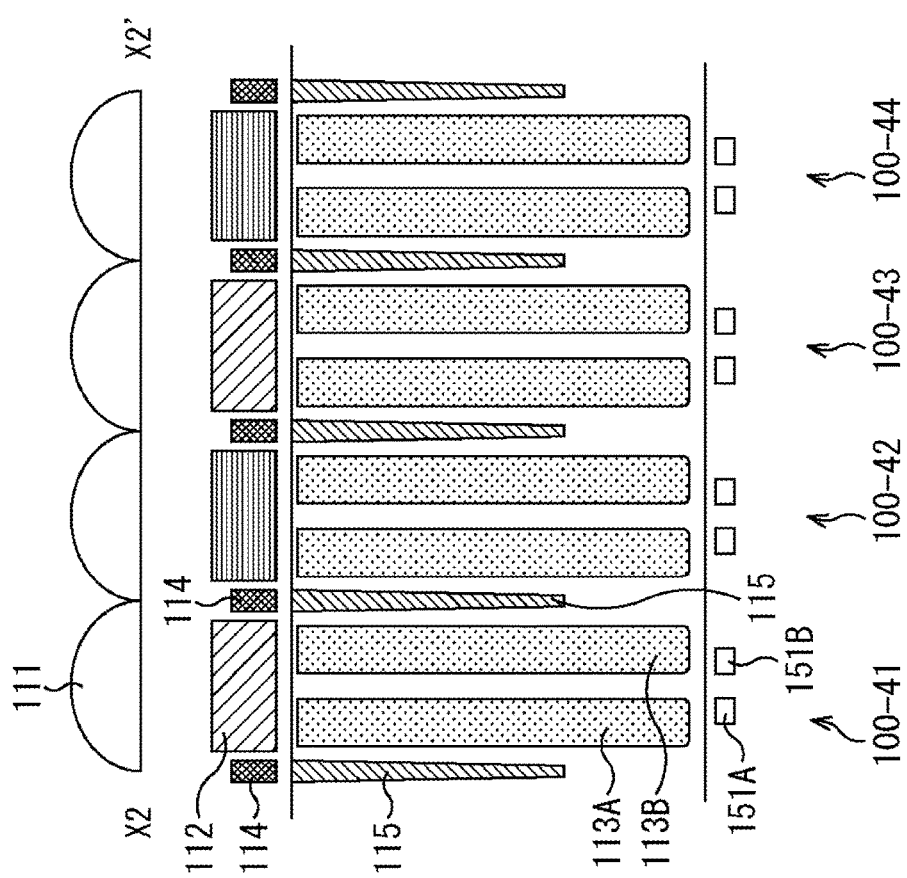
FIG. 12 is a second cross-sectional view showing the structure of the pixel in the first embodiment.

Further, an X2-X2' cross section in the plan view shown in FIG. 9 can be represented by a cross-sectional view shown in FIG. 12. Note that in FIG. 12, the pixels shown in the X2-X2' cross section are the G pixel 100-41, the B pixel 100-42, the G pixel 100-43, and the B pixel 100-44, similarly to FIG. 11.

Since the X2-X2' cross section is a cross section including the center of the G pixel 100, it does not include no projection portion 115P that protrudes toward the center of the corresponding G pixel 100 in a projecting shape. Specifically, in the G pixel 100-41 and the G pixel 100-43 shown in FIG. 12, no projection portion 115P is formed between the photoelectric conversion device 113A and the photoelectric conversion device 113B.

Figure 13:
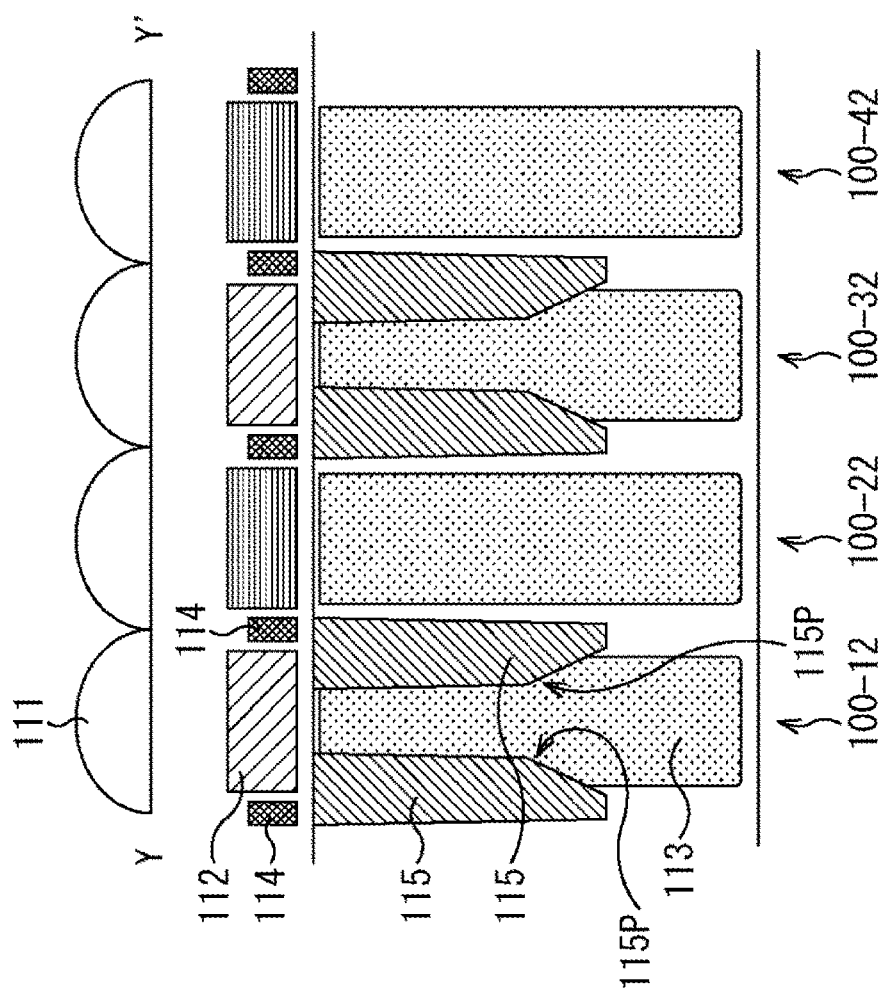
FIG. 13 is a third cross-sectional view showing the structure of the pixel in the first embodiment.

Further, a Y-Y' cross section in the plan view shown in FIG. 9 can be represented by a cross-sectional view shown in FIG. 13. Note that assuming that the upper left pixel 100 in the pixel arrangement in four rows and four columns is the pixel 100-11 also in this case, the pixels shown in the Y-Y' cross section are four pixels of the G pixel 100-12, a B pixel 100-22, the G pixel 100-32, and the B pixel 100-42.

In FIG. 13, in the G pixel 100-12 and the G pixel 100-32, a part of the inter-pixel separation unit 115 protrudes toward the center of the corresponding G pixel 100 in a projecting shape to form the projection portion 115P. Note that in the projection portion 115P shown in FIG. 13, the depth of the projection portion 115P differs for each protruding part (depth is not uniform).

Specifically, when viewed in the plan view shown in FIG. 9, it can be regarded that the projection portion 115P is formed in a T shape with respect to the inter-pixel separation unit 115. However, as shown in FIG. 13, the root part of the projection portion 115P has a depth similar to that of the inter-pixel separation unit 115, and the depth of the projection portion 115P is gradually reduced as it is closer to the tip thereof.

As described above, in the G pixel 100, a part of the inter-pixel separation unit 115 protrudes toward the center of the corresponding G pixel 100 to form the projection portion 115P. However, as shown in FIG. 11 to FIG. 13, the existence or non-existence of the projection portion 115P or the shape (depth) thereof differs depending on the cut of the cross section.

In other words, in the case where the projection portion 115P of the inter-pixel separation unit 115 is formed in the pixel 100 having the 2PD structure, a first cross section (e.g., the cross section shown in FIG. 11) including no center of the pixel 100 includes the cross section of the projection portion 115P between the two photoelectric conversion areas, but a second cross section (e.g., the cross section shown in FIG. 12) including the center of the pixel 100 includes no cross section of the projection portion 115P between the two photoelectric conversion areas.

(Structure of Pixel in First Embodiment)

Figure 14:
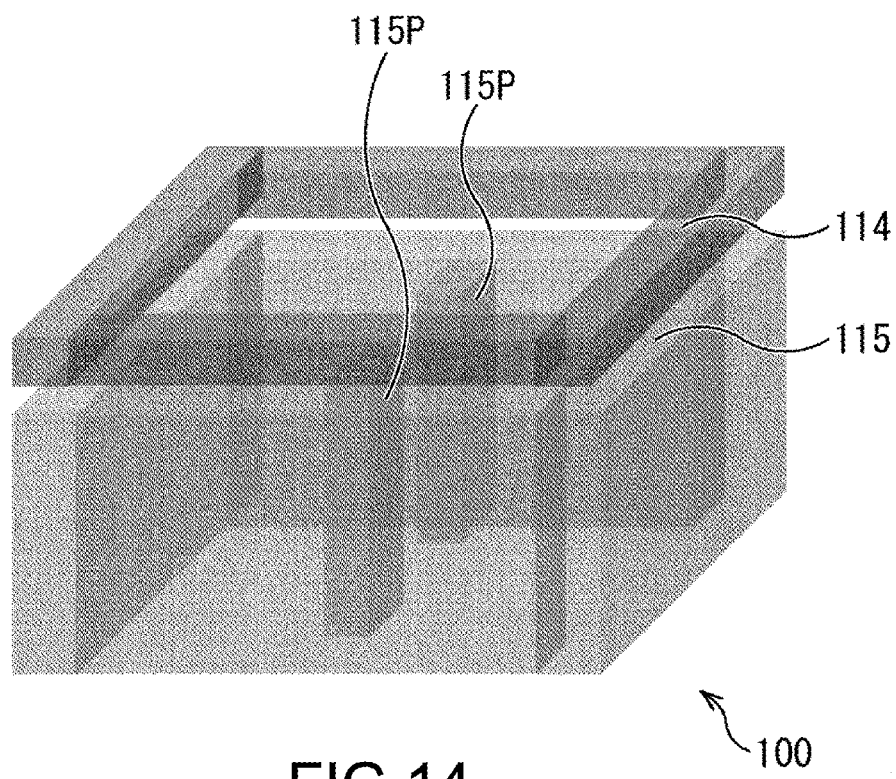
FIG. 14 is a three-dimensional diagram showing the structure of the pixel in the first embodiment.

FIG. 14 is a three-dimensional diagram showing the three-dimensional structure of the pixel 100 in the first embodiment.

In FIG. 14, an arbitrary pixel 100 (e.g., G pixel 100 in which the projection portion 115P is formed) among the plurality of pixels 100 two-dimensionally arranged in the pixel array unit 11 is shown. In the pixel array unit 11, the inter-pixel light blocking unit 114 and the inter-pixel separation unit 115 are formed in a square lattice between adjacent pixels.

The inter-pixel light blocking unit 114 is formed of a metal such as tungsten (W) and aluminum (Al) in a square lattice and blocks light between adjacent pixels. Further, the inter-pixel separation unit 115 is formed of an oxidized film, metal, or the like embedded in a trench in a square lattice, which is formed in a silicon layer, and physically separates adjacent pixels.

In the first embodiment, a part of the inter-pixel separation unit 115 out of the inter-pixel light blocking unit 114 formed in in a square lattice and the inter-pixel separation unit 115 formed in in a square lattice protrudes, in a projecting shape, toward the center of the square unit pixel 100 having the 2PD structure to form the projection portion 115P.

As the material of the projection portion 115P, the same material as that of the inter-pixel separation unit 115 or a different material may be used. For example, in the case where the inter-pixel separation unit 115 is formed of an oxidized film, also the projection portion 115P may be formed of an oxidized film. Further, for example, in the case where the inter-pixel separation unit 115 is formed of a metal, the projection portion 115P may be formed of an oxidized film.

As described above, the projection portions 115P formed at two places with respect to the inter-pixel separation unit 115 in the pixel 100 are formed in the areas where the contribution of isolation is low in the silicon layer. By forming the projection portion 115P in such areas, it is possible to achieve improvement in the accuracy of phase difference detection while suppressing reduction of the sensitivity or increase in color mixture.

Note that although detailed content will be described later with reference to FIG. 22 and FIG. 23, immediately below the on-chip lens 111, for example, a protruding length of the projection portion 115P can be determined depending on a focused spot diameter of the on-chip lens 111 so that physical isolation (silicon isolation) by the projection portion 115P is not made.

The first embodiment has been described heretofore.

(2) Second Embodiment (Structure of Pixel in Second Embodiment)

Figure 15:
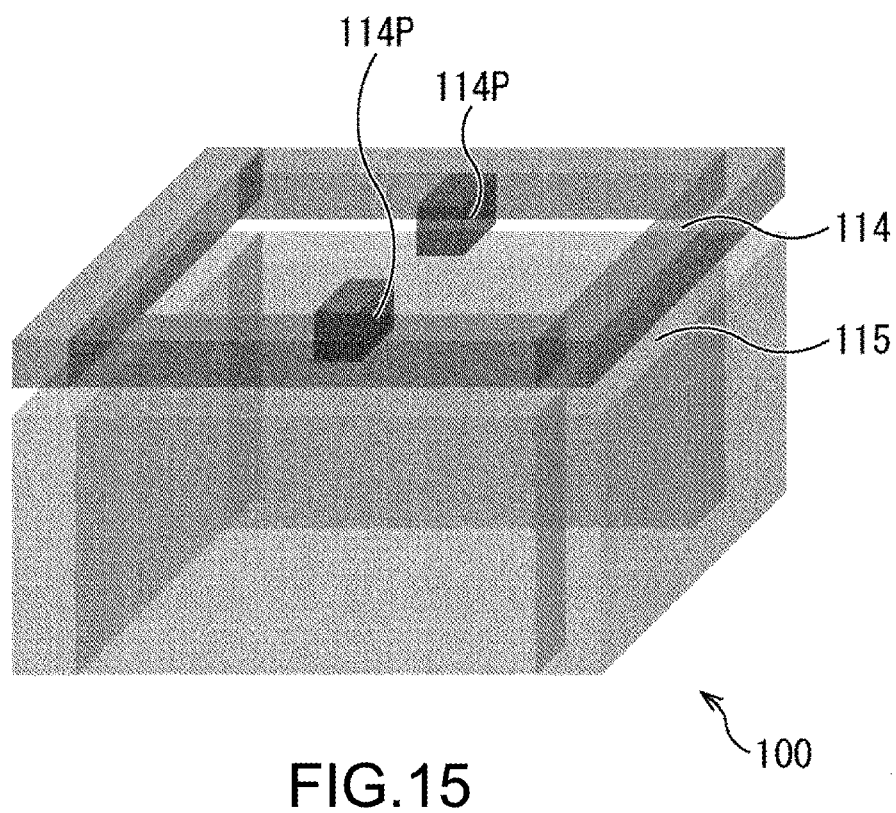
FIG. 15 is a three-dimensional diagram showing a structure of a pixel in a second embodiment.

FIG. 15 is a three-dimensional diagram showing a three-dimensional structure of the pixel 100 in a second embodiment.

In FIG. 15, an arbitrary pixel 100 among the plurality of pixels 100 two-dimensionally arranged in the pixel array unit 11 is illustrated, similarly to the above-mentioned FIG. 14. In the pixel array unit 11, between adjacent pixels, the inter-pixel light blocking unit 114 and the inter-pixel separation unit 115 are formed in a square lattice.

In the second embodiment, a part of the inter-pixel light blocking unit 114 out of the inter-pixel light blocking unit 114 formed in in a square lattice and the inter-pixel separation unit 115 formed in in a square lattice protrudes, in a projecting shape, toward the center of the square unit pixel 100 having the 2PD structure to form a projection portion 114P.

Note that as the material of the projection portion 114P, the same material as that of the inter-pixel light blocking unit 114 or a different material may be used.

As described above, although the case where the projection portion 115P is formed with respect to the inter-pixel separation unit 115 has been described in the above-mentioned first embodiment, the projection portion 114P is formed with respect to the inter-pixel light blocking unit 114 in the second embodiment.

Specifically, the projection portions 114P formed at two places with respect to the inter-pixel light blocking unit 114 in the pixel 100 are formed in the areas where the contribution of isolation is low in the silicon layer. By forming the projection portion 114P in such areas, it is possible to achieve improvement in the accuracy of phase difference detection while suppressing reduction of the sensitivity or increase in color mixture.

Note that although detailed content will be described later with reference to FIG. 22 and FIG. 23, for example, a protruding length of the projection portion 114P can be determined depending on a focused spot diameter of the on-chip lens 111.

The second embodiment has been described heretofore.

(3) Third Embodiment (Structure of Pixel in Third Embodiment)

Figure 16:
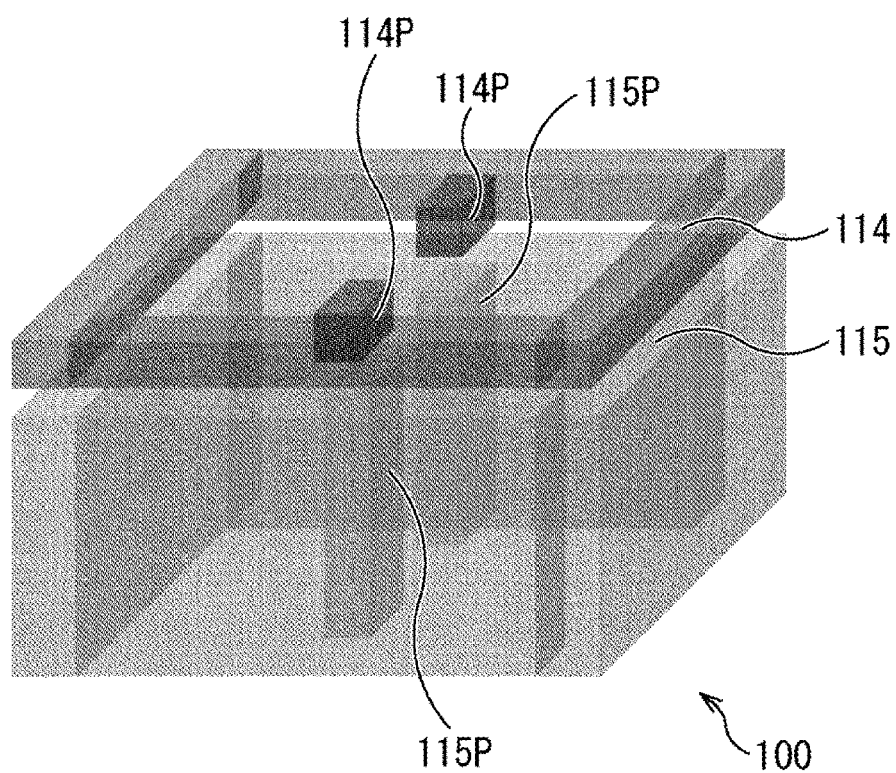
FIG. 16 is a three-dimensional diagram showing a structure of a pixel in a third embodiment.

FIG. 16 is a three-dimensional diagram showing a three-dimensional structure of the pixel 100 in a third embodiment.

In FIG. 16, an arbitrary pixel 100 among the plurality of pixels 100 two-dimensionally arranged in the pixel array unit 11 is illustrated, similarly to the above-mentioned FIG. 14 and FIG. 15. In the pixel array unit 11, between adjacent pixels, the inter-pixel light blocking unit 114 and the inter-pixel separation unit 115 are formed in a square lattice.

In the third embodiment, a part of the inter-pixel light blocking unit 114 formed in in a square lattice and a part of the inter-pixel separation unit 115 formed in in a square lattice protrude, in a projecting shape, toward the center of the square unit pixel 100 having the 2PD structure to form the projection portion 114P and the projection portion 115P, respectively.

Note that as the material of the projection portion 114P, the same material as that of the inter-pixel light blocking unit 114 or a different material may be used. Further, as the material of the projection portion 115P, the same material as that of the inter-pixel separation unit 115 or a different material may be used As described above, although the case where the projection portion 115P is formed with respect to the inter-pixel separation unit 115 has been described in the above-mentioned first embodiment and the case where the projection portion 114P is formed with respect to the inter-pixel light blocking unit 114 has been described in the second embodiment, the projection portion 114P and the projection portion 115P are respectively formed with respect to the inter-pixel light blocking unit 114 and the inter-pixel separation unit 115 in the third embodiment.

Specifically, the projection portions 114P formed at two places with respect to the inter-pixel light blocking unit 114 in the pixel 100 are formed in the areas where the contribution of isolation is low in the silicon layer. Further, the projection portions 115P formed at two places with respect to the inter-pixel separation unit 115 in the pixel 100 are formed in the areas where the contribution of isolation is low in the silicon layer. By forming the projection portion 114P and the projection portion 115P in such areas, it is possible to achieve improvement in the accuracy of phase difference detection while suppressing reduction of the sensitivity or increase in color mixture.

Note that although detailed content will be described later with reference to FIG. 22 and FIG. 23, for example, a protruding length of the projection portion 114P and a protruding length of the projection portion 115P can be determined depending on a focused spot diameter of the on-chip lens 111.

The third embodiment has been described heretofore.

(4) Fourth Embodiment (Structure in which Projection Portion is Formed Only with Respect to G Pixel)

Figure 17:
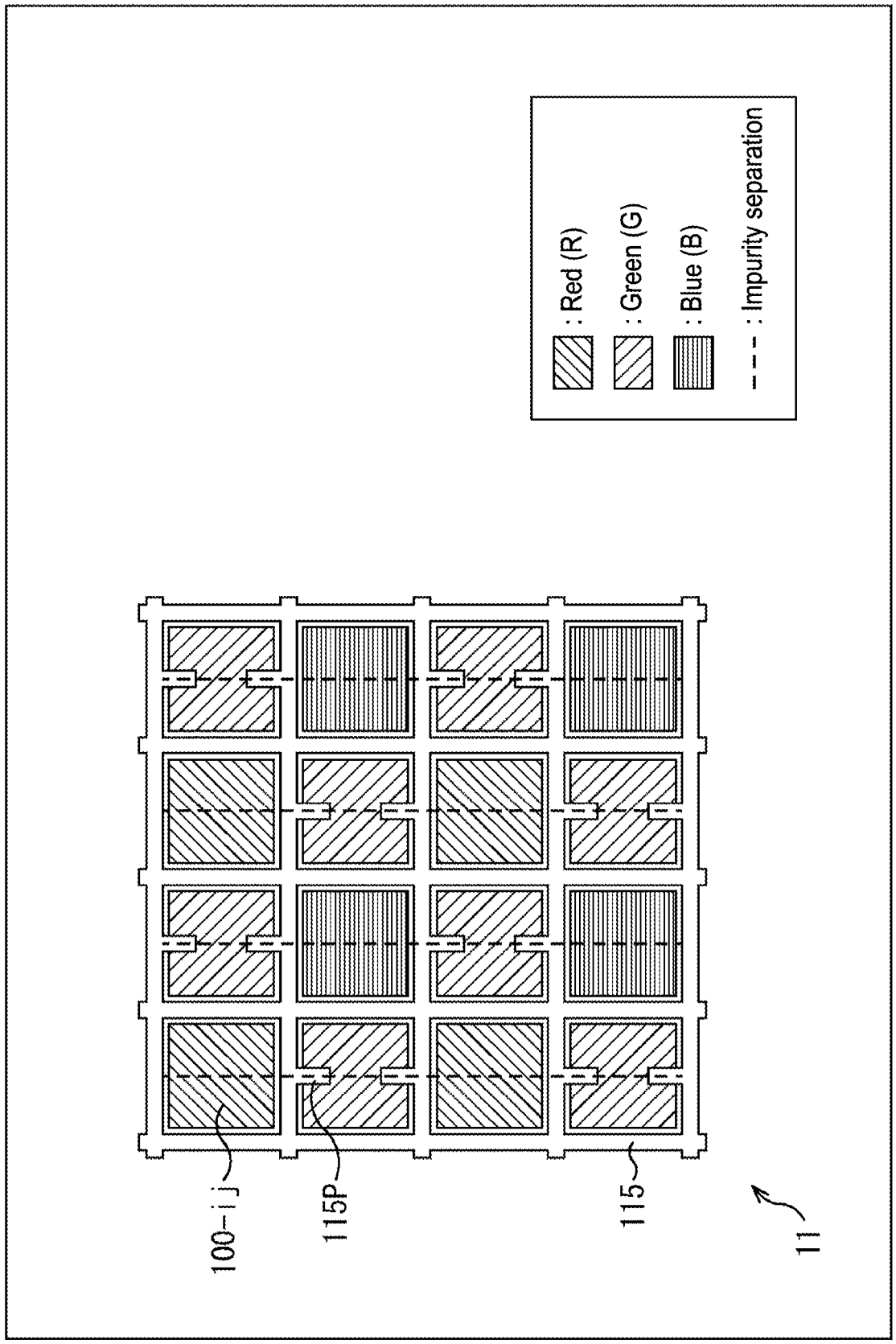
FIG. 17 is a plan view showing a structure of a pixel in a fourth embodiment.

FIG. 17 is a plan view showing a structure of the pixel 100 in a fourth embodiment.

In FIG. 17, the pixels 100 in four rows and four columns arranged in a partial area among the plurality of pixels 100 two-dimensionally arranged in the pixel array unit 11 are illustrated as a typical example. Among the pixels 100 arranged in a Bayer array, the projection portion 115P is formed with respect to the inter-pixel separation unit 115 only in the G pixel 100.

For example, assuming that the upper left pixel 100 in the pixel arrangement in four rows and four columns shown in FIG. 17 is the pixel 100-11, the G pixels 100 in which the projection portion 115P is formed are the G pixel 100-12, the G pixel 100-14, the G pixel 100-21, the G pixel 100-23, the G pixel 100-32, the G pixel 100-34, the G pixel 100-41, and the G pixel 100-43.

Now, assumption is made that when comparing information acquired from an output of the G pixel 100 and information acquired from outputs of the R pixel 100 and the B pixel 100, the amount of information acquired from the output of the G pixel 100 is the largest, e.g., the information acquired from the output of the G pixel 100 is dominant when acquiring information regarding phase difference detection. In this case, the structure in which the projection portion 115P is formed only in the G pixel 100 as shown in FIG. 17 can be employed.

Note that the structure in which the projection portion 115P is formed with respect to the inter-pixel separation unit 115 only in the G pixel 100 shown in FIG. 17 is similar to the above-mentioned structure shown in FIG. 9. Further, a photoelectric conversion area of the photoelectric conversion device 113A and a photoelectric conversion area of the photoelectric conversion device 113B in the pixel 100 are separated by an impurity in a silicon layer as shown by dotted lines in the column direction in FIG. 17.

Further, although the case where the projection portion 115P is formed with respect to the inter-pixel separation unit 115 corresponding to the above-mentioned first embodiment has been described in FIG. 17, the projection portion 114P may be formed with respect to the inter-pixel light blocking unit 114 only in the G pixel 100 corresponding to the above-mentioned second embodiment. Further, projection portions may be formed with respect to the inter-pixel light blocking unit 114 and the inter-pixel separation unit 115 only in the G pixel 100 corresponding to the above-mentioned third embodiment.

(Structure in which Projection Portions are Formed in all Pixels)

Figure 18:
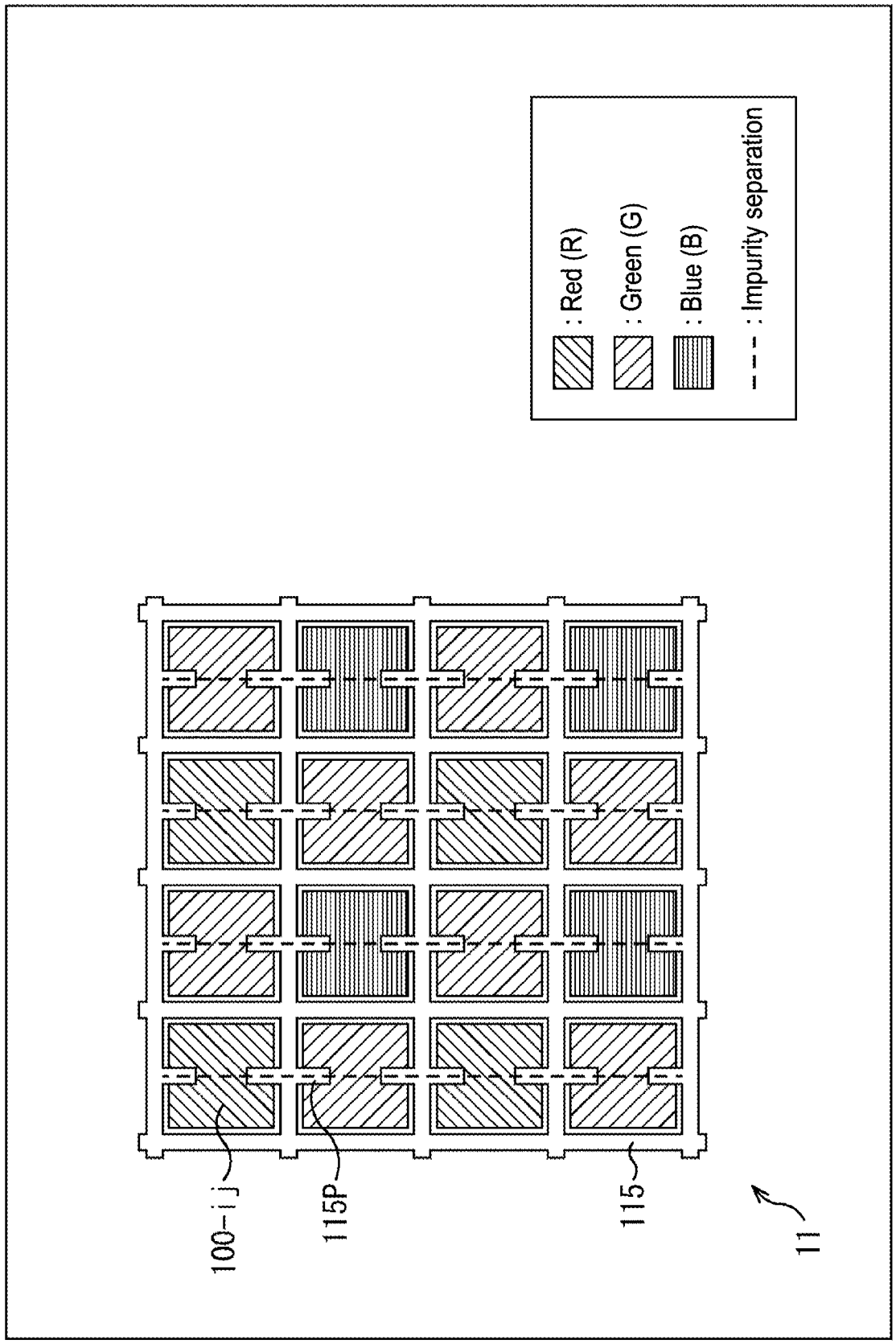
FIG. 18 is a plan view showing a first modified example of the structure of the pixel in the fourth embodiment.

FIG. 18 is a plan view showing a first modified example of the structure of the pixel 100 in the fourth embodiment.

In FIG. 18, arbitrary pixels 100 in four rows and four columns among the plurality of pixels 100 arranged in a Bayer array in the pixel array unit 11 are illustrated. In all of the pixels 100, the projection portion 115P is formed with respect to the inter-pixel separation unit 115.

For example, assuming the upper left pixel 100 in the pixel arrangement in four rows and four columns shown in FIG. 18 is the pixel 100-11, the pixels 100 in which the projection portion 115P is formed are the R pixels 100 (100-11, 100-13, 100-31, and 100-33), the G pixels 100 (100-12, 100-14, 100-21, 100-23, 100-32, 100-34, 100-41, and 100-43), and the B pixels 100 (100-22, 100-24, 100-42, and 100-44).

Note that in the case where the projection portion 115P is formed in the R pixel 100, the G pixel 100, and the B pixel 100, since information regarding phase difference detection can be acquired from outputs of all the pixels 100, a configuration in which the projection portion 115P is formed in all the pixels 100 as shown in FIG. 18 can be employed, for example, when it is desired to acquire information regarding phase difference detection from all the pixels 100.

Further, although the case where the projection portion 115P is formed with respect to the inter-pixel separation unit 115 corresponding to the above-mentioned first embodiment has been described in FIG. 18, the projection portion 114P may be formed with respect to the inter-pixel light blocking unit 114 in all the G pixel 100 corresponding to the above-mentioned second embodiment. Further, projection portions may be formed with respect to the inter-pixel light blocking unit 114 and the inter-pixel separation unit 115 in all the G pixel 100 corresponding to the above-mentioned third embodiment.

(Structure in which Projection Portion is Formed Only in R Pixel)

Figure 19:
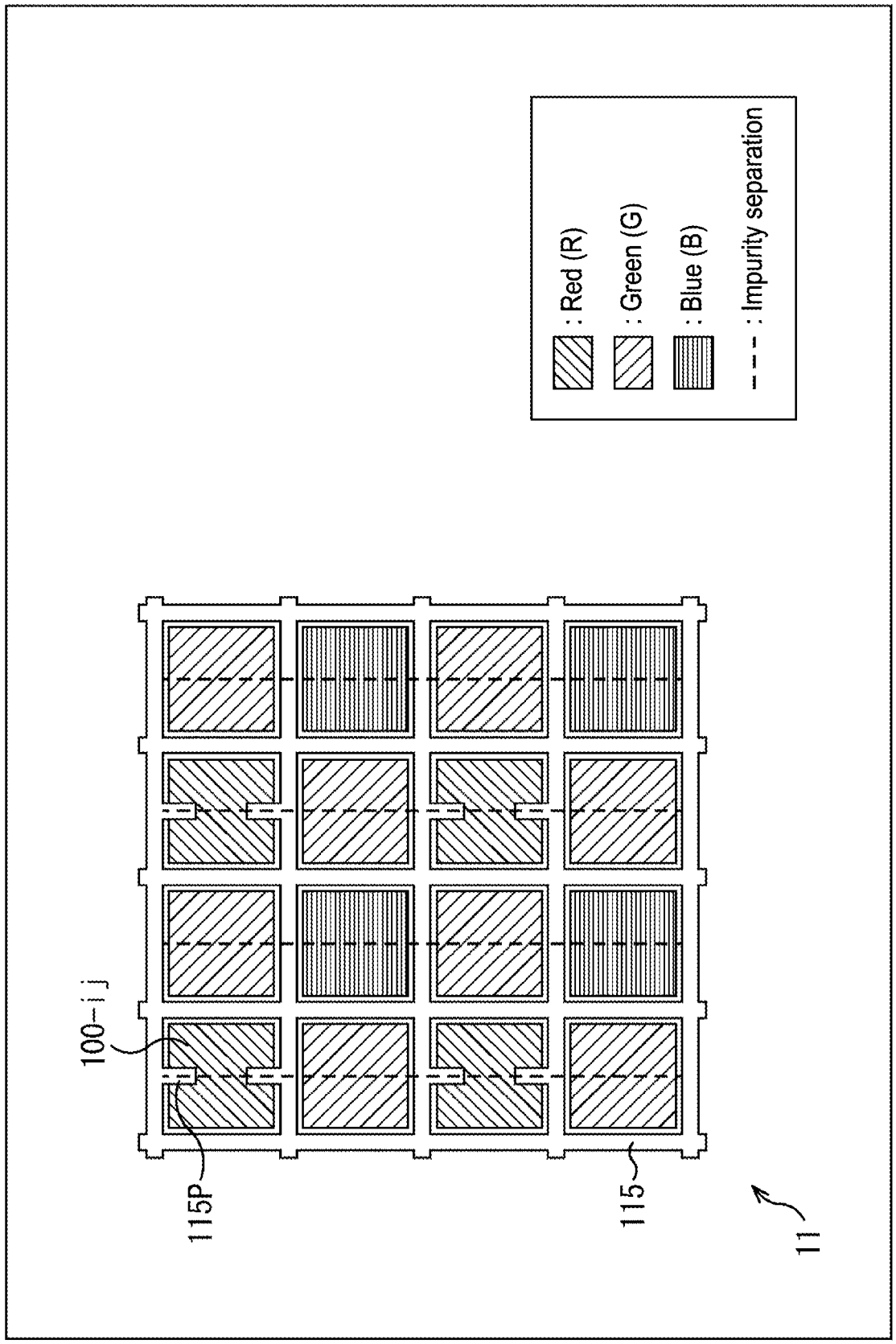
FIG. 19 is a plan view showing a second modified example of the structure of the pixel in the fourth embodiment.

FIG. 19 is a plan view showing a second modified example of the structure of the pixel 100 in the fourth embodiment.

In FIG. 19, arbitrary pixels 100 in four rows and four columns among the plurality of pixels 100 arranged in a Bayer array in the pixel array unit 11 are illustrated. Only in the R pixel 100, the projection portion 115P is formed with respect to the inter-pixel separation unit 115.

For example, assuming the upper left pixel 100 in the pixel arrangement in four rows and four columns shown in FIG. 19 is the pixel 100-11, the R pixels 100 in which the projection portion 115P is formed are the R pixel 100-11, the R pixel 100-13, the R pixel 100-31, and the R pixel 100-33.

Note that although the case where the projection portion 115P is formed with respect to the inter-pixel separation unit 115 corresponding to the above-mentioned first embodiment has been described in FIG. 19, the projection portion 114P may be formed with respect to the inter-pixel light blocking unit 114 only in the R pixel 100 corresponding to the above-mentioned second embodiment. Further, projection portions may be formed with respect to the inter-pixel light blocking unit 114 and the inter-pixel separation unit 115 only in the R pixel 100 corresponding to the above-mentioned third embodiment.

(Structure in which Projection Portion is Formed Only in B Pixel)

Figure 20:
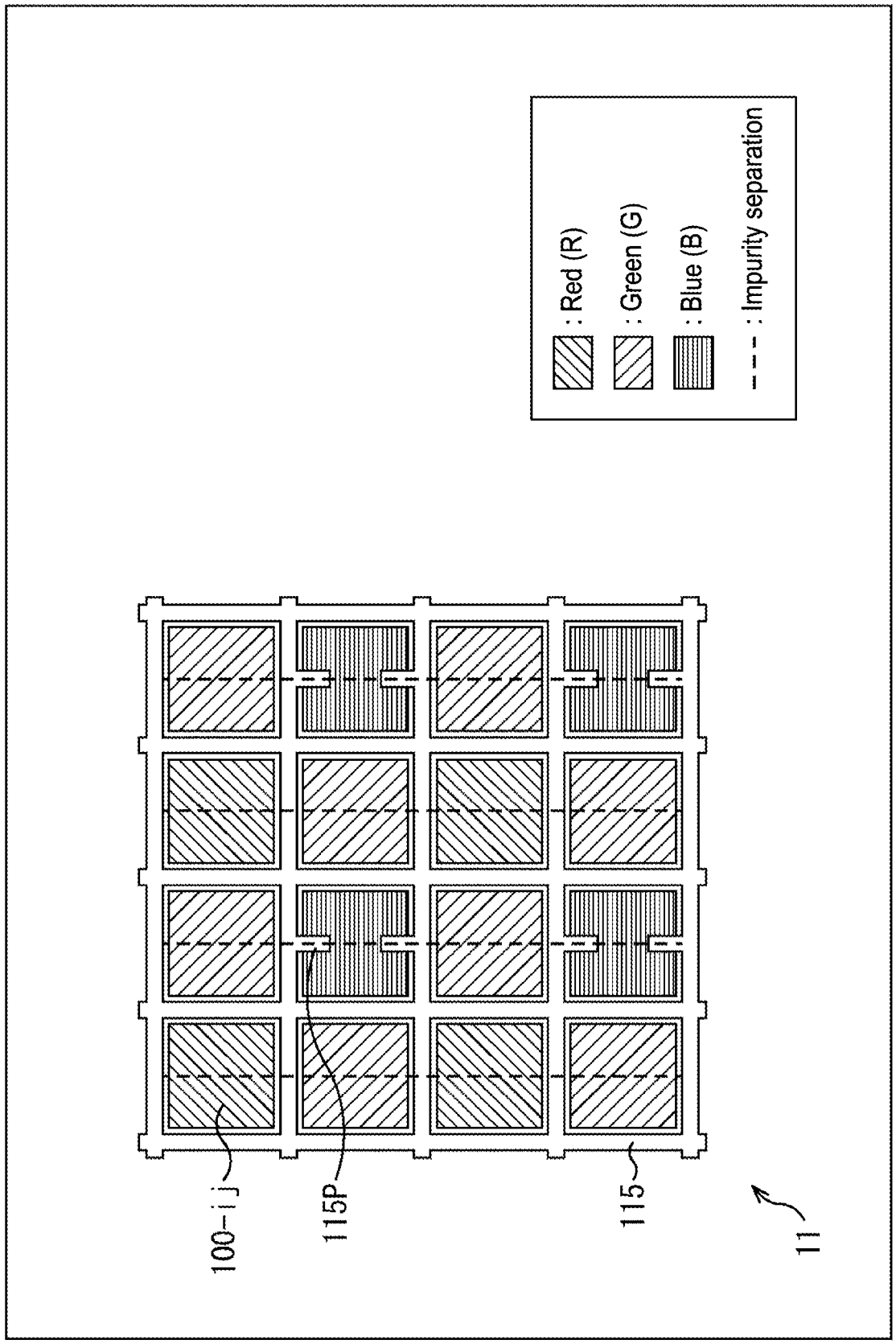
FIG. 20 is a plan view showing a third modified example of the structure of the pixel in the fourth embodiment.

FIG. 20 is a plan view showing a third modified example of the structure of the pixel 100 in the fourth embodiment.

In FIG. 20, arbitrary pixels 100 in four rows and four columns among the plurality of pixels 100 arranged in a Bayer array in the pixel array unit 11 are illustrated. Only in the B pixel 100, the projection portion 115P is formed with respect to the inter-pixel separation unit 115.

For example, assuming the upper left pixel 100 in the pixel arrangement in four rows and four columns shown in FIG. 20 is the pixel 100-11, the B pixels 100 in which the projection portion 115P is formed are the B pixel 100-22, the B pixel 100-24, the B pixel 100-42, and the B pixel 100-44.

Note that although the case where the projection portion 115P is formed with respect to the inter-pixel separation unit 115 corresponding to the above-mentioned first embodiment has been described in FIG. 20, the projection portion 114P may be formed with respect to the inter-pixel light blocking unit 114 only in the B pixel 100 corresponding to the above-mentioned second embodiment. Further, projection portions may be formed with respect to the inter-pixel light blocking unit 114 and the inter-pixel separation unit 115 only in the B pixel 100 corresponding to the above-mentioned third embodiment.

(Structure in which Projection Portions are Formed Only in G and B Pixels)

Figure 21:
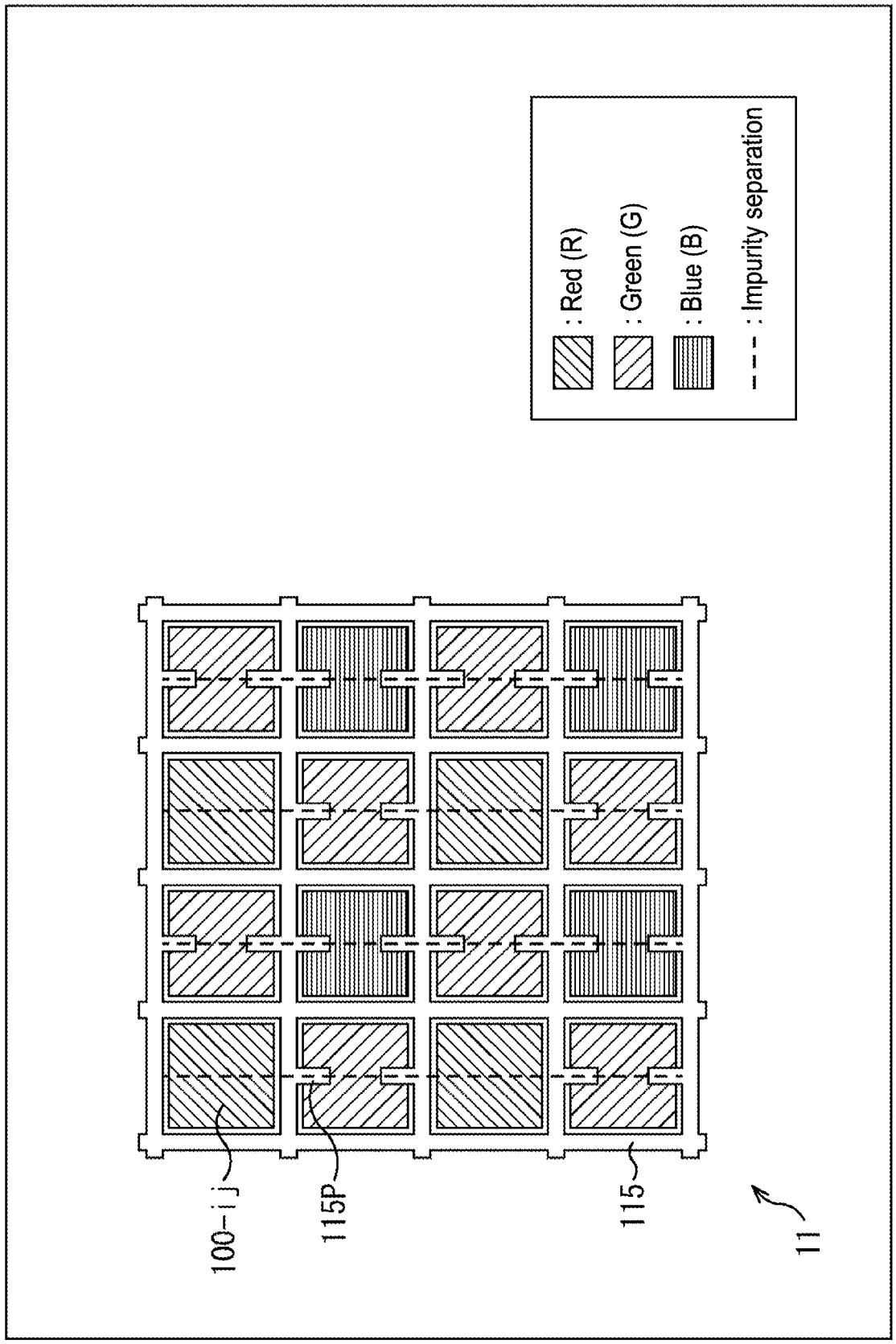
FIG. 21 is a plan view showing a fourth modified example of the structure of the pixel in the fourth embodiment.

FIG. 21 is a plan view showing a fourth modified example of the structure of the pixel 100 in the fourth embodiment.

In FIG. 21, arbitrary pixels 100 in four rows and four columns among the plurality of pixels 100 arranged in a Bayer array in the pixel array unit 11 are illustrated. Only in the G pixel 100 and the B pixel 100, the projection portion 115P is formed with respect to the inter-pixel separation unit 115.

For example, assuming the upper left pixel 100 in the pixel arrangement in four rows and four columns shown in FIG. 21 is the pixel 100-11, the pixels 100 in which the projection portion 115P is formed are the G pixels 100 (100-12, 100-14, 100-21, 100-23, 100-32, 100-34, 100-41, and 100-43) and the B pixels 100 (100-22, 100-24, 100-42, and 100-44).

Note that although the case where the projection portion 115P is formed with respect to the inter-pixel separation unit 115 corresponding to the above-mentioned first embodiment has been described in FIG. 21, the projection portion 114P may be formed with respect to the inter-pixel light blocking unit 114 only in the G pixel 100 and the B pixel 100 corresponding to the above-mentioned second embodiment. Further, projection portions may be formed with respect to the inter-pixel light blocking unit 114 and the inter-pixel separation unit 115 only in the G pixel 100 and the B pixel 100 corresponding to the above-mentioned third embodiment.

Further, although a combination of the G pixel 100 and the B pixel 100 is illustrated as a combination of the pixels 100 in which the projection portion 115P is formed in this example, the pattern of the combination of the pixels 100 in which the projection portion 115P is formed can be arbitrarily determined, e.g., a combination of the R pixel 100 and the G pixel 100 and a combination of the R pixel 100 and the B pixel 100.

The fourth embodiment has been described heretofore.

(5) Fifth Embodiment (Determination of Length of Projection Portion)

Figure 22:
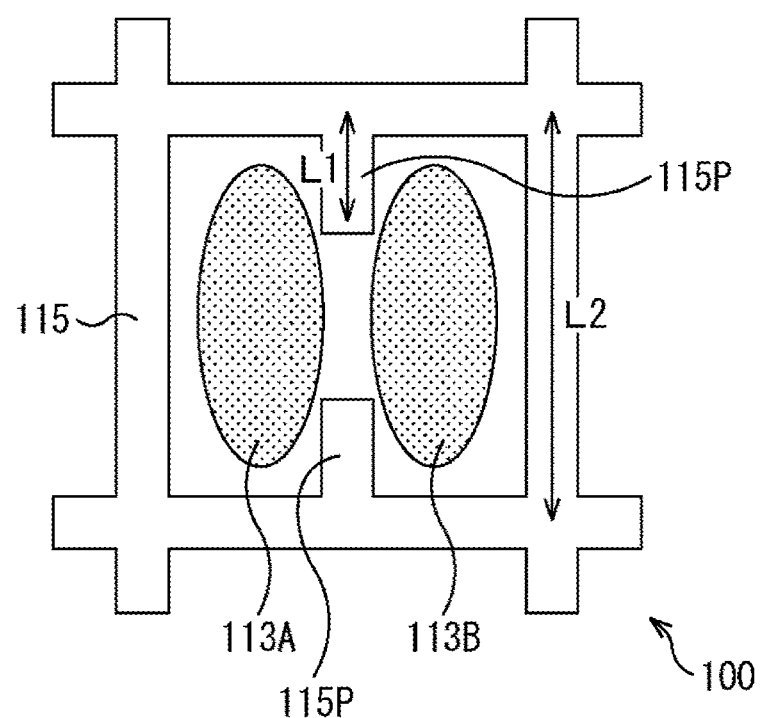
FIG. 22 is a plan view showing a structure of a pixel in a fifth embodiment.

FIG. 22 is a plan view showing a structure of the pixel 100 in a fifth embodiment.

In FIG. 22, in the pixel 100, a part of the inter-pixel separation unit 115 arranged in a square lattice protrudes toward the center of the pixel 100 in a projecting shape to form the projection portion 115P. A length of a protruding part of the projection portion 115P (hereinafter, referred to also as the projecting length) can be an arbitrary length. However, for example, the length may be determined as follows.

Specifically, for example, when the diameter of a focused spot S on the light incident surface in the silicon (Si) layer in which the photoelectric conversion devices 113A and 113E are formed is increased for some reason in the case where the height of the on-chip lens 111 in the optical axis direction is changed, there is a need to reduce the projecting length to prevent light from scattering.

Since the projecting length of the projection portion 115P has a correlation with the diameter of the focused spot S of the on-chip lens 111 as described above, the projecting length of the projection portion 115P can be determined depending on the diameter of the focused spot S of the on-chip lens 111.

For example, the inventors of the present technology have found, by performing detailed simulation, that when the projecting length of the projection portion 115P is represented by L1 and a length of a side of a pitch of the on-chip lens 111 is represented by L2, L1 is favorably within the range of one seventh to one fourth a length of L2.

Figure 23:
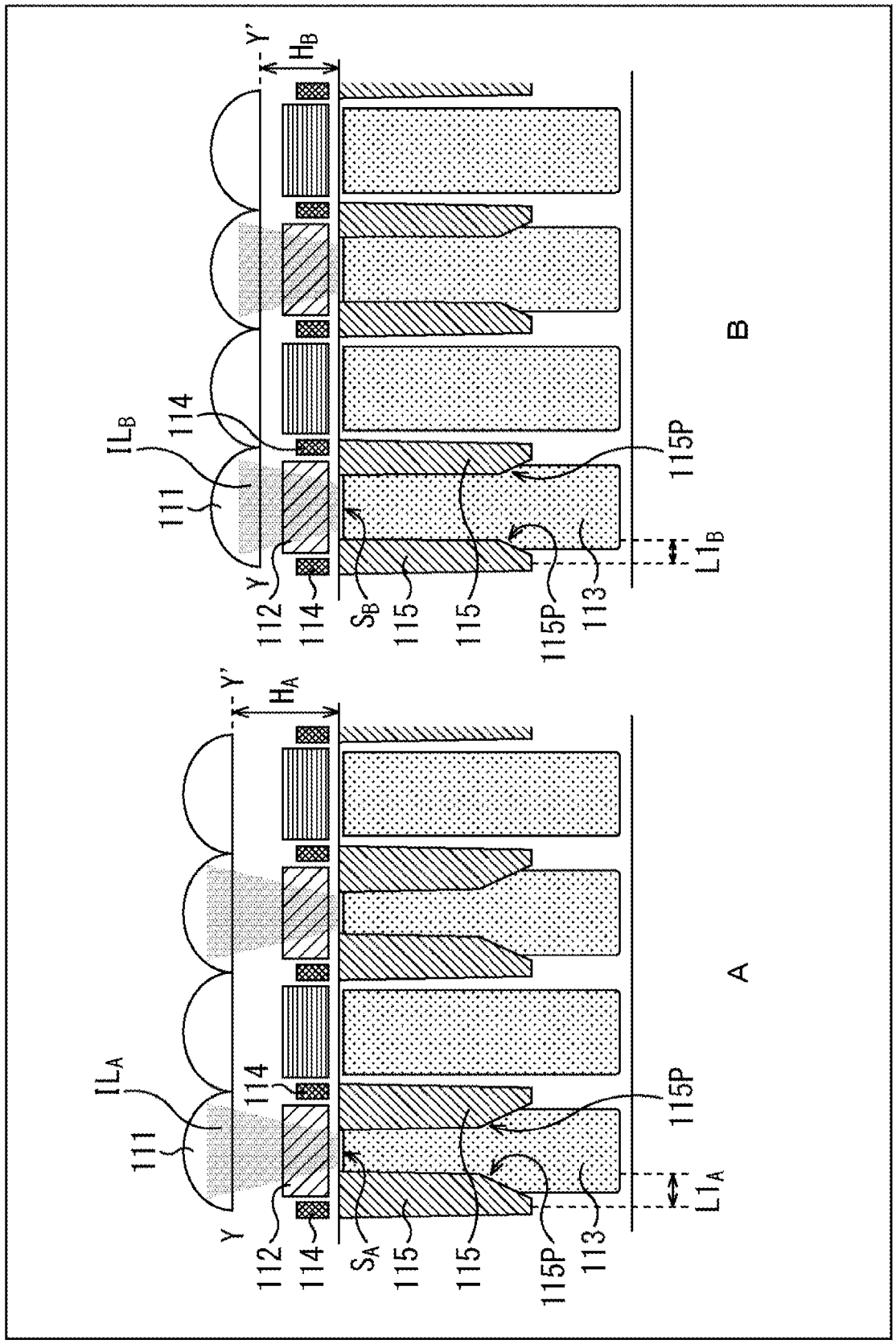
FIG. 23 is a diagram describing a relationship between a diameter of a spot of incident light and a length of a projection portion.

In FIG. 23, a structure in which the position of the on-chip lens 111 is high with respect to the light incident surface of the silicon layer is represented in a cross-sectional view shown in A of FIG. 23, and a structure in which the position of the on-chip lens 111 is low with respect to the light incident surface of the silicon layer is represented in a cross-sectional view shown in B of FIG. 23. Note that the cross-sectional view shown in FIG. 23 corresponds to the Y-Y' cross section in the plan view shown in FIG. 9.

In A of FIG. 23, the height of the on-chip lens 111 in the optical axis direction with respect to the light incident surface of the silicon layer is represented by $H_A$, and a focused spot on the light incident surface by an incident light $IL_A$ is represented by $S_A$. Meanwhile, in B of FIG. 23, the height of the on-chip lens III in the optical axis direction with respect to the light incident surface of the silicon layer is represented by $H_B$, and a focused spot on the light incident surface by an incident light $IL_B$ is represented by $S_B$.

When comparing the height of the on-chip lens 111 between A of FIG. 23 and B of FIG. 23, a relationship of $H_A > H_B$ is established. Then, since height of the on-chip lens 111 has such a relationship, when comparing the diameter of the focused spot between A of FIG. 23 and B of FIG. 23, a relationship of $S_A < S_B$ is established.

On the basis of such a relationship, a projecting length $L1_A$ of the projection portion 115P is adjusted depending on the diameter of the focused spot $S_A$ in A of FIG. 23, and a projecting length $L1_B$ of the projection portion 115P is adjusted depending on the diameter of the focused spot $S_B$ in B of FIG. 23. Note that since there is a need to reduce the projecting length to prevent light from scattering as the diameter of the focused spot is increased as described above, a relationship of $L1_A > L1_B$ is established in accordance with the relationship of $S_A < S_{13}$.

Note that although a method of determining the projecting length of the projection portion 115P of the inter-pixel separation unit 115 depending on the diameter of the focused spot S of the on-chip lens 111 has been described heretofore, also a length of a protruding part of the projection portion 114P of the inter-pixel light blocking unit 114 (projecting length) can be determined depending on the diameter of the focused spot S of the on-chip lens 111, similarly.

Further, the above-mentioned method of determining the projecting length of the projection portion 115P is an example, and the projecting length of the projection portion 115P may be determined by a method other than the method using the diameter of the focused spot S of the on-chip lens 111.

The fifth embodiment has been described heretofore.

(6) Sixth Embodiment (Structure in which Length of Projection Portion is Changed for Each Pixel)

Figure 24:
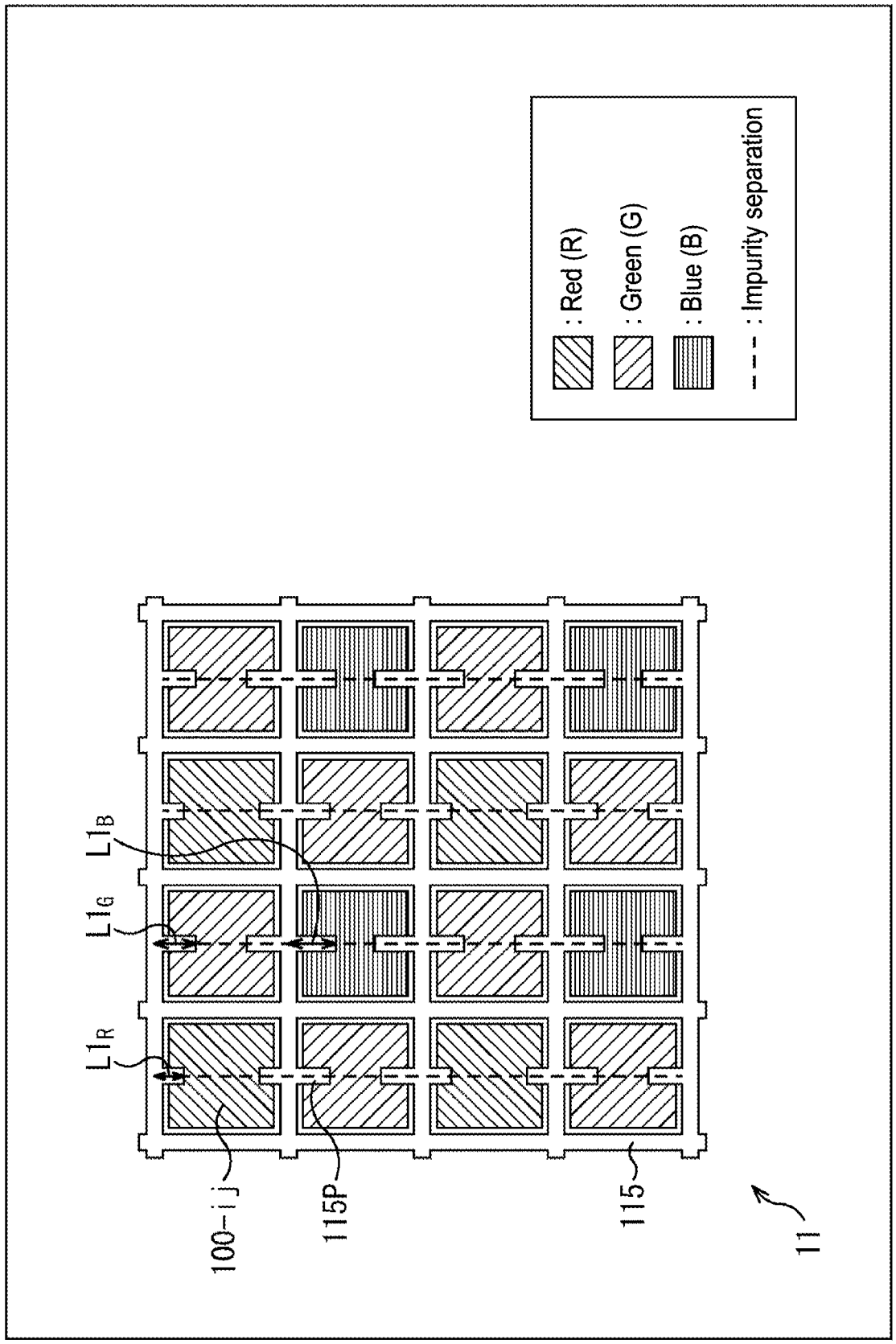
FIG. 24 is a plan view showing a structure of a pixel in a sixth embodiment.

FIG. 24 is a plan view showing a structure of the pixel 100 in a sixth embodiment.

In FIG. 24, arbitrary pixels 100 in four rows and four columns among the plurality of pixels 100 arranged in a Bayer array in the pixel array unit 11 are illustrated.

In all the pixels 100, the projection portion 115P is formed with respect to the inter-pixel separation unit 115.

For example, assuming the upper left pixel 100 in the pixel arrangement in four rows and four columns shown in FIG. 24 is the pixel 100-11, the pixels 100 in which the projection portion 115P is formed are the R pixels 100 (100-11, 100-13, 100-31, and 100-33), the G pixels 100 (100-12, 100-14, 100-21, 100-23, 100-32, 100-34, 100-41, and 100-43), and the B pixels 100 (100-22, 100-24, 100-42, and 100-44).

Note that in FIG. 24, the projecting length of the projection portion 115P differs for each color pixel of the R pixel 100, the G pixel 100, and the B pixel 100. Specifically, in FIG. 24, the projecting length of the projection portion 115P formed in the R pixel 100 is shorter than the projecting length of the projection portion 115P formed in the G pixel 100 while the projecting length of the projection portion 115P formed in the B pixel 100 is longer than the projecting length of the projection portion 115P formed in the G pixel 100.

Specifically, when the projecting length of the projection portion 115P of the R pixel 100 is represented by $L1_R$, the projecting length of the projection portion 115P of the G pixel 100 is represented by $L1_G$, and the projecting length of the projection portion 115P of the B pixel 100 is represented by $L1_B$, a relationship of $L1_B > L1_G > L1_R$ is established.

For example, since the red (R) wavelength is longer than the green (G) or blue (B) wavelength, scattering of light is highly likely to occur in the R pixel 100 as compared with the G pixel 100 or the B pixel 100. In this regard, countermeasures that make the projecting length of the projection portion 115P of the R pixel 100 shorter than that of the G pixel 100 or the B pixel 100 can be considered.

Note that although the case where the projecting length of the projection portion 115P of the inter-pixel separation unit 115 is changed for each pixel 100 has been described, also a length of a protruding part (projecting length) of the projection portion 114P of the inter-pixel light blocking unit 114 may be changed for each pixel 100, similarly.

Further, although the case where the projecting length of the projection portion 115P in all the R pixel 100, the G pixel 100, and the B pixel 100 is changed has been described above, for example, a combination of the pixels 100 in which the projecting length of the projection portion 115P is changed can be arbitrarily determined, e.g., the projecting lengths of the projection portions 115P of the G pixel 100 and the B pixel 100 can be the same and only the projecting length of the projection portion 115P of the R pixel 100 can be reduced. Further, the projecting lengths of the projection portions 115P of not only the pixels 100 of different colors but also of the pixels 100 of the same color may be changed.

The sixth embodiment has been described heretofore.

(7) Seventh Embodiment (Structure in which On-Chip Lens Having Elliptical Shape in Row Direction is Used)

Figure 25:
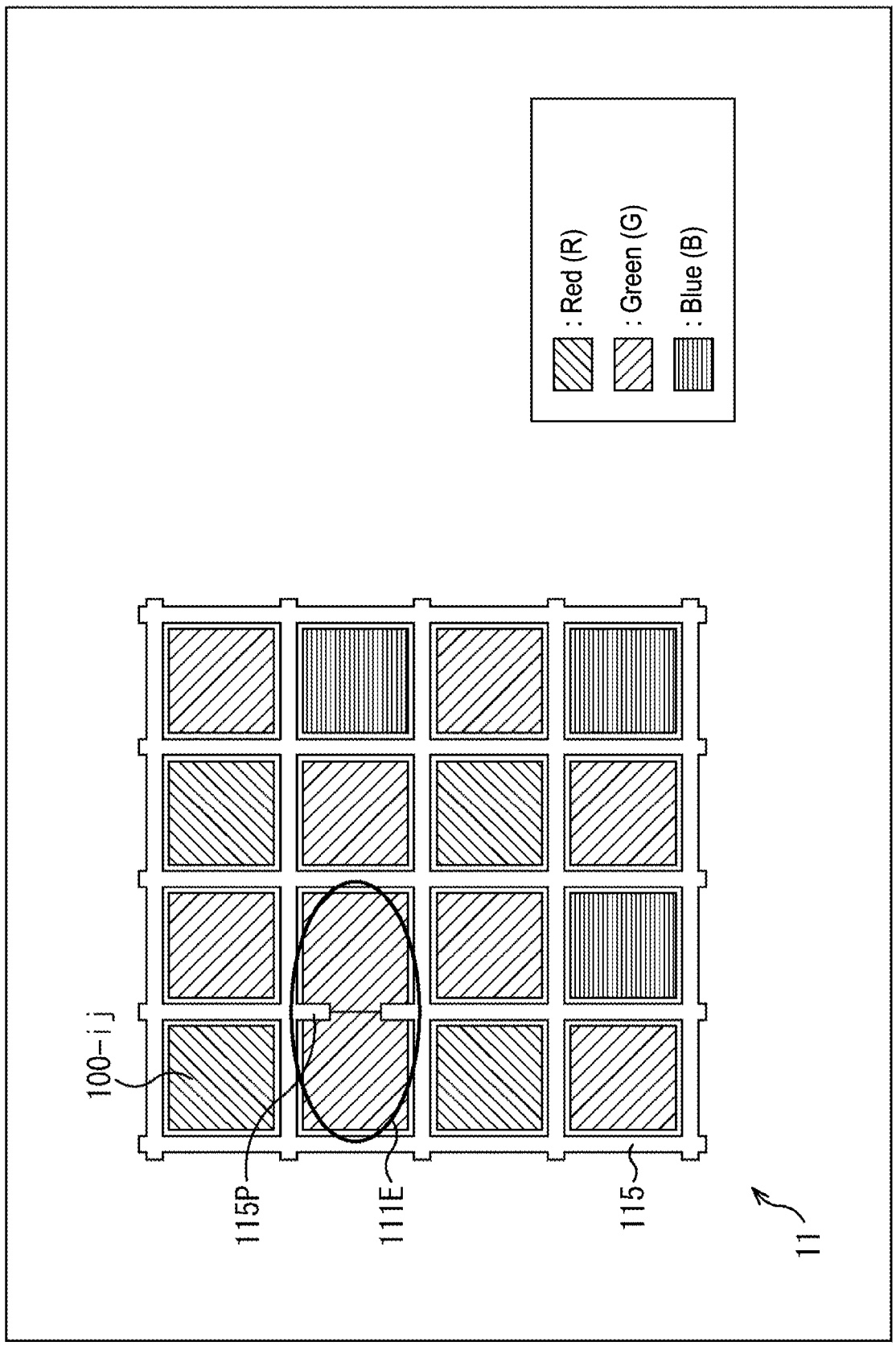
FIG. 25 is a plan view showing a structure of a pixel in a seventh embodiment.

FIG. 25 is a plan view showing a structure of the pixel 100 in a seventh embodiment.

In FIG. 25, arbitrary pixels 100 in four rows and four columns among the plurality of pixels 100 two-dimensionally arranged in the pixel array unit 11 are illustrated. Note that in the pixel arrangement in four rows and four columns shown in FIG. 25, each of the pixels 100 has a structure including one photoelectric conversion device 113. Specifically, in FIG. 25, each of the pixels 100 has not the 2PD structure but, so to speak, a 1PD structure.

For example, assuming that the upper left pixel 100 in the pixel arrangement in four rows and four columns shown in FIG. 25 is the pixel 100-11, an elliptical on-chip lens 111E is formed with respect to the G pixel 100-21 and the G pixel 100-22 arranged in the same row. Note that although not shown, in the pixels 100 other than the G pixel 100-21 and the G pixel 100-22, one photoelectric conversion device 113 is formed with respect to one on-chip lens 111.

Specifically, a structure in which the photoelectric conversion device 113 of the G pixel 100-21 and the photoelectric conversion device 113 of the G pixel 100-22 are formed with respect to one on-chip lens 111E is provided. Then, phase difference detection is performed by using outputs of the photoelectric conversion device 113 of the G pixel 100-21 and the photoelectric conversion device 113 of the G pixel 100-22 arranged in the same row.

Further, in this example, the projection portion 115P formed with respect to the inter-pixel separation unit 115 is formed between the G pixel 100-21 and the G pixel 100-22 while the elliptical on-chip lens 111E has a structure covering the G pixel 100-21 and the G pixel 100-22 in the row direction.

Also in this case, a part of the inter-pixel separation unit 115 protrudes, in a projecting shape, toward the center of the area including the G pixel 100-21 and the G pixel 100-22 to form the projection portion 115P at two places. Further, the projecting length of the projection portion 115P can be determined depending on the diameter of the focused spot of the elliptical on-chip lens 111E, for example.

(Structure Using On-Chip Lens Having Elliptical Shape in Column Direction)

Figure 26:
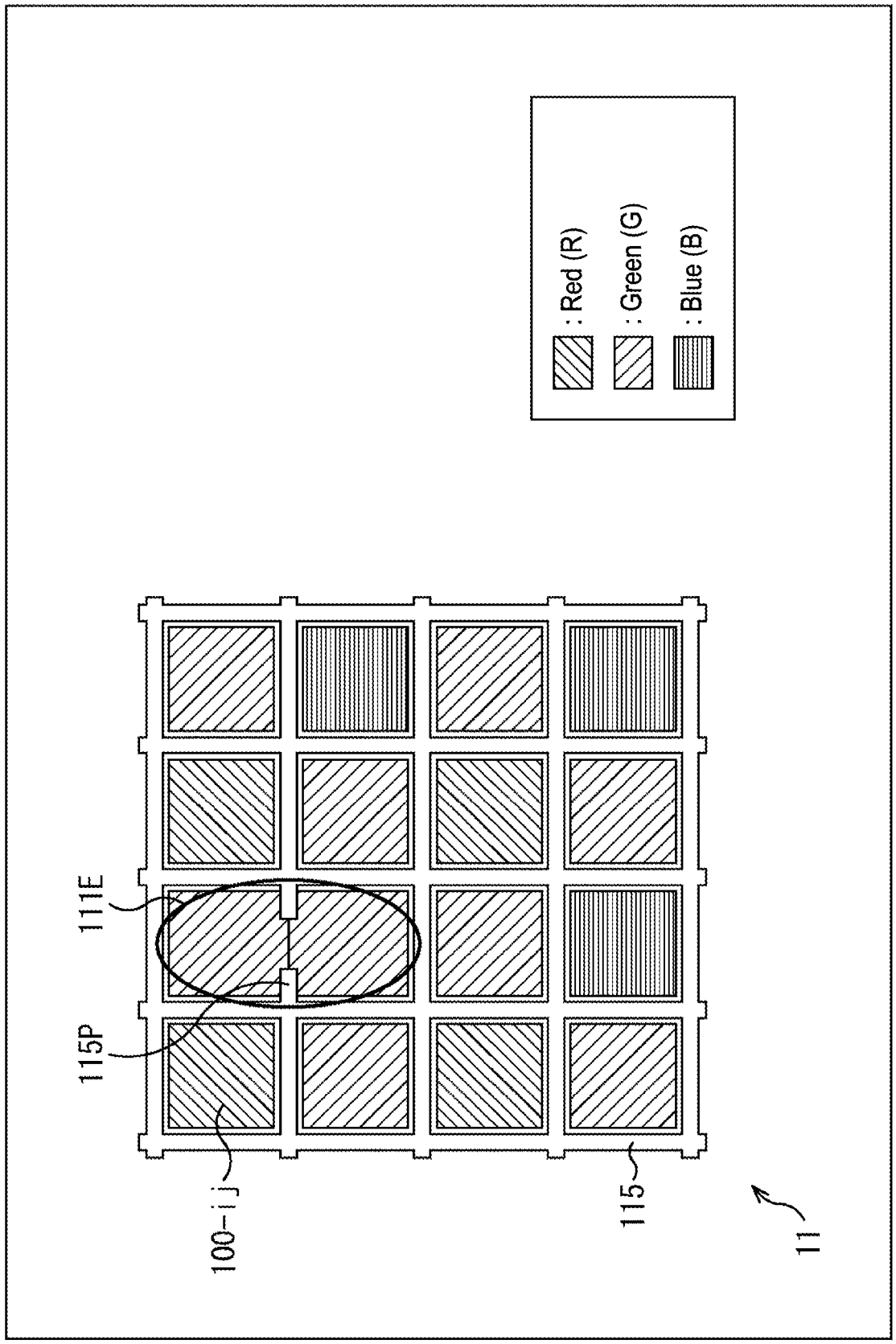
FIG. 26 is a plan view showing a modified example of the structure of the pixel in the seventh embodiment.

FIG. 26 is a plan view showing a modified example of the structure of the pixel 100 in the seventh embodiment.

In FIG. 26, arbitrary pixels 100 in four rows and four columns among the plurality of pixels 100 two-dimensionally arranged in the pixel array unit 11 are illustrated. Note that the pixels 100 in the pixel arrangement in four rows and four columns shown in FIG. 26 each have the 1PD structure, similarly to the above-mentioned pixels 100 shown in FIG. 25.

For example, assuming that the upper left pixel 100 in the pixel arrangement in four rows and four columns shown in FIG. 26 is the pixel 100-11, the elliptical on-chip lens 111E is formed with respect to the G pixel 100-12 and the G pixel 100-22 arranged in the same column. Note that although not shown, in the pixels 100 other than the G pixel 100-12 and the G pixel 100-22, one photoelectric conversion device 113 is formed with respect to one on-chip lens 111.

Specifically, a structure in which the photoelectric conversion device 113 of the G pixel 100-12 and the photoelectric conversion device 113 of the G pixel 100-22 are formed with respect to one on-chip lens 111E is provided. Then, phase difference detection is performed by using outputs of the photoelectric conversion device 113 of the G pixel 100-12 and the photoelectric conversion device 113 of the G pixel 100-22 arranged in the same column.

Further, in this example, the projection portion 115P formed with respect to the inter-pixel separation unit 115 is formed between the G pixel 100-12 and the G pixel 100-22 while the elliptical on-chip lens 111E has a structure covering the G pixel 100-12 and the G pixel 100-22 in the column direction.

Also in this case, a part of the inter-pixel separation unit 115 protrudes, in a projecting shape, toward the center of the area including the G pixel 100-12 and the G pixel 100-22 to form the projection portion 115P at two places. Further, the projecting length of the projection portion 115P can be determined depending on the diameter of the focused spot of the elliptical on-chip lens 111E, for example.

Note that although the case where the projection portion 115P of the inter-pixel separation unit 115 is formed with respect to the two pixels 100 arranged in the same row or the same column for each elliptical on-chip lens 111E has been described, the projection portion 114P of the inter-pixel light blocking unit 114 may be formed.

Further, although the case where the two G pixels 100 are arranged with respect to the elliptical on-chip lens 111E are arranged has been described above, instead of the G pixels 100, the R pixels 100 or the B pixels 100 may be arranged with respect to the elliptical on-chip lens 111E.

The seventh embodiment has been described heretofore.

(8) Eight Embodiment (Structure in which Plurality of Pixels are Arranged with Respect to Single On-Chip Lens)

Figure 27:
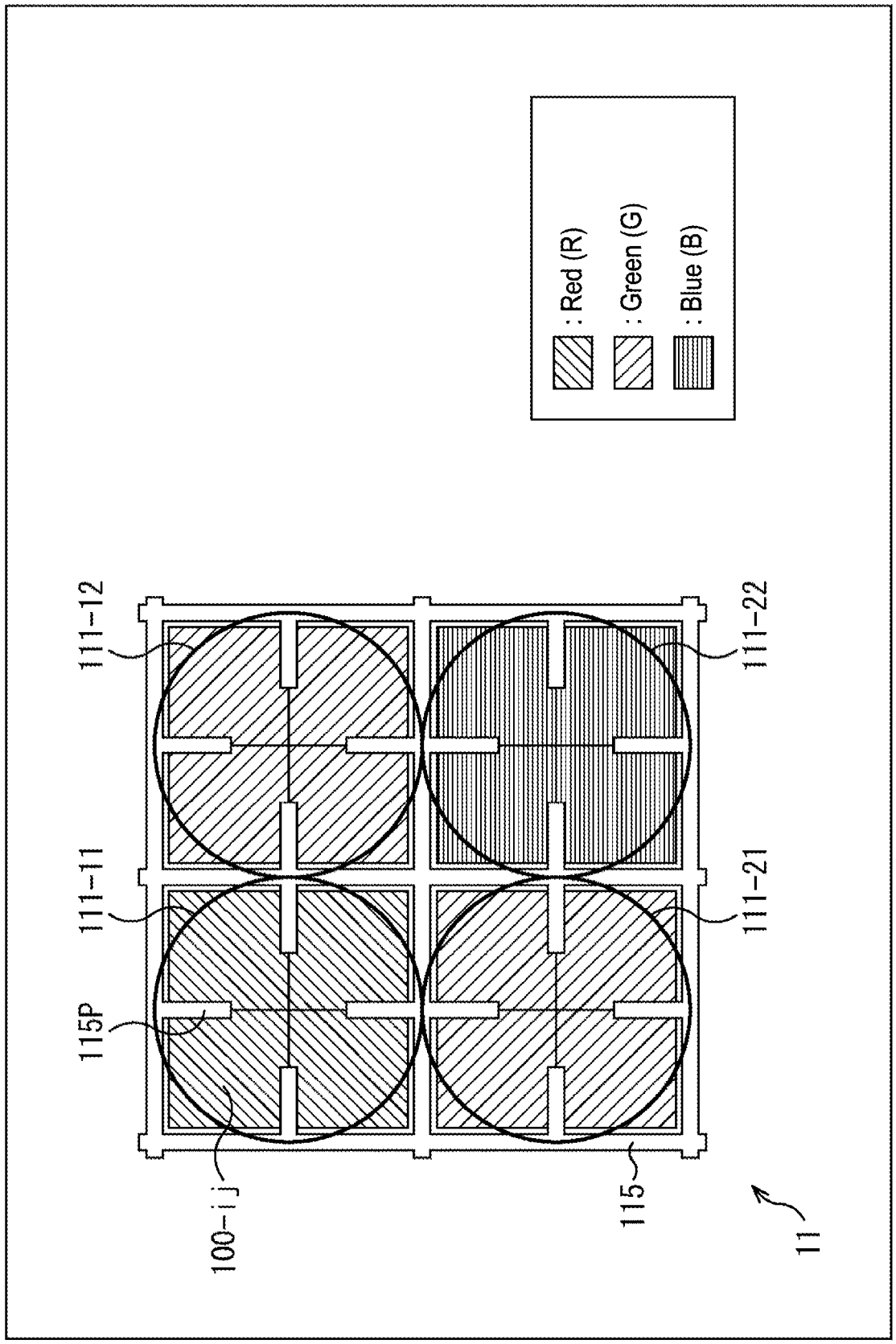
FIG. 27 is a plan view showing a structure of a pixel in an eighth embodiment.

FIG. 27 is a plan view showing a structure of the pixel 100 in an eighth embodiment.

In FIG. 27, arbitrary pixels 100 in four rows and four columns among the plurality of pixels 100 two-dimensionally arranged in the pixel array unit 11 are illustrated. Note that the pixels 100 in the pixel arrangement in four rows and four columns shown in FIG. 27 each have the 1PD structure, similarly to the above-mentioned pixels 100 shown in FIG. 25 and FIG. 26.

In the pixel arrangement in four rows and four columns shown in FIG. 27, the circular on-chip lens 111 is formed for each four pixels 100 of the same color.

For example, assuming that the upper left pixel 100 in the pixel arrangement in four rows and four columns shown in FIG. 27 is the pixel 100-11, one on-chip lens 111-11 is formed with respect to the four R pixels 100 of the R pixel 100-11, the R pixel 100-12, the R pixel 100-21, and the R pixel 100-22.

Further, a part of the inter-pixel separation unit 115 protrudes, in a projecting shape, toward the center of the area including the four R pixels 100 to form the projection portion 115P at four places while the circular on-chip lens 111-11 has a structure covering the four R pixels 100 (100-11, 100-12, 100-21, and 100-22).

In the pixel arrangement shown in FIG. 27, one on-chip lens 111-12 is formed with respect to the four G pixels 100 of the G pixel 100-13, the G pixel 100-14, the G pixel 100-23, and the G pixel 100-24. Further, a part of the inter-pixel separation unit 115 protrudes, in a projecting shape, toward the center of the area including the four G pixels 100 to form the projection portion 115P at four places while the circular on-chip lens 111-12 has a structure covering the four G pixels 100 (100-13, 100-14, 100-23, and 100-24).

Further, in the pixel arrangement shown in FIG. 27, one on-chip lens 111-21 is formed with respect to the four G pixels 100 of the G pixel 100-31, the G pixel 100-32, the G pixel 100-41, and the G pixel 100-42. Further, a part of the inter-pixel separation unit 115 protrudes, in a projecting shape, toward the center of the area including the four G pixels 100 to form the projection portion 115P at four places while the circular on-chip lens 111-21 has a structure covering the four G pixels 100 (100-31, 100-32, 100-41, and 100-42).

Further, in the pixel arrangement shown in FIG. 27, one on-chip lens 111-22 is formed with respect to the four B pixels 100 of the B pixel 100-33, the B pixel 100-34, the B pixel 100-43, and the B pixel 100-44. Further, a part of the inter-pixel separation unit 115 protrudes, in a projecting shape, toward the center of the area including the four B pixels 100 to form the projection portion 115P at four places while the circular on-chip lens 111-22 has a structure covering the four B pixels 100 (100-33, 100-34, 100-43, and 100-44).

As described above, in the pixel arrangement shown in FIG. 27, a structure in which the photoelectric conversion devices 113 of the four pixels 100 are formed with respect to one on-chip lens 111 and one color filter 112 is provided. Then, in this example, phase difference detection is performed by using outputs of the photoelectric conversion devices 113 of the four pixels 100 sharing the one on-chip lens 111 and the one color filter 112. Since the pixels 100 in two rows and two columns are arranged with respect to the one on-chip lens 111 in this example, for example, it is possible to acquire information regarding phase difference detection in both directions of the row direction and the column direction.

Note that although the case where the projection portion 115P of the inter-pixel separation unit 115 is formed with respect to the pixels 100 in two rows and two columns arranged for each on-chip lens 111 has been described, the projection portion 114P of the inter-pixel light blocking unit 114 may be formed.

The eighth embodiment has been described heretofore.

(9) Ninth Embodiment (Plane Layout of Pixel)

Figure 28:
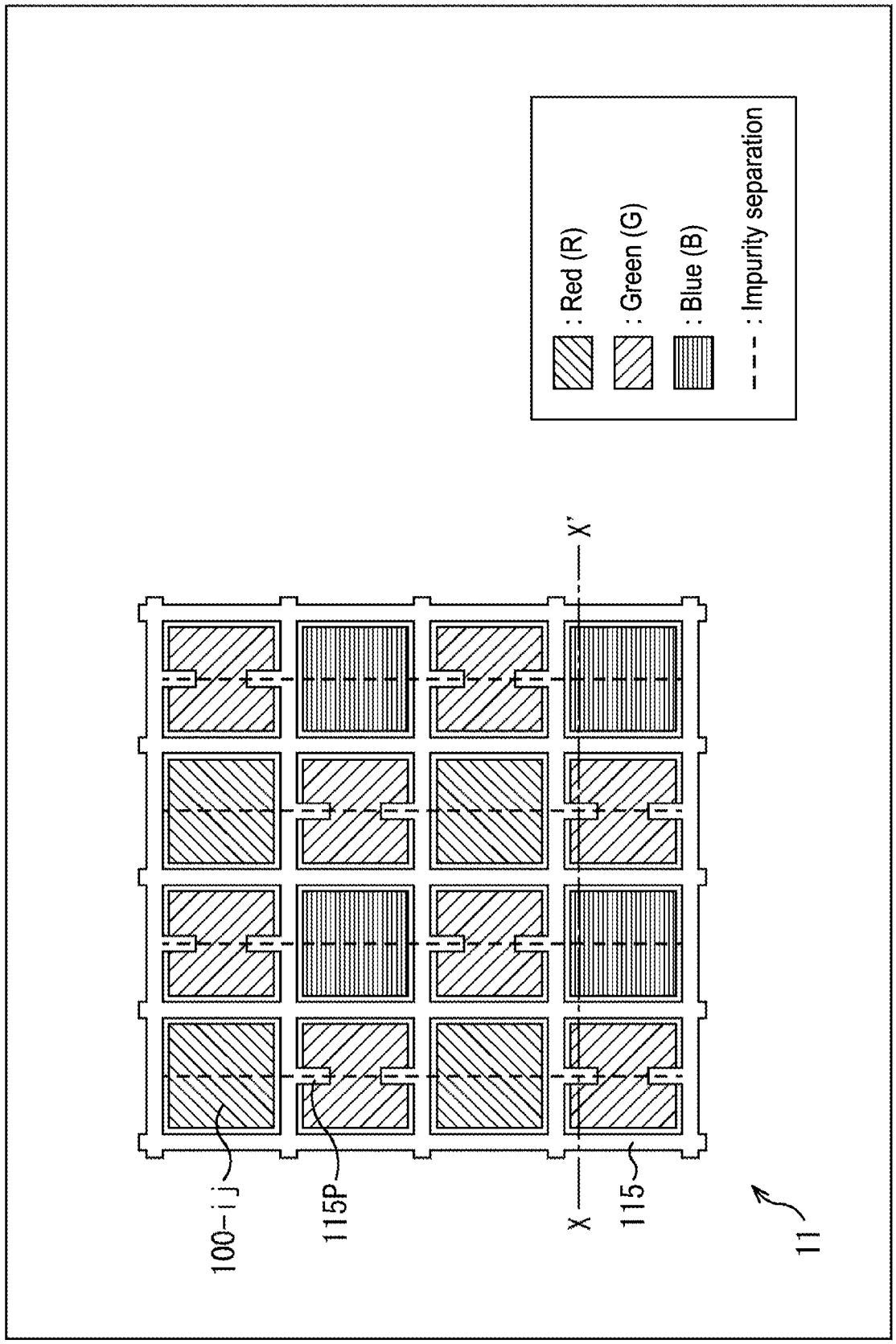
FIG. 28 is a diagram showing a plane layout of a pixel in a ninth embodiment.

FIG. 28 is a diagram showing a plane layout of the pixel 100 in a ninth embodiment.

In FIG. 28, arbitrary pixels 100 in four rows and four columns among the plurality of pixels 100 arranged in a Bayer array in the pixel array unit 11 are illustrated. Note that the pixels 100 in the pixel arrangement in four rows and four columns shown in FIG. 28 each have the 2PD structure, similarly to the pixels 100 shown in the above-mentioned FIG. 9 or the like.

Figure 29:
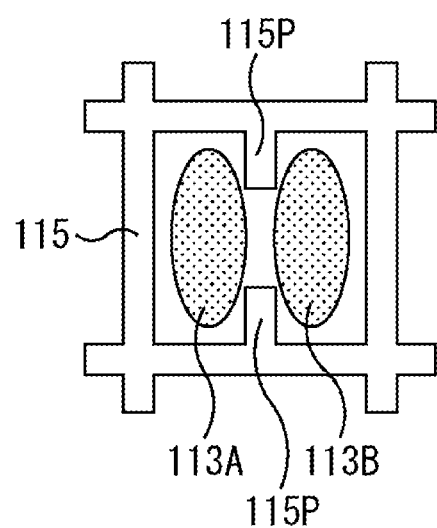
FIG. 29 is a diagram describing an N-type potential in a silicon layer of the pixel in the ninth embodiment.

Further, in FIG. 28, in the G pixels 100 among the pixels 100 in the pixel arrangement in four rows and four columns, a part of the inter-pixel separation unit 115 protrudes toward the center of the G pixel 100 in a projecting shape to form the projection portion 115P, similarly to the above-mentioned FIG. 9 or the like. More specifically, as shown in FIG. 29, the projection portion 115P of the inter-pixel separation unit 115 is formed in the areas corresponding to the P-type areas A1 and A2 in which the contribution of isolation between the photoelectric conversion devices is low in the above-mentioned FIG. 8.

Figure 30:
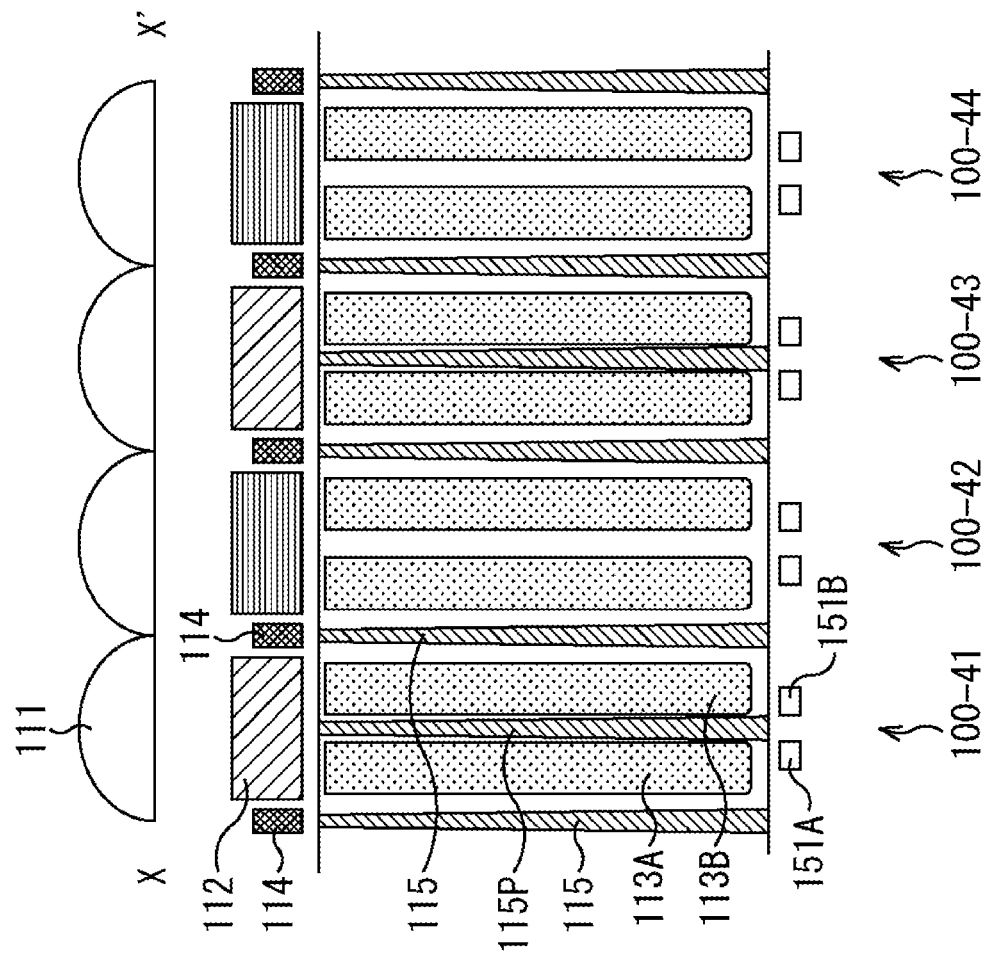
FIG. 30 is a cross-sectional view showing a structure of the pixel in the ninth embodiment.

An X-X' cross section in the plan view shown in FIG. 28 can be represented by a cross-sectional view shown in FIG. 30. Note that assuming that the upper left pixel 100 in the pixel arrangement in four rows and four columns is the pixel 100-11, the pixels 100 shown in the X-X' cross section are four pixels of the G pixel 100-41, the B pixel 100-42, the G pixel 100-43, and the B pixel 100-44.

The structure shown in the cross-sectional view of FIG. 30 is basically similar to that in the above-mentioned cross-sectional view of FIG. 11. However, the method (manufacturing process) of processing the inter-pixel separation unit 115 differs.

Specifically, in the above-mentioned FIG. 11, the inter-pixel separation unit 115 is formed by forming a trench from the surface on the light incident side (light incident surface) in a silicon layer by using a DTI technology and embedding the material such as an oxidized film and a metal in the trench. Meanwhile, in FIG. 30, the inter-pixel separation unit 115 is formed by forming a trench from the surface opposite to the light incident side (surface on the side of the transfer gates 151A and 151B) in a silicon layer and embedding the material such as an oxidized film and a metal in the trench.

The ninth embodiment has been described heretofore.

4. Circuit Configuration of Pixel

Figure 31:
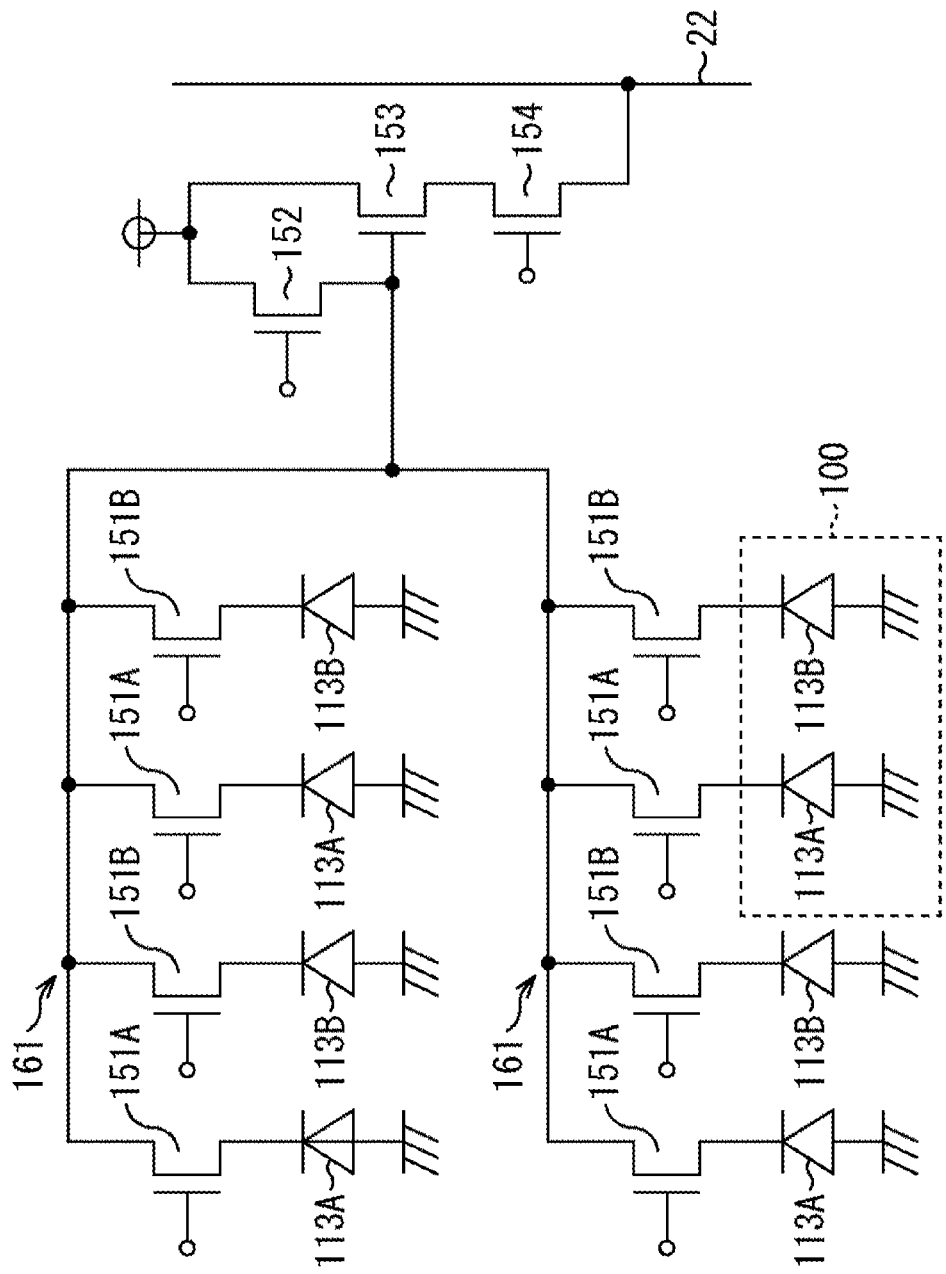
FIG. 31 is a diagram showing a circuit configuration of a pixel in each embodiment.

FIG. 31 is a diagram showing a circuit configuration of the pixel 100 in each embodiment.

In FIG. 31, the respective two pixels 100 provided at the upper stage and the lower stage in FIG. 31 share a floating diffusion area (FD: Floating Diffusion). Note that each of the pixels 100 has the 2PD structure including the photoelectric conversion device 113A and the photoelectric conversion device 113B, and one on-chip lens 111 and one color filter 112 are shared. Further, transfer transistors 151A and 151B respectively correspond to the transfer gates 151A and 151B.

An anode of the photodiode as the photoelectric conversion device 113A is grounded, and a cathode of the photodiode is connected to a source of the transfer transistor 151A. A drain of the transfer transistor 151A is connected to a source of a reset transistor 152 and a gate of an amplification transistor 153.

An anode of the photodiode as the photoelectric conversion device 113B is grounded, and a cathode of the photodiode is connected to a source of the transfer transistor 151B. A drain of the transfer transistor 151B is connected to the source of the reset transistor 152 and the gate of the amplification transistor 153.

The connection point between the drains of the transfer transistors 151A and 151B of the two pixels at the upper stage, the source of the reset transistor 152, and the gate of the amplification transistor 153 forms a floating diffusion area (FD) 161. Similarly, the connection point between the drains of the transfer transistors 151A and 151B of the two pixels at the lower stage, the source of the reset transistor 152, and the gate of the amplification transistor 153 forms a floating diffusion area (FD) 161.

A drain of the reset transistor 152 and a source of the amplification transistor 153 are connected to a power source. A drain of the amplification transistor 153 is connected to a source of a selection transistor 154, and a drain of the selection transistor 154 is connected to the vertical signal line 22.

Gates of the transfer transistors 151A and 151B, a gate of the reset transistor 152, and a gate of the selection transistor 154 are connected to the vertical drive circuit 12 (FIG. 1) via the pixel drive line 21, and a pulse as a drive signal is supplied to each gate of the transistors.

Next, the basic function of the pixel 100 shown in FIG. 31 will be described.

The reset transistor 152 turns on/off discharging of charges accumulated in the floating diffusion area (FD) 161 in accordance with a drive signal RST input to the gate of the reset transistor 152.

The photoelectric conversion device 113A performs photoelectric conversion on incident light, generates charges corresponding to the amount of the incident light, and accumulates the charges. The transfer transistor 151A turns on/off transferring of the charges from the photoelectric conversion device 113A to the floating diffusion area (FD) 161 in accordance with a drive signal TRG input to the gate of the transfer transistor 151A.

The photoelectric conversion device 113B performs photoelectric conversion on incident light, generates charges corresponding to the amount of the incident light, and accumulates the charges. The transfer transistor 151B turns on/off transferring of the charges from the photoelectric conversion device 113B to the floating diffusion area (FD) 161 in accordance with a drive signal TRG input to the gate of the transfer transistor 151B.

The floating diffusion area (FD) 161 has a function of accumulating the charges transferred from the photoelectric conversion device 113A via the transfer transistor 151A or the charges transferred from the photoelectric conversion device 113B via the transfer transistor 151B. The potential of the floating diffusion area (FD) 161 is modulated depending on the amount of the accumulated charges.

The amplification transistor 153 operates as an amplifier that regards the change in the potential of the floating diffusion area (FD) 161 connected to the gate of the amplification transistor 153 as an input signal, and the output signal voltage is output to the vertical signal line 22 via the selection transistor 154.

The selection transistor 154 turns on/off outputting of a voltage signal from the amplification transistor 153 to the vertical signal line 22 in accordance with a drive signal SEL input to the gate of the selection transistor 154.

As described above, the pixel 100 having the 2PD structure is driven in accordance with the drive signals (TRG, RST, and SEL) supplied from the vertical drive circuit 12 (FIG. 1).

5. Modified Example (Example of Combination of Embodiments)

It goes without saying that the above-mentioned nine embodiments are each established as a single embodiment. An embodiment in which all or a part of the embodiments are combined in a possible range may be employed.

For example, by combining the above-mentioned second embodiment and the above-mentioned seventh embodiment, the projection portion 114P may be formed by the inter-pixel light blocking unit 114 in the plurality of pixels 100 (pixels 100 having the 1PD structure) in a configuration in which the plurality of pixels 100 are arranged in the row direction or the column direction with respect to the on-chip lens 111E having an elliptical shape in the row direction or the column direction.

Further, for example, by combining the above-mentioned third embodiment and the above-mentioned seventh embodiment, the projection portion 114P may be formed by the inter-pixel light blocking unit 114 as well as the projection portion 115P may be formed by the inter-pixel separation unit 115 in the plurality of pixels 100 (pixels 100 having the 1PD structure) in a configuration in which the plurality of pixels 100 are arranged in the row direction or the column direction with respect to the on-chip lens 111E having an elliptical shape in the row direction or the column direction.

For example, by combining the above-mentioned second embodiment and the above-mentioned eighth embodiment, the projection portion 114P may be formed by the inter-pixel light blocking unit 114 in the pixels 100 (pixels 100 having the 1PD structure) in two rows and two columns in a configuration in which the pixels 100 in two rows and two columns are arranged with respect to one on-chip lens 111.

Further, for example, by combining the above-mentioned third embodiment and the above-mentioned eighth embodiment, the projection portion 114P may be formed by the inter-pixel light blocking unit 114 as well as the projection portion 115P may be formed by the inter-pixel separation unit 115 in the pixels 100 (pixels 100 having the 1PD structure) in two rows and two columns in a configuration in which the pixels 100 in two rows and two columns are arranged with respect to one on-chip lens 111.

(Another Example of Solid-state Imaging Device)

Further, although a case where an embodiment of the present technology is applied to the CMOS image sensor in which the pixels are two-dimensionally arranged has been described as an example in the above-mentioned embodiments, the present technology is not limited to application to the CMOS image sensor. That is, the present technology is applicable to all X-Y address type solid-state imaging devices in which the pixels are two-dimensionally arranged.

Further, the present technology is not limited to application to a solid-state imaging device that detects distribution of the amount of incident light of visible light and images the distribution as an image, and is applicable to all solid-state imaging devices that image distribution of the incident amount of infrared rays, X-rays, particles, or the like, as an image. Further, although the pixel 100 having the 2PD structure in which two photoelectric conversion devices 113 are formed with respect to one on-chip lens 111 has been mainly described in the above-mentioned embodiments, the present technology is applicable to the pixel 100 in which a plurality of photoelectric conversion devices 113 are formed with respect to one on-chip lens 111, similarly.

6. Configuration of Electronic Apparatus

Figure 32:
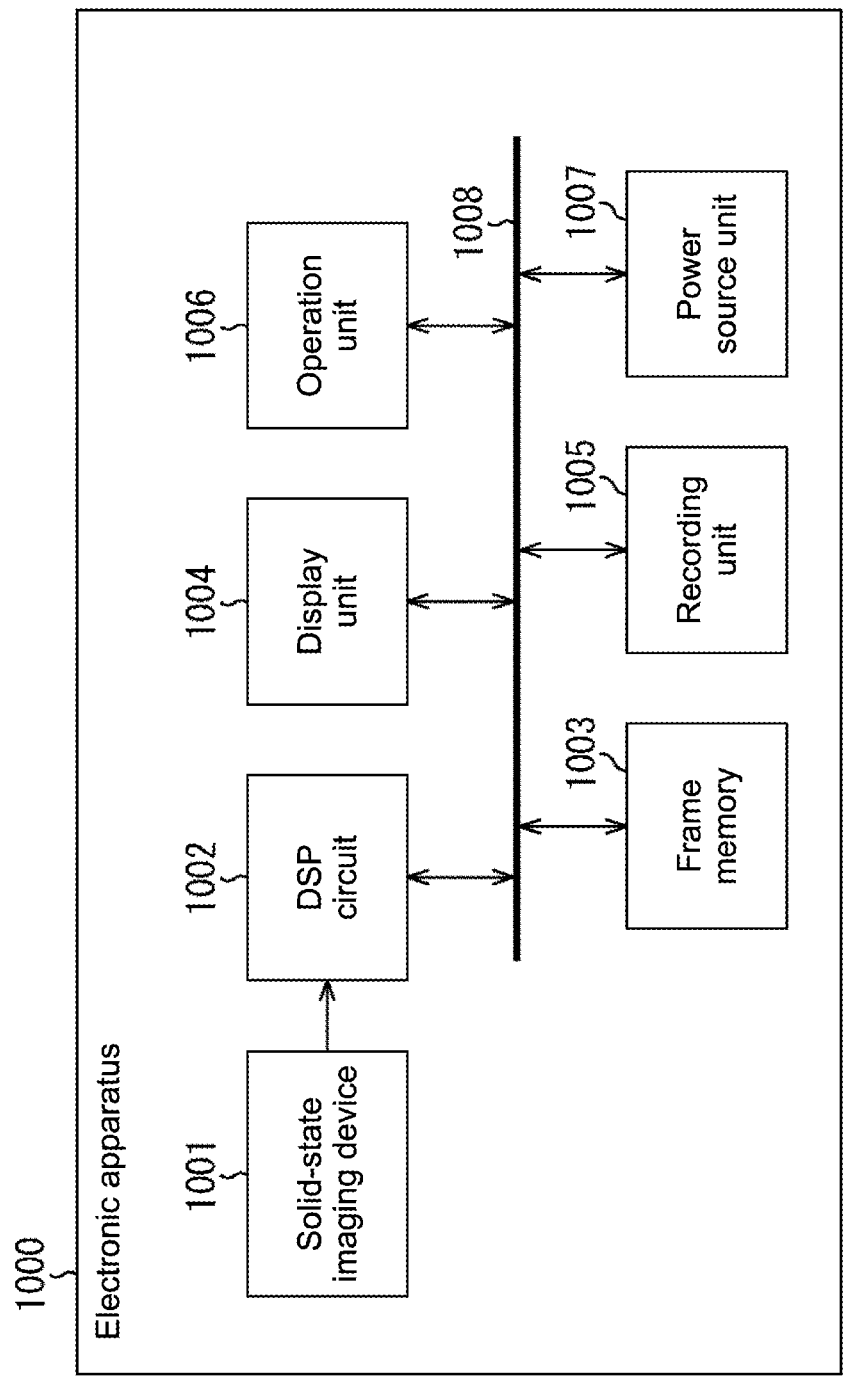
FIG. 32 is a block diagram showing a configuration example of an electronic apparatus including a solid-state imaging device to which an embodiment of the present technology is applied.

FIG. 32 is a block diagram showing a configuration example an electronic apparatus including a solid-state imaging device to which an embodiment of the present technology is applied.

An electronic apparatus 1000 is, for example, an electronic apparatus such as an imaging apparatus such as a digital still camera and a video camera, and a portable terminal apparatus such as a smartphone and a tablet terminal.

The electronic apparatus 1000 includes a solid-state imaging device 1001, a DSP circuit 1002, a frame memory 1003, a display unit 1004, a recording unit 1005, an operation unit 1006, and a power source unit 1007. Further, in the electronic apparatus 1000, the DSP circuit 1002, the frame memory 1003, the display unit 1004, the recording unit 1005, the operation unit 1006, and the power source unit 1007 are connected to each other via a bus line 1008.

The solid-state imaging device 1001 corresponds to the above-mentioned CMOS image sensor 10 (FIG. 1), and the pixels 100 shown in the above-mentioned first to ninth embodiments can be employed as the pixels 100 two-dimensionally arranged in the pixel array unit 11 (FIG. 1). Accordingly, in the electronic apparatus 1000, it is possible to detect phase difference on the basis of information acquired from the pixels 100 (image surface phase difference pixels) shown in the above-mentioned first to ninth embodiments, and set the focus.

The DSP circuit 1002 is a camera signal processing circuit that processes a signal supplied from the solid-state imaging device 1001. The DSP circuit 1002 outputs image data acquired by processing the signal from the solid-state imaging device 1001. The frame memory 1003 temporarily stores, in units of frames, the image data processed by the DSP circuit 1002.

The display unit 1004 includes, for example, a panel display apparatus such as a liquid crystal panel and an organic EL (Electro Luminescence) panel, and displays a moving image or a still image imaged by the solid-state imaging device 1001. The recording unit 1005 stores the image data of the moving image or still image imaged by the solid-state imaging device 1001 in a recording medium such as a semiconductor memory and a hard disk.

The operation unit 1006 outputs operation commands for various functions of the electronic apparatus 1000 in accordance with a user operation. The power source unit 1007 appropriately supplies various kinds of power sources as operation power sources for the DSP circuit 1002, the frame memory 1003, the display unit 1004, the recording unit 1005, and the operation unit 1006 to these supply targets.

The electronic apparatus 1000 is configured as described above. An embodiment of the present technology is applied to the solid-state imaging device 1001, as described above. Specifically, the CMOS image sensor 10 (FIG. 1) can be applied to the solid-state imaging device 1001. By applying an embodiment of the present technology to the solid-state imaging device 1001 and forming a projection portion by the inter-pixel light blocking unit 114 or the inter-pixel separation unit 115 in an area in which the contribution of isolation is low in the pixel 100, it is possible to improve the accuracy of phase difference detection while suppressing degradation of a picked-up image.

7. Usage Examples of Solid-state Imaging Device

Figure 33:
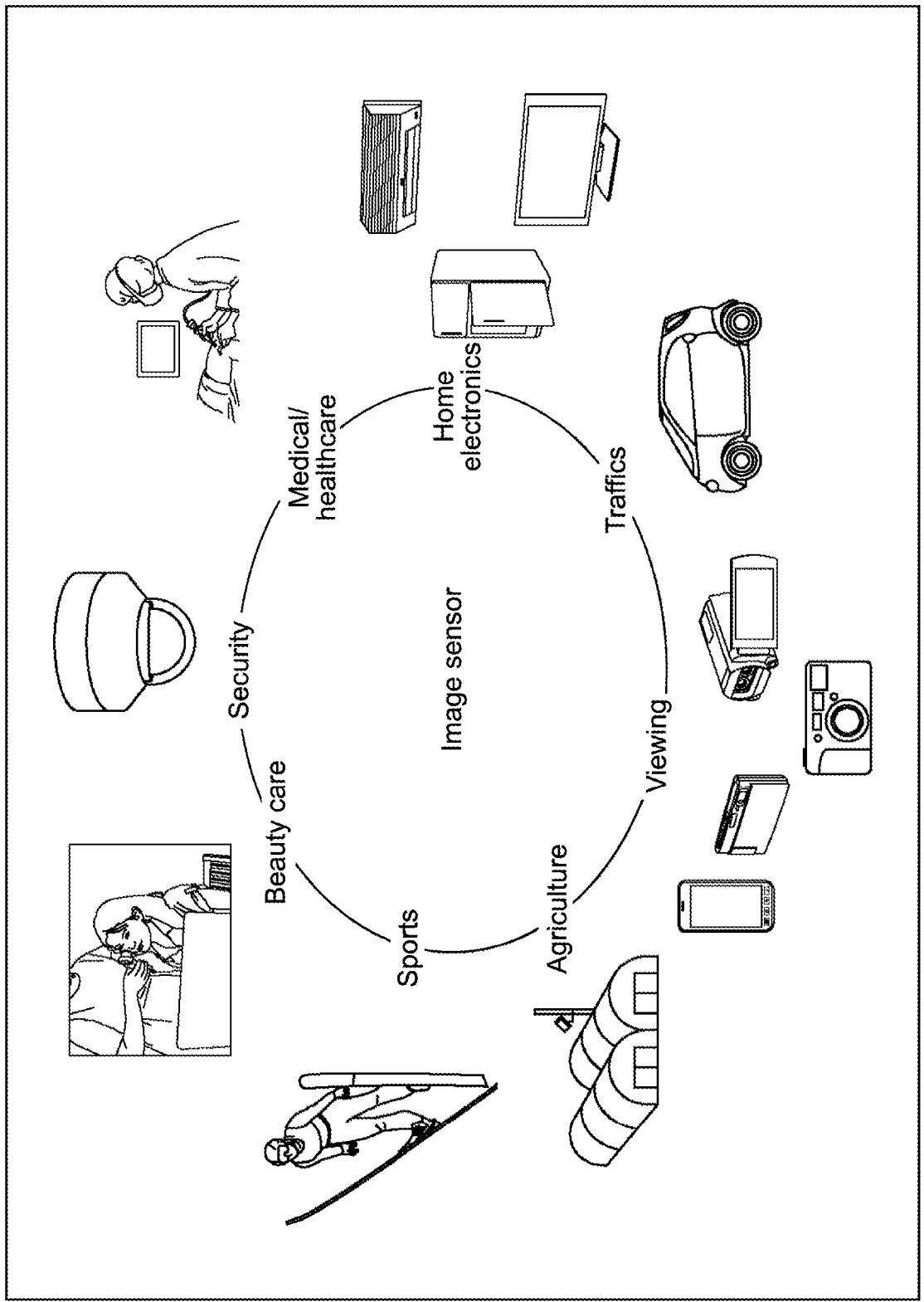
FIG. 33 is a diagram showing a usage example of a solid-state imaging device to which an embodiment of the present technology is applied.

FIG. 33 is a diagram showing usage examples of a solid-state imaging device to which an embodiment of the present technology is applied.

The CMOS image sensor 10 (FIG. 1) can be used in various cases of sensing light such as visible light, infrared light, ultraviolet light, and X-rays as follows, for example. That is, as shown in FIG. 33, the CMOS image sensor 10 can be used for not only an apparatus used in the appreciation field for photographing images to be viewed but also apparatuses used in the traffic field, the home electronics field, the medical and healthcare field, the security field, the beauty care field, the sports field, and the agriculture field, for example.

Specifically, in the appreciation field, the CMOS image sensor 10 can be used for an apparatus for photographing images to be viewed (e.g., the electronic apparatus 1000 shown in FIG. 32), such as a digital camera, a smartphone, and a camera-equipped mobile phone.

In the traffic field, the CMOS image sensor 10 can be used for an apparatus used for traffic purposes, such as a car-mounted sensor that photographs front/rear/periphery/inside of an automobile, a surveillance camera that monitors running vehicles and roads, and a distance measurement sensor that measures distances among vehicles, for safe driving including automatic stop, recognition of a driver condition, and the like.

In the home electronics field, the CMOS image sensor 10 can be used for an apparatus used in home electronics such as a television receiver, a refrigerator, and an air conditioner, for photographing gestures of users and executing apparatus operations according to the gestures. Further, in the medical and healthcare field, the CMOS image sensor 10 can be used for an apparatus used for medical and healthcare purposes, such as an endoscope and an apparatus that performs blood vessel photographing by receiving infrared light.

In the security field, the CMOS image sensor 10 can be used for an apparatus used for security purposes, such as a surveillance camera for crime-prevention purposes and a camera for person authentication purposes. Further, in the beauty care field, the CMOS image sensor 10 can be used for an apparatus used for beauty care purposes, such as a skin measurement apparatus that photographs skins and a microscope that photographs scalps.

In the sports field, the CMOS image sensor 10 can be used for an apparatus used for sports purposes, such as an action camera and a wearable camera for sports purposes. Further, in the agriculture field, the CMOS image sensor 10 can be used for an apparatus for agriculture purposes, such as a camera for monitoring states of fields and crops.

8. Configuration Example of Stacked-Type Solid-State Imaging Device to which Technology According to Present Disclosure can be Applied FIG. 34 is a diagram showing the outline of a configuration example of the stacked-type solid-state imaging device to which the technology according to the present disclosure can be applied.

Figure 34:
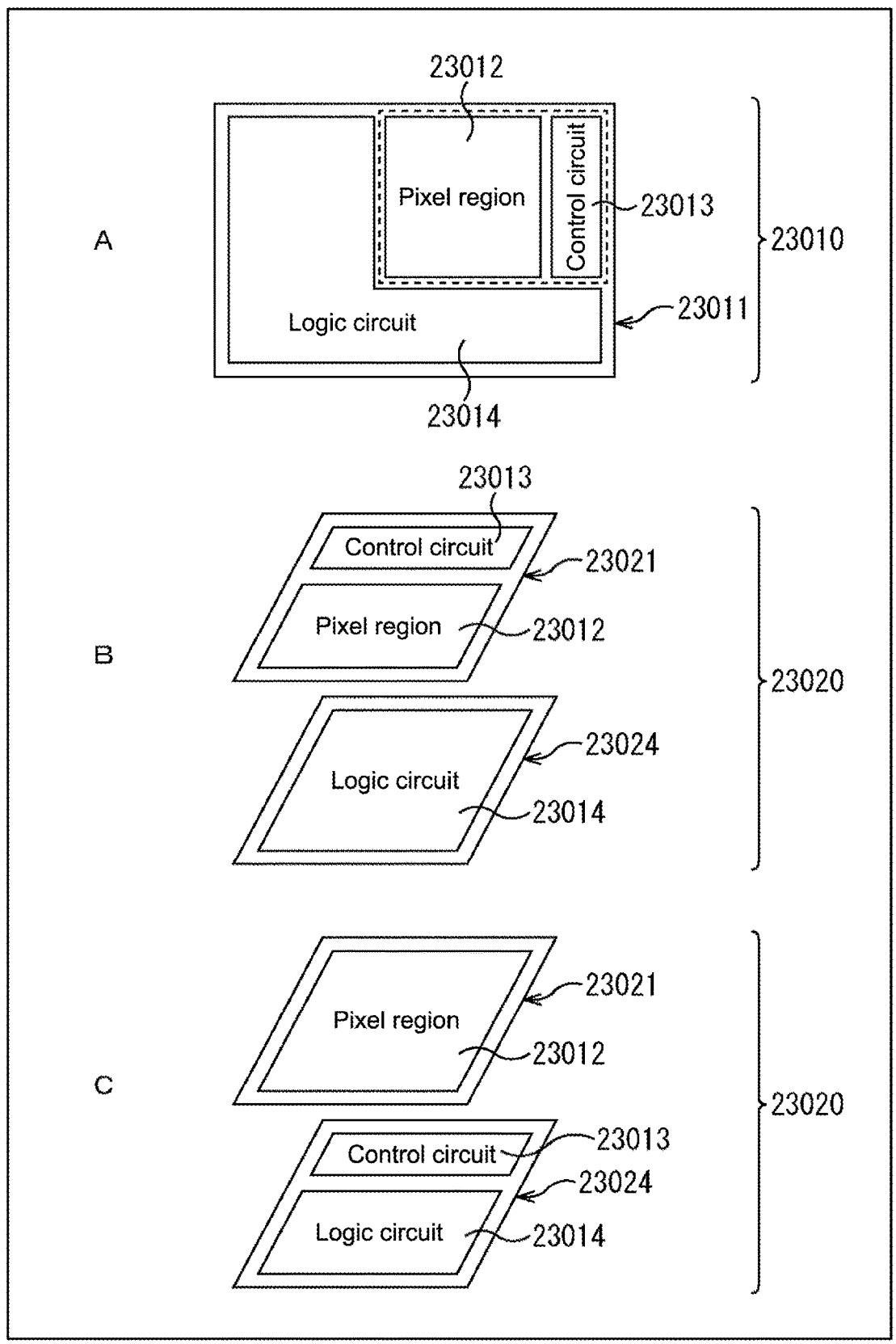
FIG. 34 is a diagram showing an overview of a configuration example of a stacked-type solid-state imaging device to which the technology according to the present disclosure can be applied.

A of FIG. 34 shows a schematic configuration example of a non-stacked-type solid-state imaging device. As shown in A of FIG. 34, a solid-state imaging device 23010 includes a single die (semiconductor substrate) 23011. This die 23011 installs a pixel region 23012 in which pixels are arranged in an array, a control circuit 23013 that controls driving of the pixels and performs other various controls, and a logic circuit 23014 for signal processing.

B and C of FIG. 34 show a schematic configuration example of the stacked-type solid-state imaging device. As shown in B and C of FIG. 34, two dies of a sensor die 23021 and a logic die 23024 are stacked and electrically connected to each other. In this manner, the solid-state imaging device 23020 is configured as a single semiconductor chip.

In B of FIG. 34, the sensor die 23021 installs the pixel region 23012 and the control circuit 23013. The logic die 23024 installs the logic circuit 23014 including a signal processing circuit that performs signal processing.

In C of FIG. 34, the sensor die 23021 installs the pixel region 23012. The logic die 23024 installs the control circuit 23013 and the logic circuit 23014.

Figure 35:
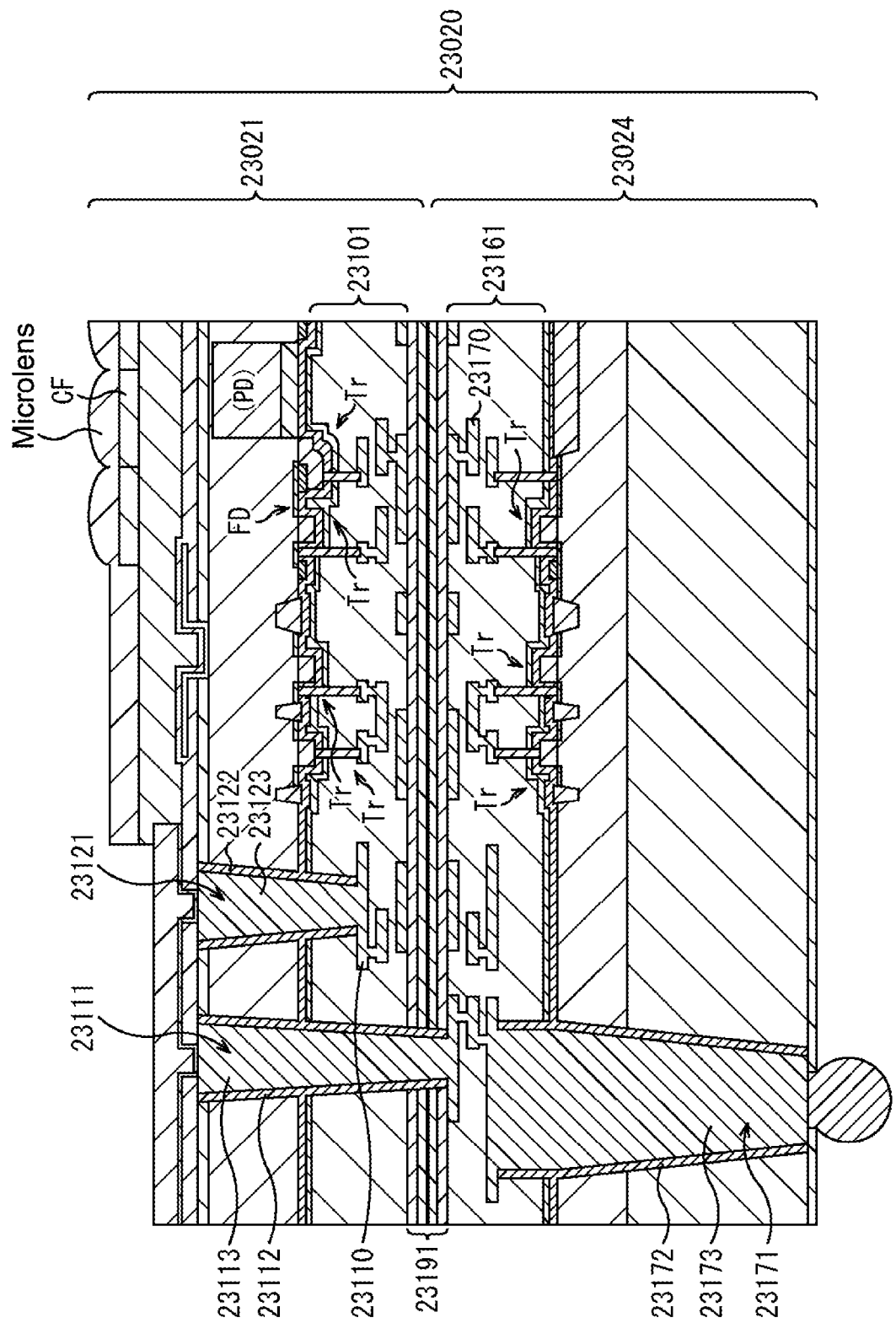
FIG. 35 is a cross-sectional view showing a first configuration example of the stacked-type solid-state imaging device.

FIG. 35 is a cross-sectional view showing a first configuration example of the stacked-type solid-state imaging device 23020.

In the sensor die 23021, a photodiode (PD), a floating diffusion (FD), and transistors (Tr) (MOS FET), which constitute a pixel that becomes the pixel region 23012, and Tr and the like, which become the control circuit 23013, are formed. In addition, a wiring layer 23101 is formed in the sensor die 23021. The wiring layer 23101 includes a plurality of layers, in this example, three-layer wires 23110. Note that (Tr that becomes) the control circuit 23013 can be formed in not the sensor die 23021 but the logic die 23024.

Tr constituting the logic circuit 23014 is formed in the logic die 23024. In addition, a wiring layer 23161 is formed in the logic die 23024. The wiring layer 23161 includes a plurality of layers, in this example, three-layer wires 23170. Further, a connection hole 23171 is formed in the logic die 23024. The connection hole 23171 has an insulation film 23172 formed on an inner wall surface thereof. A connection conductor 23173 to be connected to the wire 23170 and the like is embedded in the connection hole 23171.

The sensor die 23021 and the logic die 23024 are bonded to each other such that the wiring layers 23101 and 23161 thereof face each other. With this, the stacked-type solid-state imaging device 23020 in which the sensor die 23021 and the logic die 23024 are stacked is formed. A film 23191 such as a protection film is formed in a face on which the sensor die 23021 and the logic die 23024 are bonded to each other.

A connection hole 23111 is formed in the sensor die 23021. The connection hole 23111 penetrates the sensor die 23021 from the backside (side on which light enters the PD) (upper side) of the sensor die 23021 and reaches an uppermost layer wire 23170 of the logic die 23024. In addition, a connection hole 23121 is formed in the sensor die 23021. The connection hole 23121 is located in proximity of the connection hole 23111 and reaches a first-layer wire 23110 from the backside of the sensor die 23021. An insulation film 23112 is formed on an inner wall surface of the connection hole 23111. An insulation film 23122 is formed on an inner wall surface of the connection hole 23121. Then, connection conductors 23113 and 23123 are embedded in the connection holes 23111 and 23121, respectively. The connection conductor 23113 and the connection conductor 23123 electrically connected to each other on the back side of the sensor die 23021. With this, the sensor die 23021 and the logic die 23024 are electrically connected to each other via the wiring layer 23101, the connection hole 23121, the connection hole 23111, and the wiring layer 23161.

Figure 36:
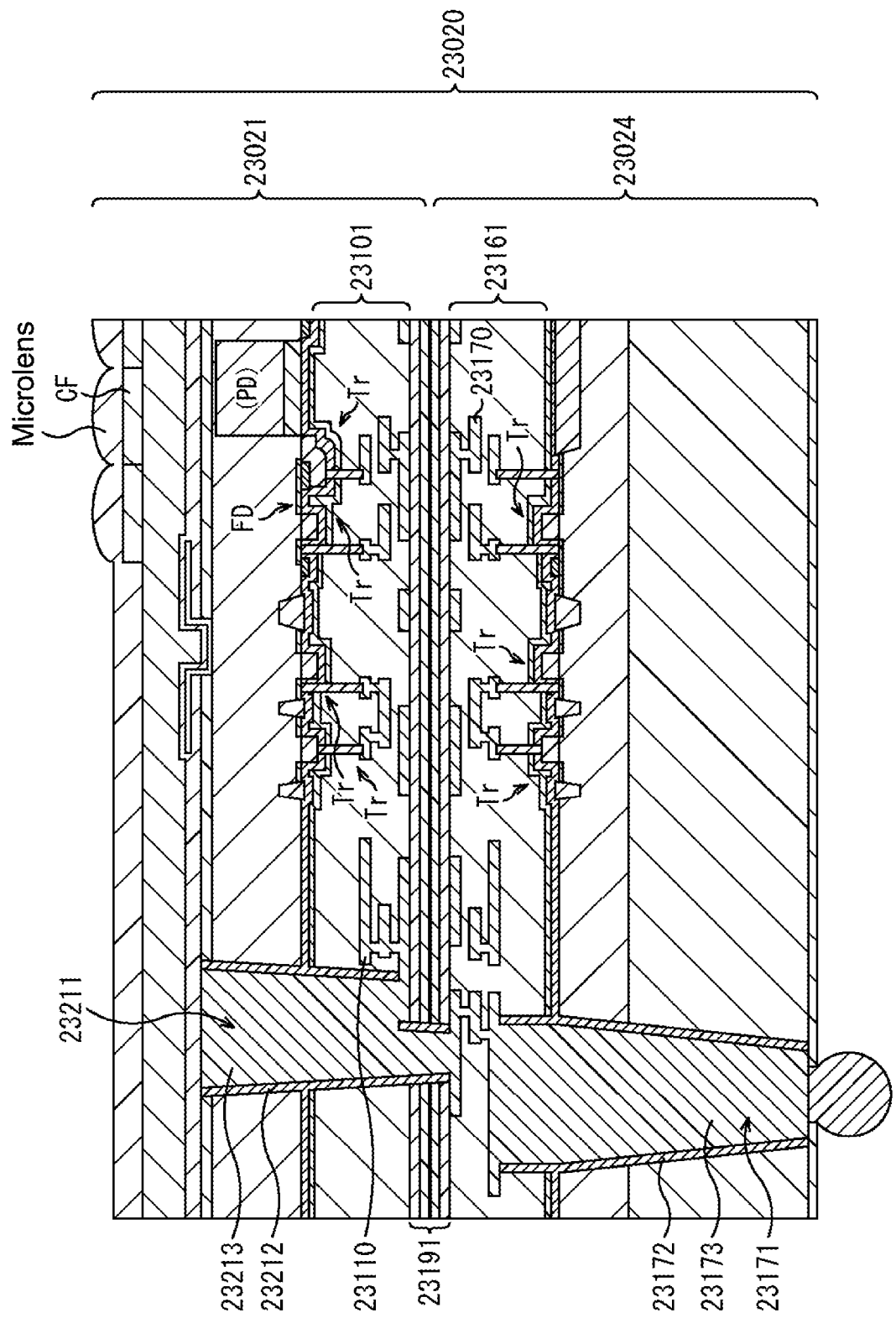
FIG. 36 is a cross-sectional view showing a second configuration example of the stacked-type solid-state imaging device.

FIG. 36 is a cross-sectional view showing a second configuration example of the stacked-type solid-state imaging device 23020.

In a second configuration example of the solid-state imaging device 23020, ((the wire 23110 of) the wiring layer 23101 of) the sensor die 23021 and ((the wire 23170 of) the wiring layer 23161 of) the logic die 23024 are electrically connected to each other through a single connection hole 23211 formed in the sensor die 23021.

That is, in FIG. 36, the connection hole 23211 is formed penetrating the sensor die 23021 from the back side of the sensor die 23021 and reaching an uppermost layer wire 23170 of the logic die 23024 and an uppermost layer wire 23110 of the sensor die 23021. An insulation film 23212 is formed on the inner wall surface of the connection hole 23211. A connection conductor 23213 is embedded in the connection hole 23211. In FIG. 35 described above, the sensor die 23021 and the logic die 23024 are electrically connected to each other through the two connection holes 23111 and 23121. On the other hand, in FIG. 36, the sensor die 23021 and the logic die 23024 are electrically connected to each other through the single connection hole 23211.

Figure 37:
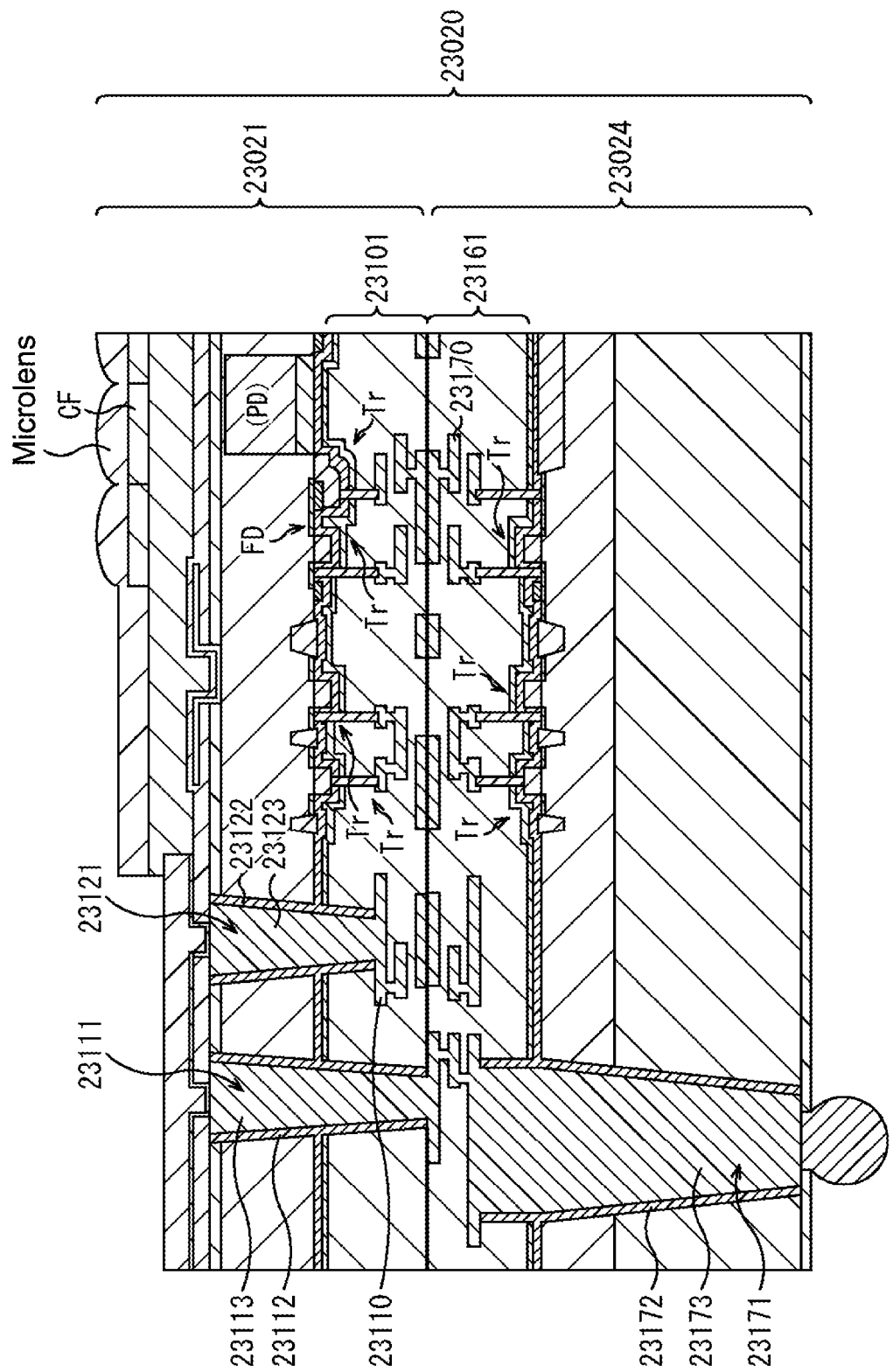
FIG. 37 is a cross-sectional view showing a third configuration example of the stacked-type solid-state imaging device.

FIG. 37 is a cross-sectional view showing a third configuration example of the stacked-type solid-state imaging device 23020.

In the solid-state imaging device 23020 of FIG. 37, the film 23191 such as the protection film is not formed in a face on which the sensor die 23021 and the logic die 23024 are bonded to each other. In the case of FIG. 35, the film 23191 such as the protection film is formed in the face on which the sensor die 23021 and the logic die 23024 are bonded to each other. In this point, the solid-state imaging device 23020 of FIG. 37 is different from the case of FIG. 35.

The sensor die 23021 and the logic die 23024 are superimposed on each other such that the wires 23110 and 23170 are held in direct contact. Then, the wires 23110 and 23170 are directly joined with each other by heating the wires 23110 and 23170 while adding necessary weight on the wires 23110 and 23170. In this manner, the solid-state imaging device 23020 of FIG. 37 is formed.

Figure 38:
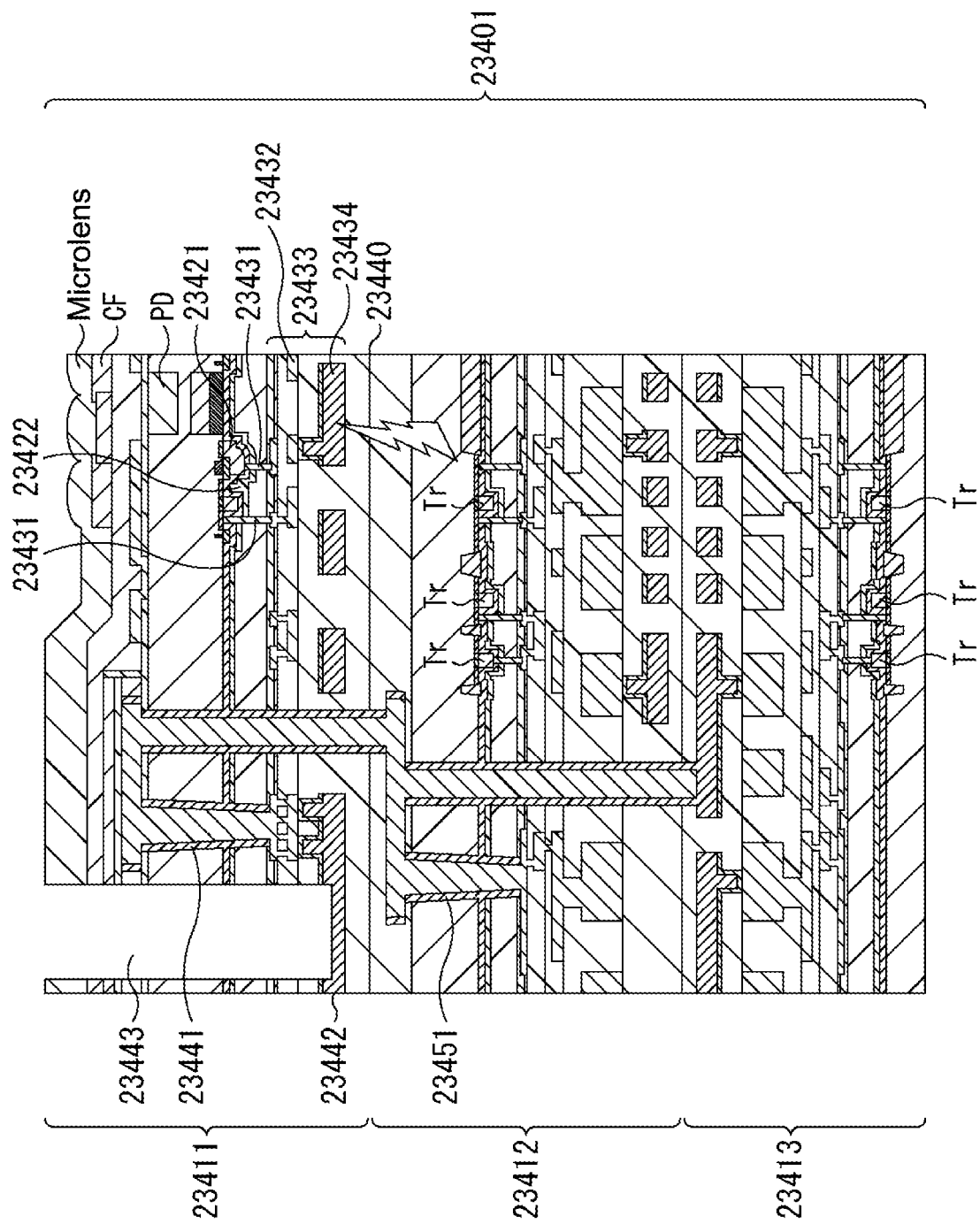
FIG. 38 is a cross-sectional view showing another configuration example of a stacked-type solid-state imaging device to which the technology according to the present disclosure can be applied.

FIG. 38 is a cross-sectional view showing another configuration example of the stacked-type solid-state imaging device to which the technology according to the present disclosure can be applied.

In FIG. 38, a solid-state imaging device 23401 has a three-layer laminate structure. In this three-layer laminate structure, three dies of a sensor die 23411, a logic die 23412, and a memory die 23413 are stacked.

The memory die 23413 includes a memory circuit. The memory circuit stores data temporarily necessary in signal processing performed in the logic die 23412, for example.

In FIG. 38, the logic die 23412 and the memory die 23413 are stacked below the sensor die 23411 in the stated order. However, the logic die 23412 and the memory die 23413 may be stacked below the sensor die 23411 in inverse order, i.e., in the order of the memory die 23413 and the logic die 23412.

Note that, in FIG. 38, a PD that becomes a photoelectric conversion portion of the pixel and source/drain regions of a pixel Tr are formed in the sensor die 23411.

A gate electrode is formed via a gate insulation film around the PD. A pixel Tr 23421 and a pixel Tr 23422 are formed by the gate electrode and the paired source/drain regions.

The pixel Tr 23421 adjacent to the PD is a transfer Tr. One of the paired source/drain regions that constitute the pixel Tr 23421 is an FD.

Further, an inter-layer insulation film is formed in the sensor die 23411. A connection hole is formed in the inter-layer insulation film. The pixel Tr 23421 and connection conductors 23431 that connects to the pixel Tr 23422 are formed in the connection hole.

In addition, a wiring layer 23433 having a plurality of layers with layer wires 23432 which connect to each of the connection conductors 23431 is formed in the sensor die 23411.

Further, an aluminum pad 23434 that becomes an electrode for external connection is formed in a lowermost layer of the wiring layer 23433 of the sensor die 23411. That is, in the sensor die 23411, the aluminum pad 23434 is formed at a position closer to a surface 23440 bonding with the logic die 23412 than the wires 23432. The aluminum pad 23434 is used as one end of a wire associated with input/output of signals into/from the outside.

In addition, a contact 23441 used for electric connection with the logic die 23412 is formed in the sensor die 23411. The contact 23441 is connected to a contact 23451 of the logic die 23412 and also connected to an aluminum pad 23442 of the sensor die 23411.

Then, a pad hole 23443 is formed in the sensor die 23411, reaching the aluminum pad 23442 from a backside (upper side) of the sensor die 23411.

The technology according to the present disclosure can also be applied to the solid-state imaging device as described above.

9. Example of Application to Movable Object

The technology according to the present disclosure (the present technology) is applicable to various products. For example, the technology according to the present disclosure may be, for example, realized as a device mounted on any kind of movable objects such as a car, an electric car, a hybrid electric car, a motorcycle, a bicycle, a personal mobility, an aircraft, a drone, a ship, and a robot.

Figure 39:
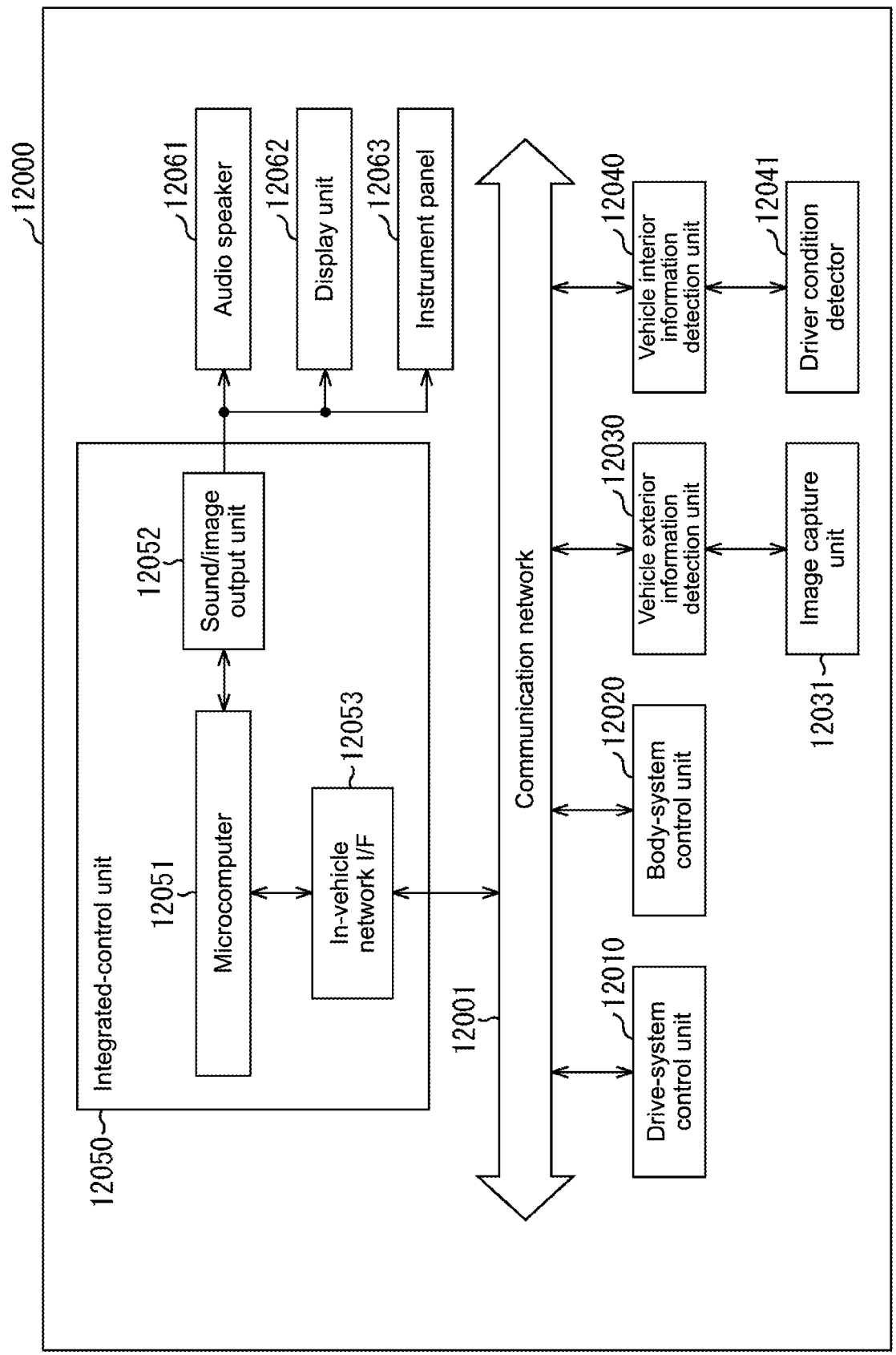
FIG. 39 is a block diagram showing an example of a schematic configuration of a vehicle control system.

FIG. 39 is a block diagram showing an example of a schematic configuration of a vehicle control system, which is an example of a movable object control system to which the technology according to the present disclosure is applied.

A vehicle control system 12000 includes a plurality of electronic control units connected to each other via a communication network 12001. In the example of FIG. 39, the vehicle control system 12000 includes a drive-system control unit 12010, a body-system control unit 12020, a vehicle exterior information detection unit 12030, a vehicle interior information detection unit 12040, and an integrated-control unit 12050. Further, as the functional configuration of the integrated-control unit 12050, a microcomputer 12051, a sound/image output unit 12052, and an in-vehicle network interface (I/F) 12053 are shown.

The drive-system control unit 12010 executes various kinds of programs, to thereby control the operations of the devices related to the drive system of the vehicle. For example, the drive-system control unit 12010 functions as a control device that controls driving force generation devices such as an internal-combustion engine and a driving motor for generating a driving force of the vehicle, a driving force transmission mechanism for transmitting the driving force to wheels, a steering mechanism that adjusts the steering angle of the vehicle, a brake device that generates a braking force of the vehicle, and the like.

The body-system control unit 12020 executes various kinds of programs, to thereby control the operations of the various kinds devices equipped in a vehicle body. For example, the body-system control unit 12020 functions as a control device that controls a keyless entry system, a smart key system, a power window device, or various lamps such as head lamps, back lamps, brake lamps, side-turn lamps, and fog lamps. In this case, an electric wave transmitted from a mobile device in place of a key or signals from various switches may be input in the body-system control unit 12020. The body-system control unit 12020 receives the input electric wave or signal, and controls a door lock device, the power window device, the lamps, and the like of the vehicle.

The vehicle exterior information detection unit 12030 detects information outside the vehicle including the vehicle control system 12000. For example, an image capture unit 12031 is connected to the vehicle exterior information detection unit 12030. The vehicle exterior information detection unit 12030 causes the image capture unit 12031 to capture an environment image and receives the captured image. The vehicle exterior information detection unit 12030 may perform an object detection process of detecting a man, a vehicle, an obstacle, a sign, a signage on a road, or the like on the basis of the received image, or may perform a distance detection process on the basis of the received image.

The image capture unit 12031 is an optical sensor that receives light and outputs an electric signal corresponding to the amount of light received. The image capture unit 12031 may output the electric signal as an image or may output as distance measurement information. Further, the light that the image capture unit 12031 receives may be visible light or invisible light such as infrared light.

The vehicle interior information detection unit 12040 detects vehicle interior information. For example, a driver condition detector 12041 that detects the condition of a driver is connected to the vehicle interior information detection unit 12040. For example, the driver condition detector 12041 may include a camera that captures an image of a driver. The vehicle interior information detection unit 12040 may calculate the fatigue level or the concentration level of the driver on the basis of the detected information input from the driver condition detector 12041, and may determine whether the driver is sleeping.

The microcomputer 12051 may calculate the control target value of the driving force generation device, the steering mechanism, or the brake device on the basis of the vehicle interior/vehicle exterior information obtained by the vehicle exterior information detection unit 12030 or the vehicle interior information detection unit 12040, and may output a control command to the drive-system control unit 12010. For example, the microcomputer 12051 may perform coordinated control for the purpose of realizing the advanced driver assistance system (ADAS) function including avoiding a vehicle collision, lowering impacts of a vehicle collision, follow-up driving based on a distance between vehicles, constant speed driving, vehicle collision warning, a vehicle's lane departure warning, or the like.

Further, by controlling the driving force generation device, the steering mechanism, the brake device, or the like on the basis of information about the environment around the vehicle obtained by the vehicle exterior information detection unit 12030 or the vehicle interior information detection unit 12040, the microcomputer 12051 may perform coordinated control for the purpose of realizing self-driving, i.e., autonomous driving without the need of drivers' operations, and the like.

Further, the microcomputer 12051 may output a control command to the body-system control unit 12020 on the basis of vehicle exterior information obtained by the vehicle exterior information detection unit 12030. For example, the microcomputer 12051 may perform coordinated control including controlling the head lamps on the basis of the location of a leading vehicle or an oncoming vehicle detected by the vehicle exterior information detection unit 12030 and changing high beams to low beams, for example, for the purpose of anti-glare.

The sound/image output unit 12052 transmits at least one of a sound output signal and an image output signal to an output device, which is capable of notifying a passenger of the vehicle or a person outside the vehicle of information visually or auditorily. In the example of FIG. 39, an audio speaker 12061, a display unit 12062, and an instrument panel 12063 are shown as examples of the output devices. For example, the display unit 12062 may include at least one of an on-board display and a head-up display.

Figure 40:
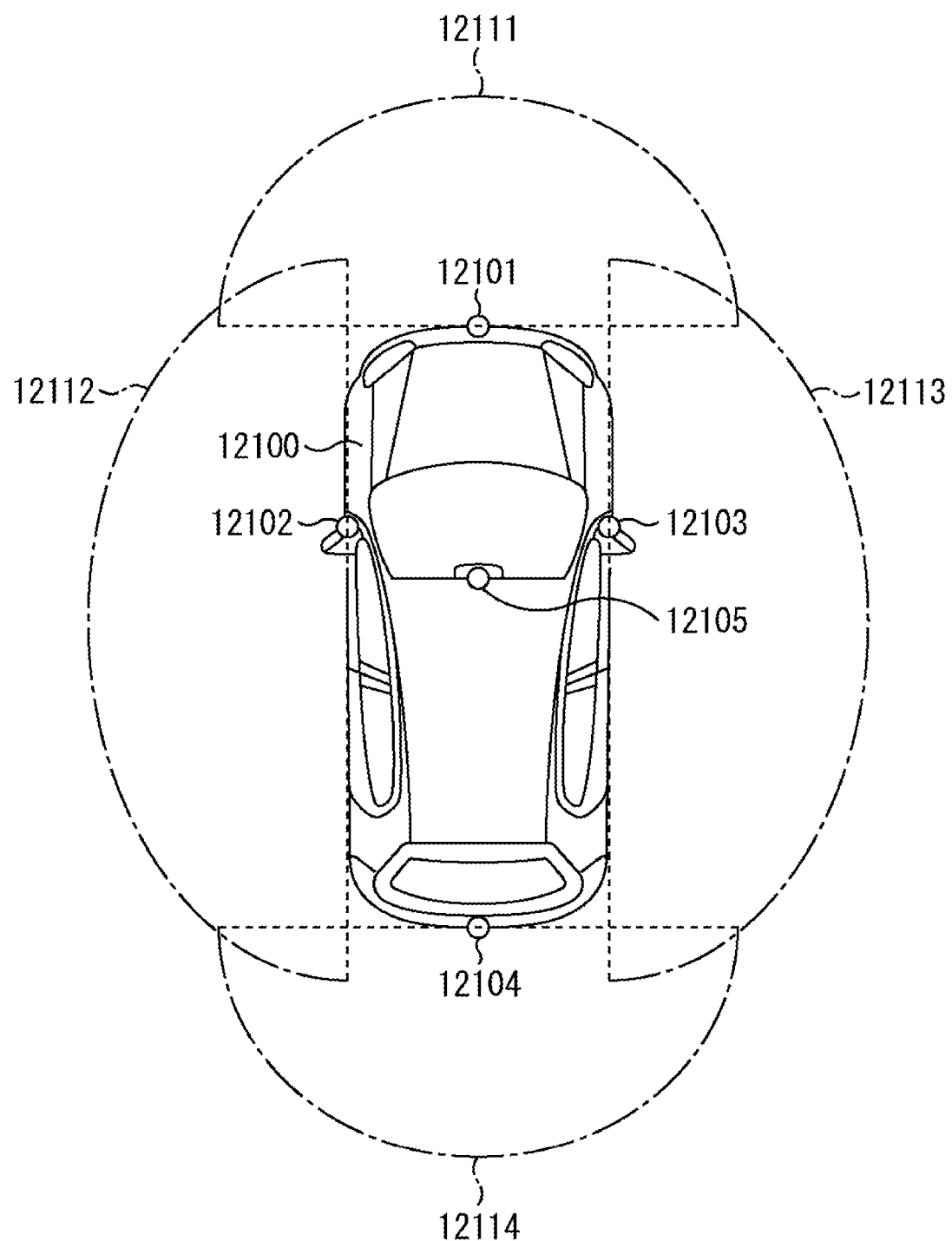
FIG. 40 is an explanatory diagram showing examples of mounting positions of a vehicle exterior information detection unit and image capture units.

FIG. 40 is a diagram showing examples of mounting positions of the image capture units 12031.

In FIG. 40, a vehicle 12100 includes, as the image capture units 12031, image capture units 12101, 12102, 12103, 12104, and 12105.

For example, the image capture units 12101, 12102, 12103, 12104, and 12105 are provided at positions such as the front nose, the side-view mirrors, the rear bumper or the rear door, and an upper part of the windshield in the cabin of the vehicle 12100. Each of the image capture unit 12101 on the front nose and the image capture unit 12105 on the upper part of the windshield in the cabin mainly obtains an image of the front of the vehicle 12100. Each of the image capture units 12102 and 12103 on the side-view mirrors mainly obtains an image of a side of the vehicle 12100. The image capture unit 12104 on the rear bumper or the rear door mainly obtains an image of the rear of the vehicle 12100. The image capture unit 12105 provided on the upper part of the windshield in the cabin is mainly used for detecting a leading vehicle or detecting a pedestrian, an obstacle, a traffic light, a traffic sign, a lane, or the like.

Note that FIG. 40 shows examples of image capture ranges of the image capture units 12101 to 12104. The image capture range 12111 indicates the image capture range of the image capture unit 12101 on the front nose, the image capture ranges 12112 and 12113 indicate the image capture ranges of the image capture units 12102 and 12103 on the side-view mirrors, respectively, and the image capture range 12114 indicates the image capture range of the image capture unit 12104 on the rear bumper or the rear door. For example, by overlaying the image data captured by the image capture units 12101 to 12104 each other, a plane image of the vehicle 12100 as viewed from above is obtained.

At least one of the image capture units 12101 to 12104 may have a function of obtaining distance information. For example, at least one of the image capture units 12101 to 12104 may be a stereo camera including a plurality of image sensors or an image sensor including pixels for phase difference detection.

For example, by obtaining the distance between the vehicle 12100 and each three-dimensional (3D) object in the image capture ranges 12111 to 12114 and the temporal change (relative speed to the vehicle 12100) of the distance on the basis of the distance information obtained from the image capture units 12101 to 12104, the microcomputer 12051 may extract, as a leading vehicle, a 3D object which is especially the closest 3D object driving on the track on which the vehicle 12100 is driving at a predetermined speed (e.g., 0 km/h or more) in the direction substantially the same as the driving direction of the vehicle 12100. Further, by presetting a distance between the vehicle 12100 and a leading vehicle to be secured, the microcomputer 12051 may perform autobrake control (including follow-up stop control), automatic acceleration control (including follow-up start-driving control), and the like. In this way, it is possible to perform coordinated control for the purpose of realizing self-driving, i.e., autonomous driving without the need of drivers' operations, and the like.

For example, the microcomputer 12051 may sort 3D object data of 3D objects into motorcycles, standard-size vehicles, large-size vehicles, pedestrians, and the other 3D objects such as utility poles on the basis of the distance information obtained from the image capture units 12101 to 12104, extract data, and use the data to automatically avoid obstacles. For example, the microcomputer 12051 sorts obstacles around the vehicle 12100 into obstacles that a driver of the vehicle 12100 can see and obstacles that it is difficult for the driver to see. Then, the microcomputer 12051 determines a collision risk, which indicates a hazard level of a collision with each obstacle. When the collision risk is a preset value or more and when there is a possibility of a collision occurrence, the microcomputer 12051 may perform driving assistance to avoid a collision, in which the microcomputer 12051 outputs warning to the driver via the audio speaker 12061 or the display unit 12062, or mandatorily reduces the speed or performs collision-avoidance steering via the drive-system control unit 12010.

At least one of the image capture units 12101 to 12104 may be an infrared camera that detects infrared light. For example, the microcomputer 12051 may recognize a pedestrian by determining whether or not images captured by the image capture units 12101 to 12104 include the pedestrian. The method of recognizing a pedestrian includes, for example, the step of extracting characteristic points in the images captured by the image capture units 12101 to 12104 being infrared cameras, and the step of performing the pattern matching process with respect to a series of characteristic points indicating an outline of an object, to thereby determine whether or not the object is a pedestrian. Where the microcomputer 12051 determines that the images captured by the image capture units 12101 to 12104 include a pedestrian and recognizes the pedestrian, the sound/image output unit 12052 controls the display unit 12062 to display a rectangular contour superimposed on the recognized pedestrian to emphasize the pedestrian. Further, the sound/image output unit 12052 may control the display unit 12062 to display an icon or the like indicating a pedestrian at a desired position.

The above describes an example of the vehicle control system to which the technology according to the present disclosure may be applied. The technology according to the present disclosure may be applied to the image capture unit 12031 having the above-mentioned configuration. Specifically, the CMOS image sensor 10 shown in FIG. 1 can be applied to the image capture unit 12031. The image capture unit 12031, to which the technology according to the present disclosure is applied, is effective for more accurately recognizing an obstacle such as a pedestrian by acquiring a picked-up image with higher quality, because it is possible to improve the accuracy of phase difference detection while suppressing degradation of a picked-up image.

Note that embodiments of the present technology are not limited to the above-mentioned embodiments but various modifications can be made without departing from the gist of the present technology.

It should be noted that the present technology can also take the following configurations.

(1)

A solid-state imaging device, including:
  a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

(2)

The solid-state imaging device according to (1) above, in which
  each of the plurality of pixels is a square unit pixel, and the projection portion is formed toward a center of the square unit pixel.

(3)

The solid-state imaging device according to (2) above, in which
  the inter-pixel separation unit is formed of a material embedded in a trench formed in a square lattice in a semiconductor layer in which the plurality of photoelectric conversion devices are formed, and physically separates adjacent pixels, and
  a part of the inter-pixel separation unit protrudes toward the center of the square unit pixel in a projecting shape to form the projection portion.

(4)

The solid-state imaging device according to (2) above, in which
  the inter-pixel light blocking unit is formed of a material formed in a square lattice in an area between the on-chip lens and a semiconductor layer in which the plurality of photoelectric conversion devices are formed, and blocks light between adjacent pixels, and
  a part of the inter-pixel light blocking unit protrudes toward the center of the square unit pixel in a projecting shape to form the projection portion.

(5)

The solid-state imaging device according to (2) above, in which
  the inter-pixel separation unit is formed of a material embedded in a trench formed in a square lattice in a semiconductor layer in which the plurality of photoelectric conversion devices are formed, and physically separates adjacent pixels,
  the inter-pixel light blocking unit is formed of a material formed in a square lattice in an area between the on-chip lens and a semiconductor layer in which the plurality of photoelectric conversion devices are formed, and blocks light between adjacent pixels, and
  a part of the inter-pixel separation unit and a part of the inter-pixel light blocking unit protrude toward the center of the square unit pixel in a projecting shape to form the projection portion.

(6)

The solid-state imaging device according to any one of (1) to (5) above, in which
  the square unit pixel forms an R pixel, a G pixel, or a B pixel corresponding to a red (R), green (G), or blue (B) color filter located immediately below the on-chip lens, respectively, and
  the projection portion is formed with respect to at least one of the R pixel, the G pixel, and the B pixel among the plurality of pixels arranged in the pixel array unit.

(7)

The solid-state imaging device according to (6) above, in which
  the projection portion is formed with respect to only the R pixel, the G pixel, or the B pixel.

(8)

The solid-state imaging device according to (6) above, in which
  the projection portion is formed with respect to all of the R pixel, the G pixel, and the B pixel.

(9)

The solid-state imaging device according to (6) above, in which
  the projection portion is formed with respect to a combination of two pixels out of the R pixel, the G pixel, and the B pixel.

(10)

The solid-state imaging device according to any one of (6) to (9) above, in which
  a projecting length of the projection portion differs for each of the R pixel, the G pixel, and the B pixel.

(11)

The solid-state imaging device according to any one of (2) to (10) above, in which
  a protruding length of the projection portion is determined depending on a focused spot diameter of the on-chip lens.

(12)

The solid-state imaging device according to (11) above, in which
  the protruding length of the projection portion corresponds to one seventh to one fourth a length of a side of a pitch of the on-chip lens.

(13)
The solid-state imaging device according to any one of (2) to (12) above, in which
a depth of a cross section of the projection portion with respect to an incident surface of light differs for each projecting part having a projecting shape.

(14)
The solid-state imaging device according to any one of (3) to (5) above, in which
the trench is formed from a first surface that is a surface on a light incident side or a second surface that is a surface opposite to the light incident side.

(15)
The solid-state imaging device according to any one of (2) to (14) above, in which
in the square unit pixel, the plurality of photoelectric conversion devices formed in a semiconductor layer are separated by an impurity.

(16)
The solid-state imaging device according to any one of (2) to (15) above, in which
an output of each of the plurality of photoelectric conversion devices is used for phase difference detection.

(17)
A solid-state imaging device, including:
a pixel array unit, a plurality of pixels being two-dimensionally arranged in the pixel array unit, one photoelectric conversion device being formed in each of the plurality of pixels, the pixel array unit including pixels arranged with respect to one on-chip lens, a part of at least one of an inter-pixel separation unit formed between pixels constituting the pixels arranged with respect to the one on-chip lens and an inter-pixel light blocking unit formed between the pixels constituting the pixels arranged with respect to the one on-chip lens protruding toward a center of the pixels arranged with respect to the one on-chip lens in a projecting shape to form a projection portion.

(18)
The solid-state imaging device according to (17) above, in which
the on-chip lens has an elliptical shape covering two consecutive pixels in a row direction or a column direction, and
a part of at least one of the inter-pixel separation unit and the inter-pixel light blocking unit protrudes between the two consecutive pixels to form the projection portion.

(19)
The solid-state imaging device according to (17) above, in which
the on-chip lens has a circular shape covering four pixels in two rows and two columns, and
a part of at least one of the inter-pixel separation unit and the inter-pixel light blocking unit protrudes toward a center of the four pixels to form the projection portion.

(20)
An electronic apparatus, including:
a solid-state imaging device including a pixel array unit, a plurality of pixels being two-dimensionally arranged in the pixel array unit, a plurality of photoelectric conversion devices being formed with respect to one on-chip lens in each of the plurality of pixels, a part of at least one of an inter-pixel separation unit formed between the plurality of pixels and an inter-pixel light blocking unit formed between the plurality of pixels protruding toward a center of the corresponding pixel in a projecting shape to form a projection portion.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 CMOS image sensor
11 pixel array unit
100, 100-$ij$ pixel
111 on-chip lens
112 color filter
113A, 113B photoelectric conversion device
114 inter-pixel light blocking unit
114P projection portion
115 inter-pixel separation unit
115P projection portion
151A, 151B transfer gate unit
1000 electronic apparatus
1001 solid-state imaging device
12031 image capture unit

The invention claimed is:
1. An imaging device, comprising:
a plurality of pixels arranged two-dimensionally in a plan view,
wherein each pixel of the plurality of pixels includes a first photoelectric conversion region and a second photoelectric conversion region,
wherein the pixels of the plurality of pixels are separated from one another by an inter-pixel separation unit in the plan view,
wherein, in the plan view, the inter-pixel separation unit has at least two protrusions extending in each pixel of the plurality of pixels, and
wherein, for each pixel and in the plan view, the at least two protrusions protrude toward a center of the pixel.
2. The imaging device of claim 1, wherein, for at least some of the pixels, ends of the protrusions are separated from one another by at least a first distance.
3. The imaging device of claim 1, further comprising:
a plurality of on-chip lenses, wherein one on-chip lens in the plurality of on-chip lenses is provided for each pixel in the plurality of pixels.
4. The imaging device of claim 3, wherein for at least some of the pixels, ends of the protrusions are separated from one another by a distance that is greater than or equal to a diameter of a focused spot of light on a light incident surface of a silicon layer in which the photoelectric conversion regions are formed.
5. The imaging device of claim 3, wherein a projecting length L1 of the protrusions is within a range of $1/7^{th}$ to $1/4^{th}$ a pitch L2 of the on-chip lenses.
6. The imaging device of claim 1, wherein, for each pixel, the first and second photoelectric conversion regions are separated by an impurity disposed in a silicon layer in which the first and second photoelectric conversion regions are formed.
7. The imaging device of claim 6, wherein, for each pixel, the at least two protrusions and the impurity are disposed along a same line.
8. The imaging device of claim 1, wherein the pixels include pixels sensitive to red light, pixels sensitive to green light, and pixels sensitive to blue light.

9. The imaging device of claim 1, wherein an area of each of the pixels in the plan view is square, and wherein an area of each of the photoelectric conversion regions in the plan view is elliptical.

10. The imaging device of claim 8, wherein the pixels are arranged in a Bayer array.

11. An imaging device, comprising:
a plurality of on-chip lenses;
a plurality of color filters; and
a plurality of pixels arranged two-dimensionally in a plan view, each pixel including first and second photoelectric conversion regions formed in a silicon layer,
wherein one on-chip lens and one color filter are provided for each pixel,
wherein the pixels are separated from one another by an inter-pixel separation unit,
wherein, for each of the pixels, first and second parts of the inter-pixel separation unit protrude towards a center of the pixel as first and second projection portions, and
wherein for each of the pixels the first and second projection portions extend along a same line.

12. The imaging device of claim 11, wherein, for at least some of the pixels, ends of the projection portions are separated from one another by at least a first distance.

13. The imaging device of claim 11, wherein for at least some of the pixels, ends of the projection portions are separated from one another by a distance that is greater than or equal to a diameter of a focused spot of light on a light incident surface of the silicon layer in which the photoelectric conversion regions are formed.

14. The imaging device of claim 11, wherein a projecting length L1 of the projection portions is within a range of $\frac{1}{7}^{th}$ to $\frac{1}{4}^{th}$ a pitch L2 of the on-chip lenses.

15. The imaging device of claim 11, wherein, for each pixel, the first and second photoelectric conversion regions are separated by an impurity disposed in the silicon layer in which the first and second photoelectric conversion regions are formed.

16. The imaging device of claim 15, wherein, for each pixel, the projection portions and the impurity are disposed along the same line.

17. The imaging device of claim 16, wherein the line along which the projection portions and the impurity are disposed in any one pixel in the plurality of pixels is parallel to the line along which the projection portions and the impurity are disposed in any other pixel in the plurality of pixels.

18. The imaging device of claim 11, wherein the pixels include pixels sensitive to red light, pixels sensitive to green light, and pixels sensitive to blue light.

19. The imaging device of claim 18, wherein the pixels are arranged in a Bayer array.

* * * * *